(12) United States Patent
Lee et al.

(10) Patent No.: US 12,402,512 B2
(45) Date of Patent: Aug. 26, 2025

(54) LIGHT EMITTING DISPLAY DEVICE AND ELECTRONIC DEVICE HAVING THE SAME

(71) Applicant: Samsung Display Co., LTD., Yongin-si (KR)

(72) Inventors: Hyeon Bum Lee, Hwaseong-si (KR); Hye Kyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 504 days.

(21) Appl. No.: 17/973,800

(22) Filed: Oct. 26, 2022

(65) Prior Publication Data

US 2023/0292573 A1 Sep. 14, 2023

(30) Foreign Application Priority Data

Mar. 10, 2022 (KR) .................. 10-2022-0030211

(51) Int. Cl.
*H10K 59/65* (2023.01)
*H10K 50/84* (2023.01)
(Continued)

(52) U.S. Cl.
CPC ............ *H10K 59/65* (2023.02); *H10K 50/84* (2023.02); *H10K 50/865* (2023.02);
(Continued)

(58) Field of Classification Search
CPC .... H10K 59/65; H10K 50/865; H10K 59/122; H10K 2102/311; H10K 59/873; H10K 59/121; H10K 59/80521; H10K 59/38; H10K 59/60; H10K 59/8792; H10K 59/126; H10K 59/173
See application file for complete search history.

(56) References Cited

U.S. PATENT DOCUMENTS

2019/0103583 A1* 4/2019 Kim ..................... H10K 50/11
2019/0114011 A1* 4/2019 Kim ..................... H10K 59/40
(Continued)

FOREIGN PATENT DOCUMENTS

| CN | 108807487 | 11/2018 |
|---|---|---|
| KR | 10-2020-0049959 | 5/2020 |

(Continued)

*Primary Examiner* — S M Sohel Imtiaz
(74) *Attorney, Agent, or Firm* — Innovation Counsel LLP

(57) ABSTRACT

A light emitting display device includes a display panel including a display area and a photosensor area surrounded by the display area; and an infrared sensor positioned on a rear surface of the photosensor area, wherein the display area includes a pixel definition layer having an opening overlapping an anode; a cathode covering the pixel definition layer; an encapsulation layer positioned on the cathode; and a light blocking layer positioned on the encapsulation layer and having an opening overlapping the opening of the pixel definition layer, wherein the photosensor area overlaps an overlapping portion of the light blocking layer, the pixel definition layer has an additional opening corresponding to the photosensor area such that the pixel definition layer is not formed in the photosensor area, and the photosensor area further includes an additional spacer positioned within the additional opening of the pixel definition layer.

20 Claims, 37 Drawing Sheets

(51) Int. Cl.
*H10K 50/86* (2023.01)
*H10K 59/122* (2023.01)
*H10K 59/40* (2023.01)
*H10K 102/00* (2023.01)

(52) U.S. Cl.
CPC ........... *H10K 59/122* (2023.02); *H10K 59/40* (2023.02); *H10K 2102/311* (2023.02)

(56) References Cited

U.S. PATENT DOCUMENTS

| | | | |
|---|---|---|---|
| 2020/0111856 A1* | 4/2020 | Lee | H10K 59/40 |
| 2020/0133414 A1* | 4/2020 | Lee | G06F 3/044 |
| 2020/0212139 A1* | 7/2020 | Baek | H10K 59/1201 |
| 2020/0365664 A1* | 11/2020 | Jeon | H10K 59/121 |
| 2021/0126057 A1* | 4/2021 | Seo | H10K 59/8731 |
| 2021/0191552 A1* | 6/2021 | Bok | H10K 59/38 |
| 2022/0165984 A1* | 5/2022 | Choi | H10K 59/124 |
| 2023/0143745 A1* | 5/2023 | Lee | H10K 50/86 257/72 |

FOREIGN PATENT DOCUMENTS

| | | |
|---|---|---|
| KR | 10-2020-0131400 | 11/2020 |
| KR | 10-2021-0082316 | 7/2021 |

* cited by examiner

LIGHT EMITTING DISPLAY DEVICE AND ELECTRONIC DEVICE HAVING THE SAME

CROSS-REFERENCE TO RELATED APPLICATION

This application claims priority to and the benefit of Korean Patent Application No. 10-2022-0030211 under 35 U.S.C. § 119, filed in the Korean Intellectual Property Office (KIPO) on Mar. 10, 2022, the entire contents of which are incorporated herein by reference.

BACKGROUND

1. Technical Field

The disclosure relates to a light emitting display device and an electronic device including the same, and more particularly, to a light emitting display device capable of positioning an infrared sensor on a rear surface of a display area, and an electronic device including the same.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device such as the organic light emitting display device may have a structure in which the display device can be bent or folded by using a flexible substrate.

In addition, in small electronic devices such as portable phones, optical elements such as cameras and optical sensors are formed in a bezel area, which is a peripheral area of the display area, however as the size of the peripheral area of the display area is gradually reduced while the size of the screen for display is increased, a technology that allows the cameras or the optical sensors to be positioned on the back of the display area is being developed.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a light emitting display device in which an infrared sensor positioned on the rear surface of the display area may have sufficient transmittance.

An electronic device according to an embodiment includes a housing having a rear surface and a side surface; a cover window disposed on the housing; a display panel disposed under the cover window and including a display area and a photosensor area surrounded by the display area; and an infrared sensor positioned on the rear surface of the photosensor area of the display panel, wherein the display area includes a pixel definition layer having an opening overlapping an anode in a plan view; a spacer positioned on the pixel definition layer; a cathode covering the pixel definition layer and the spacer; a capping layer positioned on the cathode; a low reflection layer positioned on the capping layer; an encapsulation layer positioned on the low reflection layer; and a light blocking layer positioned on the encapsulation layer and having an opening overlapping the opening of the pixel definition layer in a plan view, wherein the photosensor area overlaps an overlapping portion of the light blocking layer and an overlapping portion of the pixel definition layer in a plan view, and the cathode has an opening corresponding to the photosensor area and is not formed in the photosensor area.

The capping layer and the low reflection layer may each have an opening corresponding to the photosensor area.

The encapsulation layer may be positioned within the opening corresponding to the photosensor area of the cathode, the capping layer, and the low reflection layer.

The cathode may have a structure that covers an upper surface and a side surface of the capping layer or the low reflection layer.

The capping layer may have an opening corresponding to the photosensor area, and the low reflection layer may be positioned within the opening corresponding to the photosensor area of the cathode and the capping layer.

The cathode may have a structure that covers an upper surface and a side surface of the capping layer.

A low adhesive layer positioned within the opening of the cathode may be further included.

The capping layer and the low reflection layer may be positioned on the low adhesive layer.

The low reflection layer may be positioned on the low adhesive layer, and the capping layer may have an opening corresponding to the photosensor area.

An island-shaped metal layer positioned under the anode and having an opening may be further included, and the opening of the island-shaped metal layer may overlap the opening of the cathode in a plan view.

A light emitting display device according to an embodiment includes a display panel including a display area and a photosensor area surrounded by the display area; and an infrared sensor positioned on a rear surface of the photosensor area, wherein the display area includes a pixel definition layer having an opening overlapping an anode in a plan view; a cathode covering the pixel definition layer; an encapsulation layer positioned on the cathode; and a light blocking layer positioned on the encapsulation layer and having an opening overlapping the opening of the pixel definition layer in a plan view, wherein the photosensor area overlaps an overlapping portion of the light blocking layer in a plan view, the pixel definition layer has an additional opening corresponding to the photosensor area such that the pixel definition layer is not formed in the photosensor area, and the photosensor area further includes an additional spacer positioned within the additional opening of the pixel definition layer.

The display area may further include an organic layer positioned under the anode, the additional spacer may contact the organic layer, and the additional spacer may be positioned under the encapsulation layer.

The display area may further include a capping layer positioned between the cathode and the encapsulation layer and contacting the cathode; and a low reflection layer positioned between the capping layer and the encapsulation layer.

The cathode, the capping layer, and the low reflection layer have an opening corresponding to the photosensor area such that the cathode, the capping layer, and the low reflection layer may not be formed in the photosensor area.

The encapsulation layer may be positioned within the opening of the cathode, the capping layer, and the low reflection layer.

The cathode may have a structure that covers an upper surface and a side surface of the capping layer or the low reflection layer.

An island-shaped metal layer positioned under the anode and having an opening may be further included, and the opening of the island-shaped metal layer may overlap the opening of the cathode, the capping layer, and the low reflection layer in a plan view.

A light emitting display device according to an embodiment includes a display panel including a display area and a photosensor area surrounded by the display area; and an infrared sensor positioned on a rear surface of the photosensor area, wherein the display area includes a pixel definition layer having an opening overlapping an anode in a plan view; a cathode covering the pixel definition layer; a capping layer positioned on the cathode; a low reflection layer positioned on the capping layer; an encapsulation layer positioned on the low reflection layer; and a light blocking layer positioned on the encapsulation layer and having an opening overlapping the opening of the pixel definition layer in a plan view, the photosensor area overlaps an overlapping portion of the light blocking layer, an overlapping portion of the low reflection layer, an overlapping portion of the capping layer, and an overlapping portion of the cathode, and a thickness of the overlapping portion of the cathode is less than a thickness of the cathode of the display area.

A thickness of the overlapping portion of the capping layer may be greater than a thickness of the capping layer of the display area.

A difference between the thickness of the overlapping portion of the cathode and the thickness of the cathode of the display area may be substantially equal to a difference between the thickness of the overlapping portion of the capping layer and the thickness of the capping layer of the display area.

According to embodiments, while forming the light blocking layer in the photosensor area overlapping the infrared sensor on a plane, the opening is filled with a specific material, or the thickness of the cathode is formed thinly while forming the opening corresponding to the photosensor area in the layer below the light blocking layer, so that the photosensor area may have an improved infrared transmission characteristic over a certain level.

DETAILED DESCRIPTION OF THE EMBODIMENTS

Figure 1:
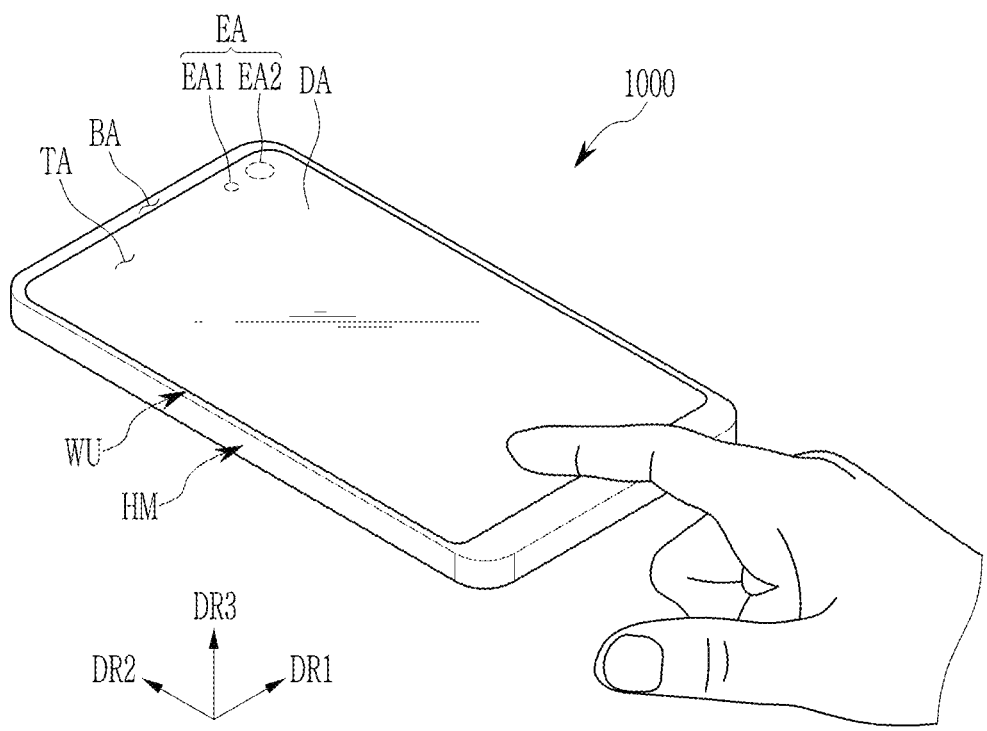
FIG. 1 is a schematic perspective view showing a use state of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Descriptions of parts not related to the disclosure are omitted, and like reference numerals designate like elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

In addition, unless explicitly described to the contrary, the words "comprise", "include", and "have" and variations thereof will be understood to imply the inclusion of stated elements but not the exclusion of any other elements.

Further, in the specification, the phrase "on a plane" or "in a plan view" means when an object portion is viewed from above, and the phrase "on a cross-section" or "in a cross-sectional view" means when a cross-section taken by vertically cutting an object portion is viewed from the side.

In addition, in the specification, when referring to "connected to", this may mean not only that two or more constituent elements are directly connected to each other, but also that two or more constituent elements may be indirectly connected, physically connected, and electrically connected through other constituent elements, and it may be included that each of parts that are substantially integral are connected to each other although referred to by different names depending on the position or function.

Also, throughout the specification, when it is said that parts such as a wire, a layer, a film, a region, a plate, and a constituent element are "extended in a first direction or a second direction", this does not mean only a straight line shape extending straight in the corresponding direction, but also includes a structure that is bent in a part, has a zigzag structure, or extends while including a curved line structure as a structure that extends overall along the first direction or the second direction.

In addition, electronic devices (e.g., a mobile phone, a TV, a monitor, a laptop computer, etc.) included in display devices and display panels described in the specification, or electronic devices included in display devices, display panels, etc. manufactured by manufacturing methods described in a specification, are not excluded from a scope of this specification.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
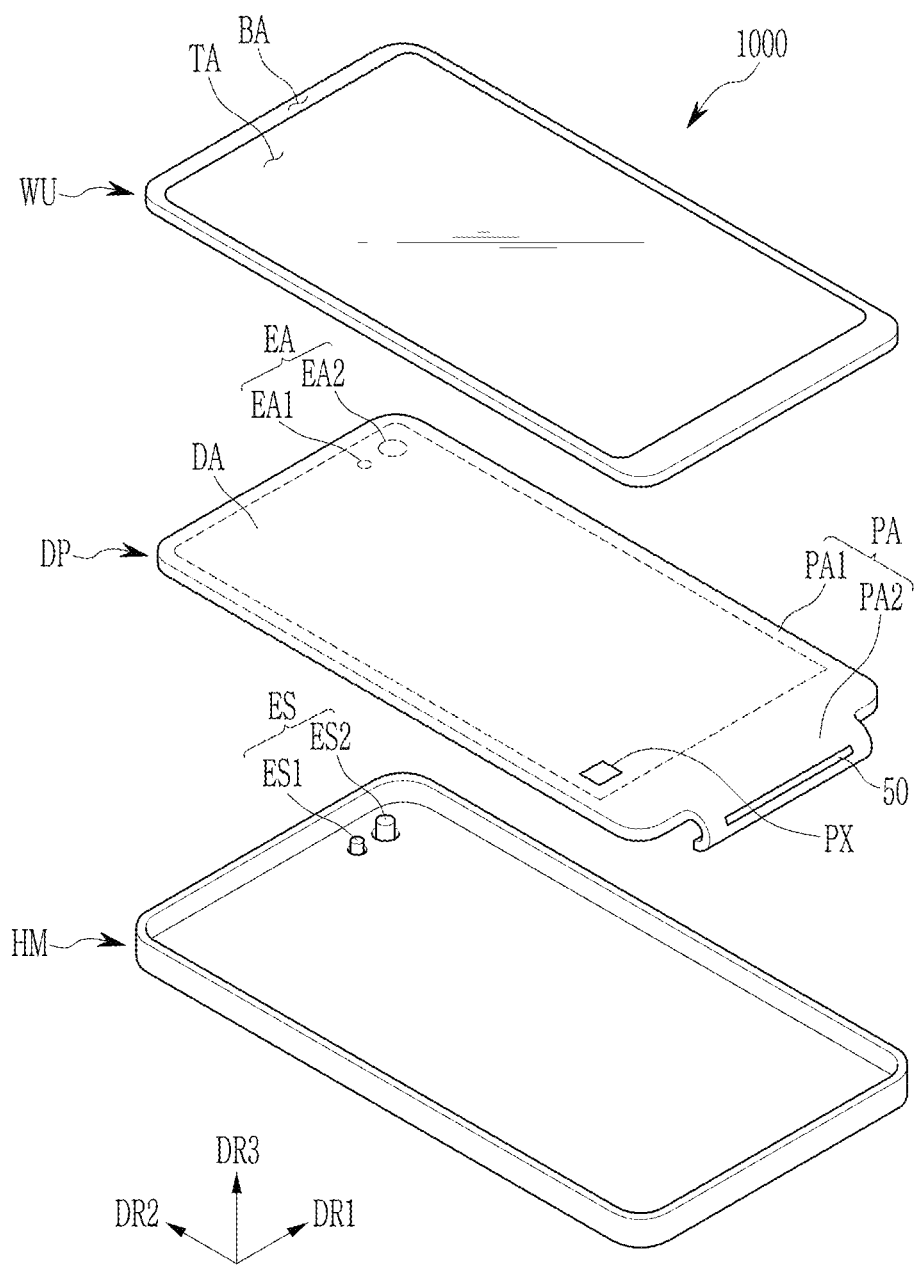
FIG. 2 is schematic exploded perspective view of a display device according to an embodiment.
Figure 3:
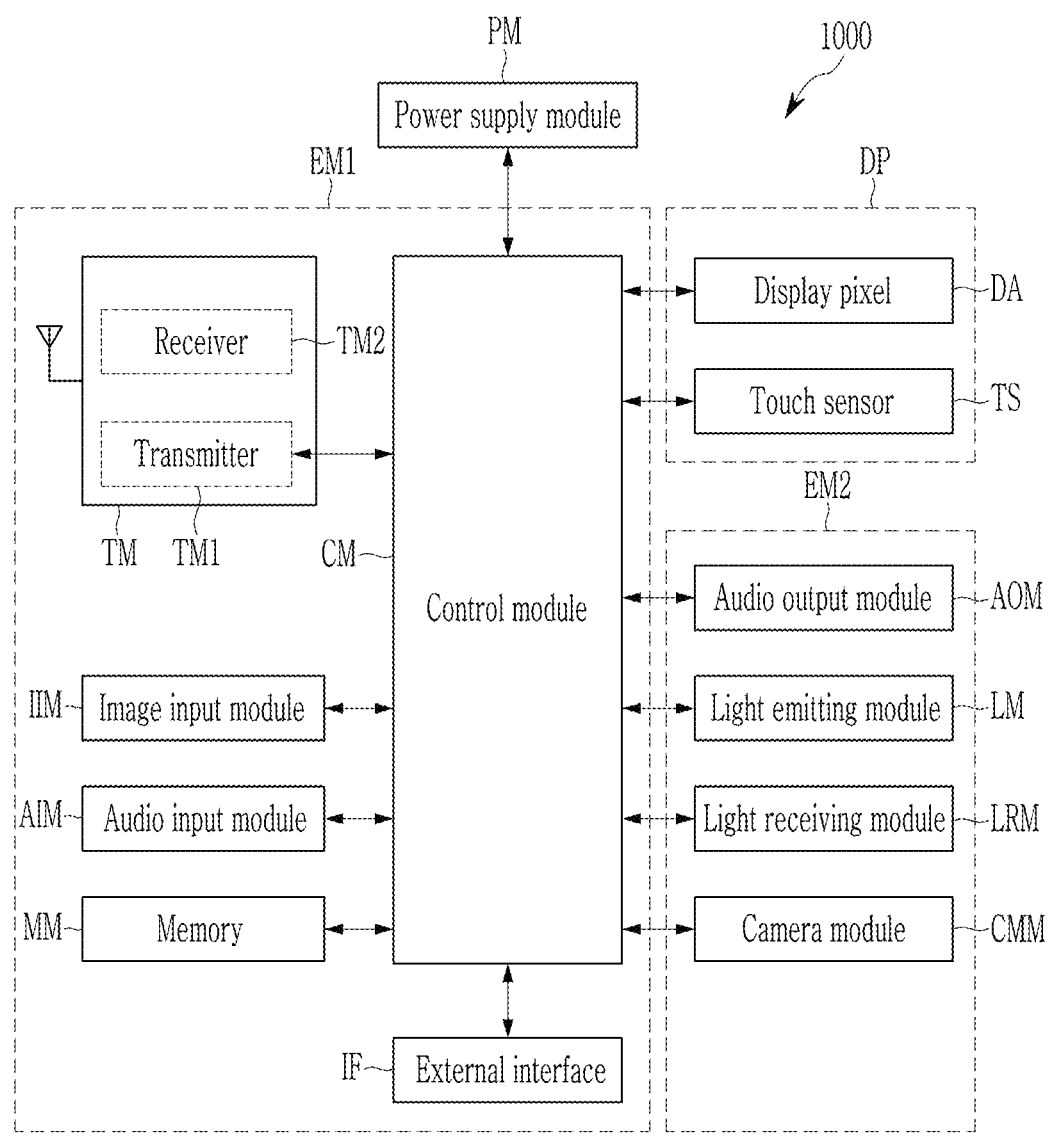
FIG. 3 is a schematic block diagram of a display device according to an embodiment.

Hereinafter, a schematic structure of a display device is schematically described with reference to FIGS. 1 to 3. FIG. 1 is a schematic perspective view illustrating a use state of a display device according to an embodiment, FIG. 2 is a schematic exploded perspective view of a display device according to an embodiment, and FIG. 3 is a schematic block diagram of a display device according to an embodiment.

Referring to FIG. 1, a display device 1000 according to an embodiment is a device for displaying a motion picture or a still image, and may be used as a display screen of various products such as a television, a laptop, a monitor, an advertisement board, the Internet of things (IoT) device, etc., as well as portable electronic devices such as a mobile phone, a smart phone, a tablet personal computer, a mobile communication terminal, an electronic notebook, an e-book reader, a PMP (portable multimedia player), a navigation device, a UMPC (Ultra Mobile PC), etc. The display device 1000 according to an embodiment may be used in a wearable device such as a smart watch, a watch phone, a glasses display, and a head-mounted display (HMD). The display device 1000 according to an embodiment may be used as an instrument panel of a car, and a CID (Center Information Display) disposed on a center fascia or a dashboard of the car, a room mirror display that replaces a side-view mirror of the car, an entertainment device for a rear seat of the car, or a display disposed on the rear surface of the front seat. FIG. 1 illustrates that the display device 1000 is used as a smartphone for better comprehension and ease of description.

The display device 1000 may display an image in a third direction DR3 on a display surface parallel to each of a first direction DR1 and a second direction DR2. The display surface on which the image is displayed may correspond to the front surface of the display device 1000 and may correspond to the front surface of a cover window WU. The images may include static images as well as dynamic images.

In the embodiment, a front surface (or an upper surface) and a rear surface (or a lower surface) of each member are defined based on the direction in which the image is displayed. The front surface and the rear surface may be opposite to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The display device 1000 according to an embodiment may detect an input (see a hand in FIG. 1) of a user applied from the outside. The input of the user may include various types of external inputs such as a part of the user's body, light, heat, or pressure. In an embodiment, the user's input is shown as the user's hand applied to the front. However, the disclosure is not limited thereto. The user's input may be provided in various forms, and the display device 1000 may sense the user's input applied to the side surface or the rear surface of the display device 1000 according to the structure of the display device 1000.

Referring to FIGS. 1 and 2, the display device 1000 may include a cover window WU, a housing HM, a display panel DP, and an optical element ES. In an embodiment, the cover window WU and the housing HM may be combined to constitute the appearance of the display device 1000.

The cover window WU may include an insulating panel. For example, the cover window WU may be made of glass, plastic, or a combination thereof.

The front surface of the cover window WU may define the front surface of the display device 1000. A transmissive area TA may be an optically transparent area. For example, the transmissive area TA may be an area having visible ray transmittance of about 90% or more.

A blocking area BA may define the shape of the transmissive area TA. The blocking area BA is adjacent to the transmissive area TA and may surround the transmissive area TA. The blocking area BA may be an area having relatively low light transmittance compared to the transmissive area TA. The blocking area BA may include an opaque material that blocks light. The blocking area BA may have a color (e.g., a predetermined or selectable color). The blocking area BA may be defined by a bezel layer provided separately from the transparent substrate defining the transmissive area TA, or may be defined by an ink layer that is inserted into the transparent substrate or that is colored and formed on the transparent substrate.

The display panel DP may display an image and include a driving unit 50. The display panel DP may include the front surface including a display area DA and a non-display area PA. The display area DA may be an area in which a pixel operates and emits light according to an electrical signal.

In an embodiment, the display area DA is an area in which the image is displayed including the pixel, and may be an area in which an external input is sensed by a touch sensor disposed at an upper position from the pixel in the third direction DR3.

The transmissive area TA of the cover window WU may at least partially overlap (e.g., in a thickness direction or the third direction DR3 or in a plan view) the display area DA of the display panel DP. For example, the transmissive area TA may overlap the front surface of the display area DA or may overlap at least a portion of the display area DA. Accordingly, the user may recognize the image through the transmissive area TA or provide the external input based on the image. However, the disclosure is not limited thereto. For example, in the display area DA, an area in which the image is displayed and an area in which the external input is detected may be separated from each other.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image is not displayed in the non-display area PA, and a driving circuit or driving wiring for driving the display area DA may be disposed. The non-display area PA may include a first peripheral area PA1 positioned outside the display area DA and a second peripheral area PA2 including a driving part 50, connection wiring, and a bending area. In the embodiment of FIG. 2, the first peripheral area PA1 is positioned on three sides of the display area DA, and the second peripheral area PA2 is positioned on the other side of the display area DA.

In an embodiment, the display panel DP may be assembled in a flat state in which the display area DA and the non-display area PA face the cover window WU. However, the disclosure is not limited thereto. A portion of the non-display area PA of the display panel DP may be bent. The portion of the non-display area PA faces the rear surface of the display device 1000, so that the blocking area BA shown on the front surface of the display device 1000 may be reduced, and as shown in FIG. 2, the second peripheral area PA2 may be bent to be positioned on the rear surface of the display area DA, and assembled.

The display panel DP may include a component area EA, specifically, may include a first component area EA1 and a second component area EA2. The first component area EA1 and the second component area EA2 may be at least partially surrounded by the display area DA. Although the first component area EA1 and the second component area EA2 are shown to be spaced apart from each other, the disclosure is not limited thereto, and at least portions of them may be connected. The first component area EA1 and the second component area EA2 may be areas below which a component using infrared rays, visible rays, or a sound is disposed below the first component area EA1 and the second component area EA2.

The display area DA includes light emitting diodes (LEDs), and pixel circuit parts for generating and transmitting a light emitting current to each of light emitting diodes (LEDs). Here, one light emitting diode LED and one pixel circuit part are referred to as a pixel PX. In the display area DA, one pixel circuit part and one light emitting diode LED are formed one-to-one.

The first component area EA1 includes an area composed of a transparent layer to allow light to pass through, a conductive layer or a semiconductor layer is not positioned, and a pixel defining layer and a light blocking layer including a light blocking material may include an opening overlapping the position corresponding to the first component area EA1, thereby having a structure that does not block light.

The second component area EA2 may include a transmissive part through which light or/and sound may pass and a display part including pixels. The transmissive part is positioned between adjacent pixels and is composed of a transparent layer through which light or/and sound may pass. The display part may be formed to have a unit structure by adding pixels, and the transmissive part may be positioned between adjacent unit structures.

Referring to FIGS. 1 to 3, the display panel DP may include the display area DA including the display pixel, and a touch sensor TS. The display panel DP may be visually recognized by the user from the outside through the transmissive area TA including the pixel that generates the image. The touch sensor TS may be positioned on the pixel, and may detect the external input applied from the outside. The touch sensor TS may detect the external input provided to the cover window WU.

Again referring to FIG. 2, the second peripheral area PA2 may include a bending part. The display area DA and the first peripheral area PA1 may be in a flat state, substantially parallel to the plane defined by the first direction DR1 and the second direction DR2, and a side of the second peripheral area PA2 may extend in the flat state and be in the flat state again after going through the bending part. As a result, at least a portion of the second peripheral area PA2 may be bent and assembled to be positioned on the rear surface side of the display area DA. At least a portion of the second peripheral area PA2 overlaps the display area DA in a plan view (or on a plane) when being assembled, so that the blocking area BA of the display device 1000 may be reduced. However, the disclosure is not limited thereto. For example, the second peripheral area PA2 may not be bent.

The driving part 50 may be mounted on the second peripheral area PA2, and may be mounted on the bending part or positioned on one of sides of the bending part. The driving part 50 may be provided in the form of a chip.

The driving part 50 may be electrically connected to the display area DA to transmit an electrical signal to the display area DA. For example, the driving part 50 may provide data signals to the pixels PX disposed in the display area DA. As another example, the driving part 50 may include a touch driving circuit and may be electrically connected to the touch sensor TS disposed in the display area DA. The driving part 50 may be designed to include various circuits in addition to the above-described circuits or to provide various electrical signals to the display area DA.

A pad part may be positioned at the end of the second peripheral area PA2, and the display device 1000 may be electrically connected to a flexible printed circuit board (FPCB) including a driving chip by the pad part. The driving chip positioned on the flexible printed circuit board may include various driving circuits for driving the display device 1000 or connectors for power supply. According to the embodiment, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor that receives and uses light such as an infrared sensor, a sensor that outputs and senses light or sound to measure a distance or recognize a fingerprint, a small lamp that outputs light, a speaker that outputs a sound, etc. In the case of the electronic element using light, light of various wavelength bands such as visible light, infrared light, and ultraviolet light may be used.

The second optical element ES2 may be at least one of a camera, an infrared camera (IR camera), a dot projector, an infrared illuminator, and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, the display pixel and the touch sensor TS positioned in the display area DA among the configurations of the display panel DP are shown as an example.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be directly mounted on a motherboard electrically connected to the display panel DP, or mounted on a separate substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules are not mounted on the motherboard and may be electrically connected to the motherboard through a flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM or the audio input module AIM based on the touch signal received from the display panel DP.

The wireless communication module TM can transmit/receive a wireless signal with other terminals using Bluetooth or Wi-Fi. The wireless communication module TM may transmit/receive voice signals by using a general communication line. The wireless communication module TM includes a transmitter TM1 that modulates and transmits a signal to be transmitted, and a receiver TM2 that demodulates a received signal.

The image input module IIM may process the image signal to be converted into image data that may be displayed on the display panel DP. The audio input module AIM may receive an external sound signal by a microphone in a recording mode, a voice recognition mode, etc. to be converted into electrical voice data.

The external interface IF may serve as an interface connected to an external charger, a wired/wireless data port, or a card socket (e.g., a memory card or a SIM/UIM card).

The second electronic module EM2 may include an audio output module AOM, a light emitting module LM, a light receiving module LRM, and a camera module CMM, and at least some of these as the optical elements ES, as shown in FIGS. 1 and 2, may be positioned on the rear surface of the display panel DP. The optical element ES may include a light emitting module LM, a light receiving module LRM, and a camera module CMM. The second electronic module EM2 may be directly mounted on the motherboard, or mounted on a separate substrate and electrically connected to the display panel DP through a connector (not shown), or electrically connected to the first electronic module EM1.

The audio output module AOM may convert audio data received from the wireless communication module TM or audio data stored in the memory MM to be output to the outside.

The light emitting module LM may generate and output light. The light emitting module LM may output infrared light. For example, the light emitting module LM may include an LED element. For example, the light-receiving module LRM may detect infrared light. The light receiving module LRM may be activated in case that infrared light above a certain level is detected. The light receiving module LRM may include a CMOS sensor. After the infrared light generated by the light emitting module LM is output, the light may be reflected by an external subject (e.g., a user's finger or face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. The optical element ES may include components, and is not limited to any one embodiment.

Again referring to FIG. 2, the housing HM may be combined with the cover window WU. The cover window WU may be disposed on the front of the housing HM. The housing HM may be combined with the cover window WU to provide an accommodation space (e.g., a predetermined or selectable accommodation space). The light emitting display panel DP and the optical element ES may be accommodated in an accommodation space (e.g., a predetermined or selectable accommodation space) provided between the housing HM and the cover window WU.

The housing HM may include a material with relatively high stiffness. For example, the housing HM may include frames and/or plates made of glass, plastic, or metal, or a combination thereof. The housing HM may reliably protect the components of the display device 1000 housed in the interior space from external impact.

Figure 4:
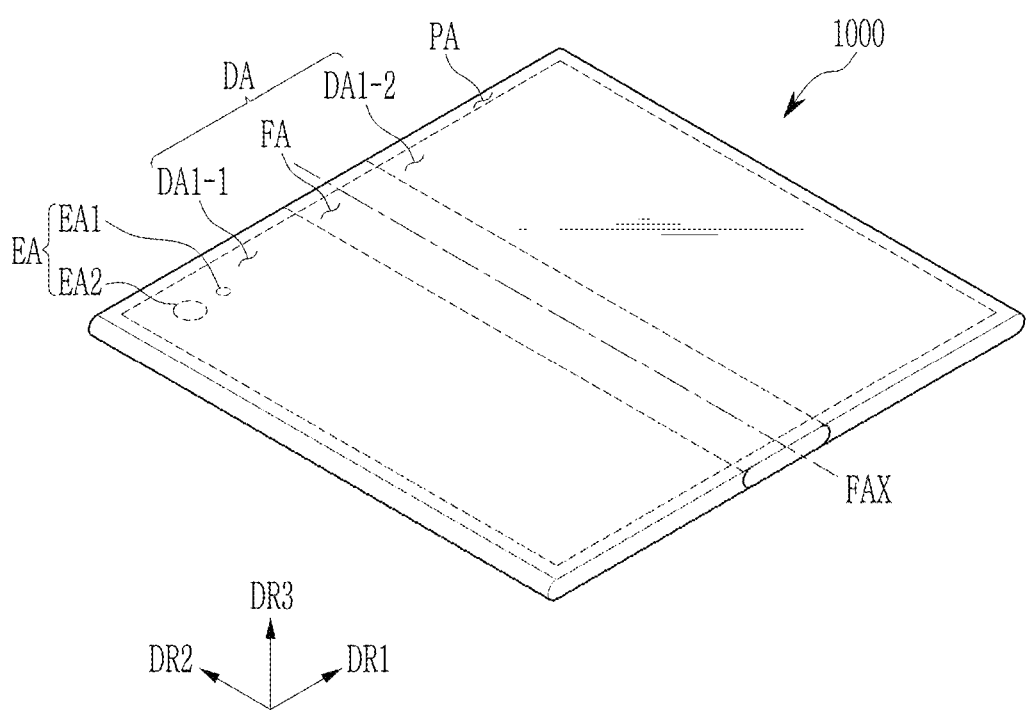
FIG. 4 is a schematic perspective view schematically showing a light emitting display device according to another embodiment.

Hereinafter, the structure of a light emitting display device 1000 according to another embodiment is described with reference to FIG. 4. FIG. 4 is a perspective view schematically illustrating a display device according to another embodiment. The description for the same configurations of the above-described constituent elements is omitted.

The embodiment of FIG. 4 illustrates a foldable light emitting display device in which the light emitting display device 1000 is folded through a folding axis FAX.

Referring to FIG. 4, in an embodiment, the light emitting display device 1000 may be a foldable display device. The light emitting display device 1000 may be folded outward or inward based on the folding axis FAX. In case that the light emitting display device 1000 is folded outward based on the folding axis FAX, the display surfaces of the light emitting display device 1000 are respectively positioned on the outside in the third direction DR3, so that the images may be displayed in both directions. In case that the light emitting display device 1000 is folded inward based on the folding axis FAX, the display surface may not be visually recognized from the outside.

In the embodiment, the light emitting display device 1000 may include a display area DA, a component area EA, and a non-display area PA. The display area DA may be divided into a first-first display area DA1-1, a first-second display area DA1-2, and a folding area FA. The first-first display area DA1-1 and the first-second display area DA1-2 may be positioned on the left and right sides, respectively, based on (or at the center) of the folding axis FAX, and the folding area FA may be positioned between the first-first display area DA1-1 and the first-second display area DA1-2. In case that the light emitting display device 1000 is folded outward based on the folding axis FAX, the first-first display area DA1-1 and the first-second display area DA1-2 are positioned on sides in the third direction DR3, and the images may be displayed in both directions. In case that the light emitting display device 1000 is folded inward based on the folding axis FAX, the first-first display area DA1-1 and the first-second display area DA1-2 may not be visually recognized from the outside.

Figure 5:
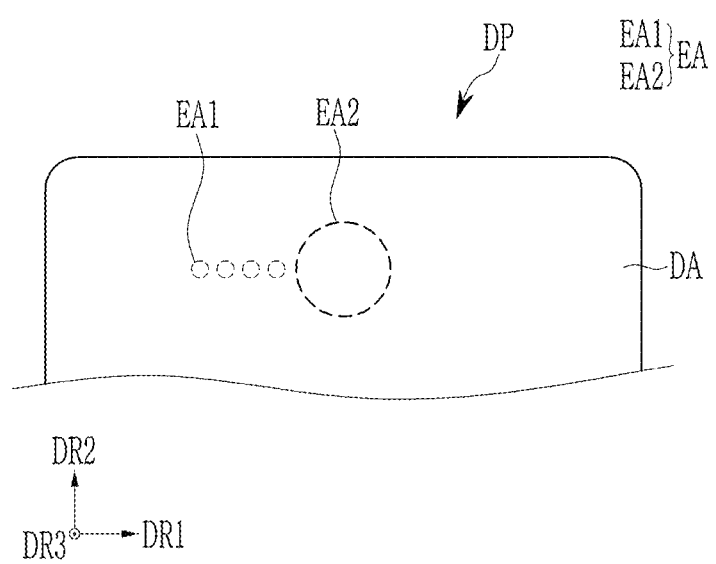
FIG. 5 is a schematic plan view showing an enlarged partial region of a light emitting display device according to an embodiment.

FIG. 5 is a schematic enlarged top plan view illustrating an area of a light emitting display device according to an embodiment.

FIG. 5 illustrates a portion of the light emitting display panel DP among the light emitting display devices according to an embodiment, and the portion is illustrated using a display panel for a mobile phone.

A light emitting display panel DP has a display area DA positioned on the front surface and may include a component area EA on the front surface, and specifically may include a first component area EA1 and a second component area EA2. In the embodiment of FIG. 5, the first component area EA1 is positioned in the position adjacent to the second component area EA2. In the embodiment of FIG. 5, the first component area EA1 is positioned on the left of the second component area EA2. The position and number of first component areas EA1 may vary for each embodiment. In FIG. 5, the optical element corresponding to the second component area EA2 may be a camera, and the optical element corresponding to the first component area EA1 may be an optical sensor.

Light emitting diodes LED and pixel circuit parts for generating a light emitting current and transmitting it to each of light emitting diodes LED are formed in the display area DA. A light emitting diode LED and a pixel circuit part are referred to as a pixel PX. In the display area DA, a pixel circuit part and a light emitting diode LED are formed one-to-one. The display area DA is hereinafter also referred to as "a normal display area". FIG. 5 does not illustrate the structure of the light emitting display panel DP under the cut line, but the display area DA may be positioned under the cut line.

The first component area EA1 includes a transparent layer to allow light to pass therethrough, the transparent layer does not have a conductive layer or a semiconductor layer and has a photosensor area (or optical sensor area) OPS in a lower panel layer, and in a light blocking layer 220, a color filter layer 230, and a pixel definition layer 380 of an upper panel layer, an opening (hereinafter, also referred to as an additional opening) is formed at a position corresponding to the first component area EA1, thereby having a structure that does not block light. On the other hand, even if the photosensor area OPS is positioned in the lower panel layer, if there is no corresponding opening in the upper panel layer, it may be the display area DA rather than the first component area EA1. FIGS. 7 to 20 described later illustrate a pixel and a photosensor area OPS, and it may have the pixel structure of the first component area EA1 or the display area DA The light emitting display panel DP according to the embodiment may be largely divided into the lower panel layer and the upper panel layer. The lower panel layer is the portion where the light emitting diode LED and the pixel circuit part constituting the pixel are positioned, and may include an encapsulation layer 400 (see 400 of FIG. 20) that covers them. For example, the lower panel layer is from a substrate (see 110 in FIG. 20) to the encapsulation layer and also includes an anode Anode, a pixel definition layer (see 380 in FIG. 20), an emission layer (see EML in FIG. 20), a spacer (see 385 in FIG. 20), a functional layer (see FL in FIG. 20), and a cathode (see Cathode in FIG. 20), and includes an insulating layer, a semiconductor layer, and a conductive layer between the substrate and the anode. On the other hand, the upper panel layer as a portion positioned above the encapsulation layer includes a sensing insulating layer (see 501, 510, and 511 in FIG. 20) and sensing electrodes (see 540 and 541 of FIG. 20) that can sense the touch, and may include a light blocking layer (see 220 of FIG. 20), a color filter (see 230 of FIG. 20), and a planarization layer (see 550 of FIG. 20).

On the other hand, the structure of the lower panel layer of the display area DA is described based on FIGS. 7 to 20.

Although not shown in FIG. 5, the peripheral area may be further positioned outside the display area DA. FIG. 5 illustrates a display panel for a mobile phone, but the embodiment may be applied as long as an optical element can be positioned on the rear surface of the display panel, and it may also be the flexible display device. In the case of the foldable display device among the flexible display devices, the second component area EA2 and the first component area EA1 may be formed at different positions from those shown in FIG. 5.

Hereinafter, the circuit structure of the pixel positioned on the lower panel layer of the light emitting display panel DP is described in detail with reference to FIG. 6.

The following pixel structure may be a pixel structure of the display area DA and/or the first component area EA1 including the photosensor area OPS. The photosensor area OPS is a portion that may correspond to the first component area EA1 in case that the part blocking light such as the light blocking layer is removed thereon, and it may be included in the display area DA in case that the light is blocked by the light blocking layer on the photosensor area OPS.

First, the circuit structure of the pixel is described with reference to FIG. 6.

Figure 6:
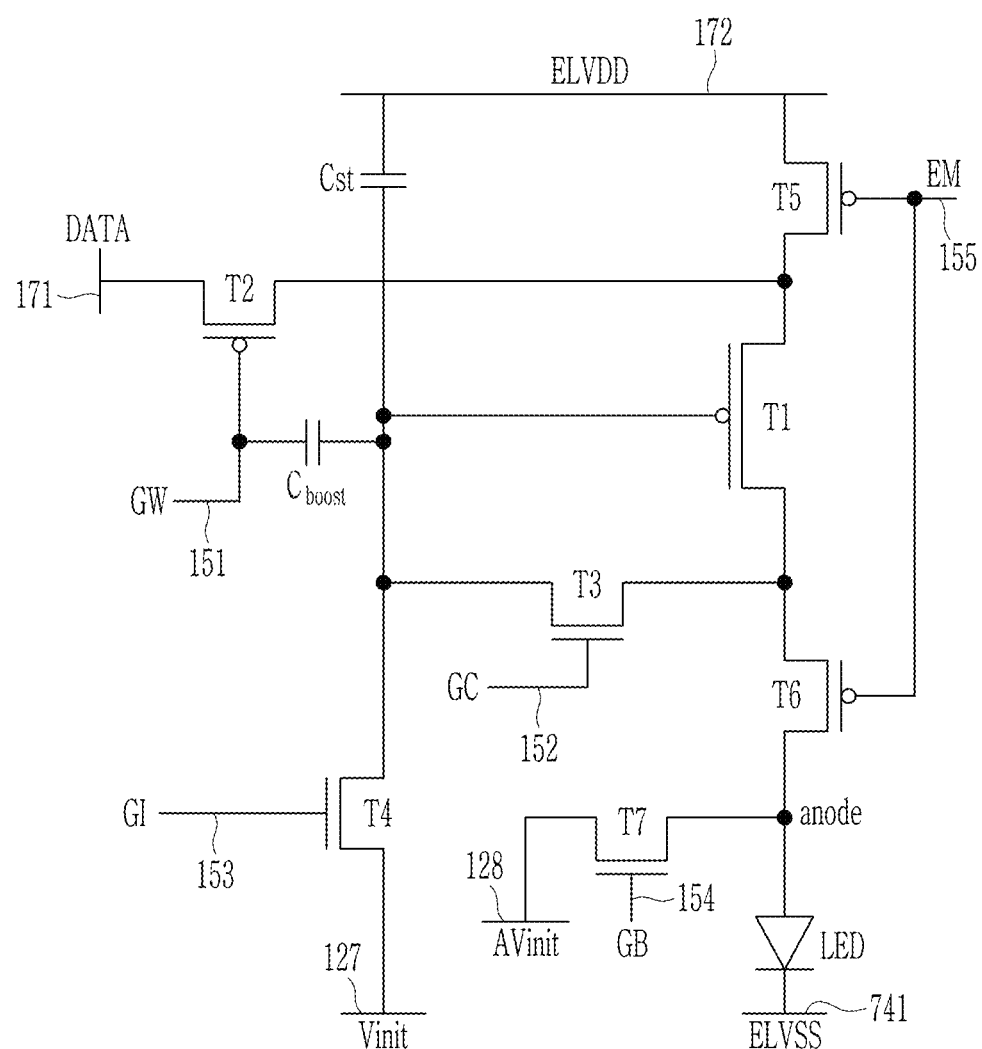
FIG. 6 is a schematic diagram of an equivalent circuit of a pixel included in a light emitting display device according to an embodiment.

FIG. 6 is a schematic diagram of an equivalent circuit of a pixel included in a light emitting display device according to an embodiment.

The circuit structure shown in FIG. 6 is a circuit structure of the pixel circuit part and the light emitting diode LED formed in the display area DA, the first component area EA1, and the second component area EA2.

A pixel according to an embodiment includes transistors T1, T2, T3, T4, T5, T6, and T7, a storage capacitor Cst, a boost capacitor Cboost, and a light emitting diode LED, which are connected to several wires 127, 128, 151, 152, 153, 154, 155, 171, 172, and 741. The transistors and the capacitors except for the light emitting diode LED constitute the pixel circuit part. According to the embodiment, the boost capacitor Cboost may be omitted. Transistors T1, T2, T3, T4, T5, T6, and T7 may be divided into a polycrystalline semiconductor transistor including a polycrystalline semiconductor and an oxide semiconductor transistor including an oxide semiconductor, and the polycrystalline semiconductor transistor may be a driving transistor T1, a second transistor T2, a fifth transistor T5, and a sixth transistor T6, while the oxide semiconductor transistors may be a third transistor T3, a fourth transistor T4, and a seventh transistor T7.

The wires 127, 128, 151, 152, 153, 154, 155, 171, 172, and 741 are connected to a pixel PX. The wires include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a scan driver (not shown) to transmit a first scan signal GW to the second transistor T2 and the seventh transistor T7. A voltage of an opposite polarity to the voltage applied to the first scan line 151 may be applied to the second scan line 152 at the same timing as the signal of the first scan line 151. For example, in case that a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4, the light emission control line 155 transmits a light emitting control signal EM to the fifth transistor T5 and the sixth transistor T6, and the bypass control line 154 transmits a bypass control signal GB to the seventh transistor T7. A voltage of the opposite polarity may be applied to the bypass control signal GB at the same timing as the first scan signal GW, and the bypass control signal GB and the second scan signal GC may have a same signal.

The data line 171 is a wire that transmits a data voltage DATA generated by a data driver (not shown), and accordingly, the magnitude of the light emitting current transmitted to the light emitting diode LED changes, and thus the luminance of the light emitting diode LED changes. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to the cathode of the light emitting diode LED. In the embodiment, the voltages applied to the driving voltage line 172, the first and second initialization voltage lines 127 and 128, and the common voltage line 741 may be constant voltages, respectively.

The driving transistor T1 (also called a first transistor) is a p-type transistor and has a silicon semiconductor (a polycrystalline semiconductor) as a semiconductor layer. It is a transistor that adjusts the magnitude of the light emitting current output to the anode of the light emitting diode LED according to the magnitude of the voltage of a gate electrode of the driving transistor T1 (e.g., the voltage stored in the storage capacitor Cst). Since the brightness of the light emitting diode LED is adjusted according to the magnitude of the light emitting current output to the anode of the light emitting diode LED, the light emitting luminance of the light emitting diode LED may be adjusted according to the data voltage DATA applied to the pixel. For this purpose, a first electrode of the driving transistor T1 is disposed to receive the driving voltage ELVDD and is connected to the driving voltage line 172 via the fifth transistor T5. The first electrode of the driving transistor T1 is also connected to a second electrode of the second transistor T2 to receive the data voltage DATA. A second electrode of the driving transistor T1 outputs the light emitting current to the light emitting diode LED and is connected to the anode of the light emitting diode LED via the sixth transistor T6 (hereinafter referred to as an output control transistor). The second electrode of the driving transistor T1 is also connected to the third transistor T3 and transmits the data voltage DATA applied to the first electrode to the third transistor T3. The gate electrode of the driving transistor T1 is connected to an electrode (hereinafter, referred to as "a second storage electrode") of the storage capacitor Cst. Accordingly, the voltage of the gate electrode of the driving transistor T1 changes according to the voltage stored in the storage capacitor Cst, and accordingly, the light emitting current output by the driving transistor T1 is changed. The storage capacitor Cst serves to keep the voltage of the gate electrode of the driving transistor T1 constant for a frame. The gate electrode of the driving transistor T1 may also be connected to the third transistor T3 so that the data voltage DATA applied to the first electrode of the driving transistor T1 may be transmitted to the gate electrode of the driving transistor T1 through the third transistor T3. The gate electrode of the driving transistor T1 is also connected to the fourth transistor T4 and may be initialized by receiving the first initialization voltage Vinit.

The second transistor T2 is a p-type transistor and has a silicon semiconductor as a semiconductor layer. The second transistor T2 is a transistor that receives the data voltage DATA into the pixel. A gate electrode of the second transistor T2 is connected to the first scan line 151 and an electrode (hereinafter, referred to as "a lower boost electrode") of the boost capacitor Cboost. A first electrode of the second transistor T2 is connected to the data line 171. The second electrode of the second transistor T2 is connected to the first electrode of the driving transistor T1. In case that the second transistor T2 is turned on by a negative voltage among the first scan signals GW transmitted through the first scan line 151, the data voltage DATA transferred through the data line 171 is transferred to the first electrode of the driving transistor T1, and finally the data voltage DATA is transferred to the gate electrode of the driving transistor T1 and stored in the storage capacitor Cst.

The third transistor T3 is an n-type transistor and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by the threshold voltage of the driving transistor T1 and stored in a second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and another electrode (hereinafter referred to as "an upper boost electrode") of the boost capacitor Cboost. The third transistor T3 is turned on by the positive voltage among the second scan signals GC received through the second scan line 152. Thus, the gate electrode of the driving transistor T1 and the second electrode of the driving transistor T1 are connected, and the voltage applied to the gate electrode of the driving transistor T1 is transferred to the second storage electrode of the storage capacitor Cst and stored in the storage capacitor Cst. The voltage stored in the storage capacitor Cst is stored in a state in which the voltage of the gate electrode of the driving transistor T1 in case that the driving transistor T1 is turned off is stored so that the threshold voltage Vth of the driving transistor T1 is compensated.

The fourth transistor T4 is an n-type transistor and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor Cboost. The fourth transistor T4 is turned on by the positive voltage of the initialization control signal GI received through the initialization control line 153, and the first initialization voltage Vinit is transmitted to the gate electrode of the driving transistor T1, the second storage electrode of the storage capacitor Cst, and the upper boost electrode of the boost capacitor Cboost to be initialized.

The fifth transistor T5 and the sixth transistor T6 are p-type transistors and have a silicon semiconductor as a semiconductor layer.

The fifth transistor T5 serves to transfer a driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 serves to transmit the light emitting current output from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 is an n-type transistor and has an oxide semiconductor as a semiconductor layer. The seventh transistor T7 serves to initialize the anode of the light emitting diode LED. Hereinafter, the seventh transistor T7 is also referred to as an anode initialization transistor. A gate electrode of the seventh transistor T7 is connected to the bypass control line 154, a first electrode of the seventh transistor T7 is connected to the anode of the light emitting diode LED, and a second electrode of the seventh transistor T7 is connected to the second initialization voltage line 128. In case that the seventh transistor T7 is turned on by the positive voltage among the bypass control signals GB flowing through the bypass control line 154, the second initialization voltage AVinit is applied to the anode of the light emitting diode LED and is initialized.

Although it has been described that a pixel PX includes seven transistors T1 to T7 and two capacitors (the storage capacitor Cst and the boost capacitor Cboost), the disclosure is not limited thereto, and the boost capacitor Cboost may be excluded according to an embodiment. Although the third transistor T3, the fourth transistor T4, and the seventh transistor T7 are n-type transistors in an embodiment, only one of them may be formed as an n-type transistor or the other transistors may be formed as an n-type transistor.

In the above, the circuit structure of the pixel formed in the display area DA was described through FIG. 6.

Hereinafter, the detailed planar structure and stacked structure of the pixel formed in the display area DA are described through FIGS. 7 to 20, and each pixel of the following embodiment includes a photosensor area OPS.

FIGS. 7 to 19 are schematic views specifically illustrating a structure of each layer according to a manufacturing order of a lower panel layer of a light emitting display device according to an embodiment.

Figure 7:
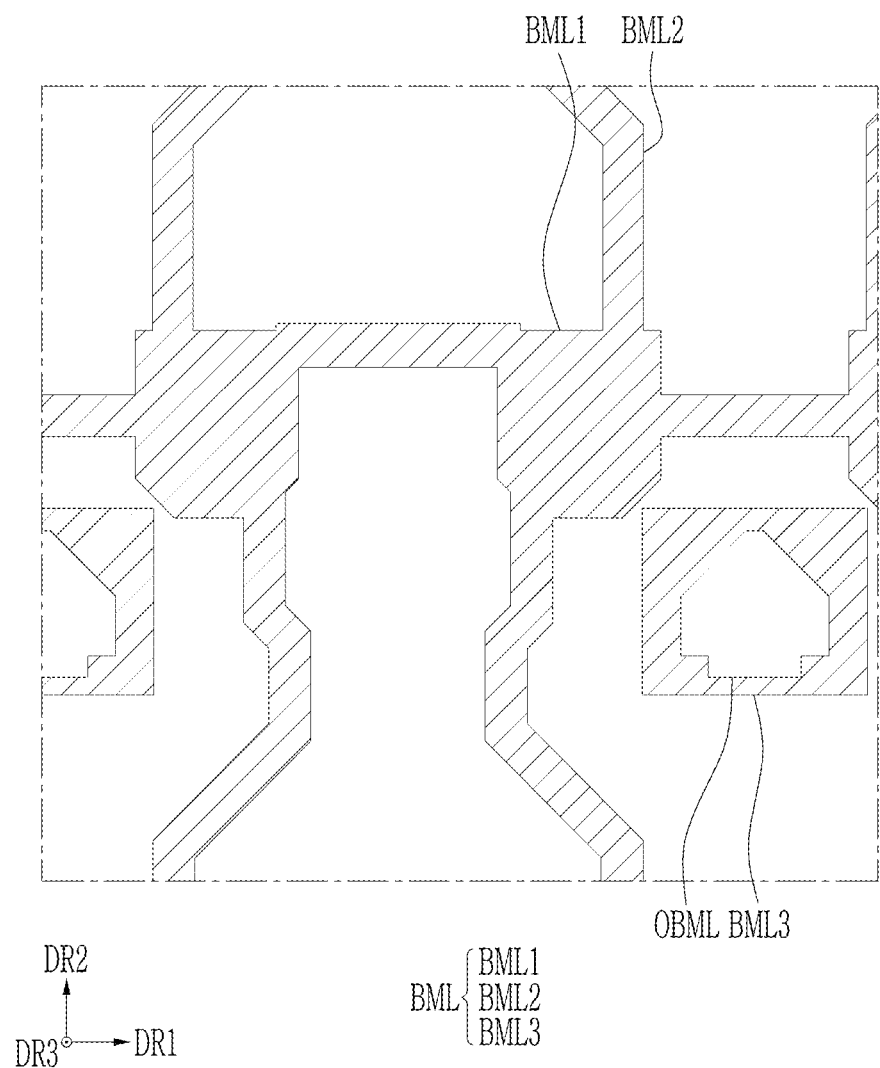
FIG. 7 to FIG. 19 are schematic views specifically showing a structure of each layer according to a manufacturing sequence of a lower panel layer among a light emitting display device according to an embodiment.

Referring to FIG. 7, a metal layer BML is positioned on a substrate 110.

The substrate 110 may include a material that does not bend due to a rigid characteristic such as glass, or a flexible material that can be bent such as plastic or polyimide. In the case of the flexible substrate, as shown in FIG. 20, it may have a structure in which a two-layer structure of polyimide and a barrier layer provided thereon and formed of an inorganic insulating material is formed double.

The metal layer BML includes expansion parts BML1 and a connection part BML2 connecting the expansion parts BML1 to each other, and further includes island-shaped metal layers BML3 having an opening OBML. The expansion part BML1 of the metal layer BML may be formed at a position overlapping a channel 1132 of the driving transistor T1 in a plan view among a first semiconductor layer 130 formed later. In the embodiment, an island-shaped metal layer BML3 is separated from the expansion part BML1 and the connection part BML2 and includes the opening OBML in the center. Referring to FIG. 20, the opening OBML corresponds to the photosensor area OPS, and may serve as a mask for forming a pattern corresponding to the photosensor area OPS in a subsequent process. According to the embodiment, the island-shaped metal layer BML3 may have a structure connected to the expansion part BML1 or the connection part BML2. The metal layer BML is also called a lower shielding layer, may include a metal such as copper (Cu), molybdenum (Mo), aluminum (Al), titanium (Ti), etc., or a metal alloy thereof and may additionally include amorphous silicon and may consist of a single layer or multiple layers.

Figure 20:
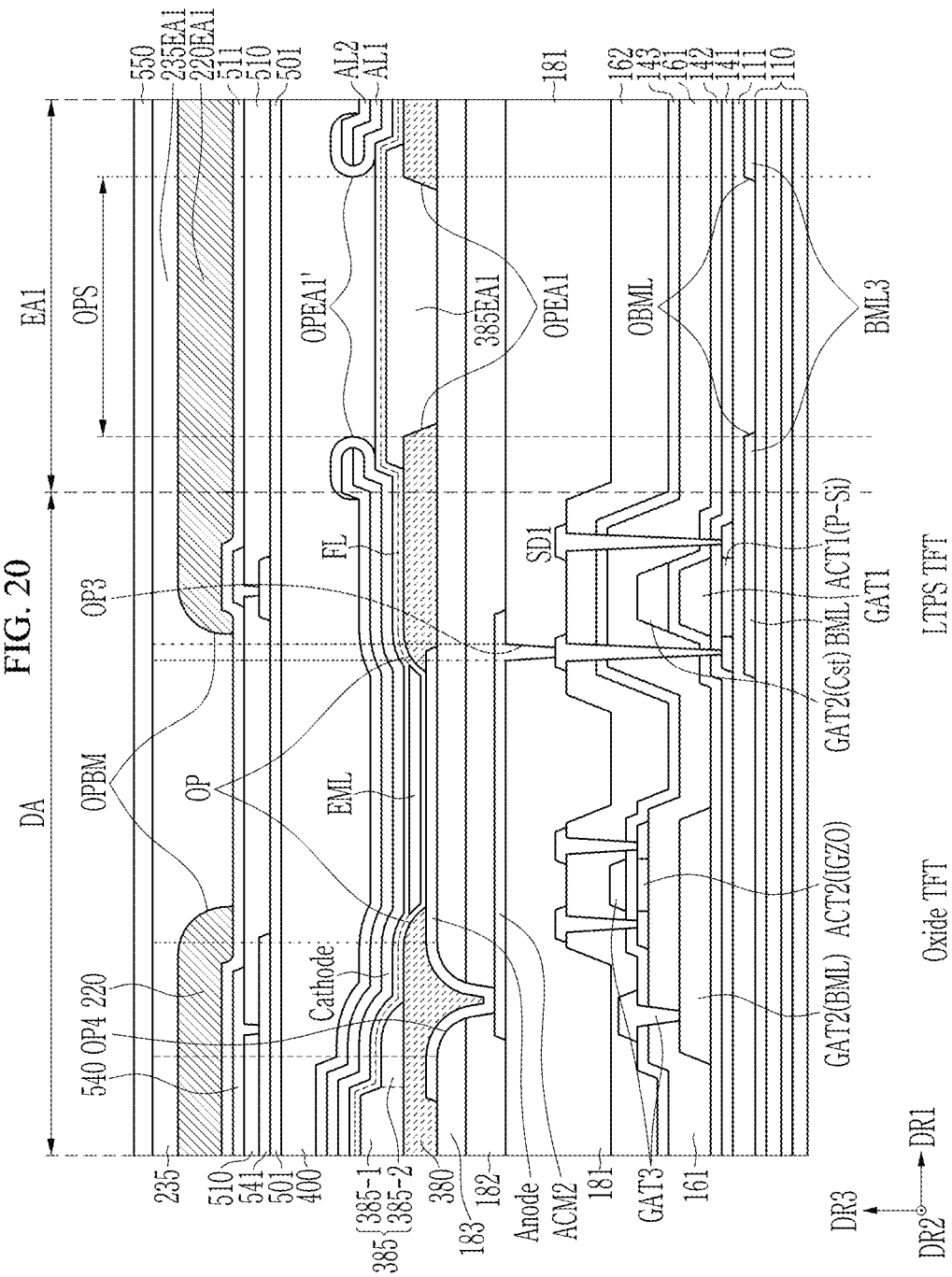
FIG. 20 is a schematic cross-sectional view of a light emitting display device according to an embodiment.

Referring to FIG. 20, a buffer layer 111 covering the substrate 110 and the metal layer BML is disposed on the substrate 110 and the metal layer BML. The buffer layer 111 serves to block penetration of impurity elements into the first semiconductor layer 130, and may be an inorganic insulating layer including a silicon oxide ($SiO_x$), a silicon nitride ($SiN_x$), a silicon oxynitride ($SiO_xN_y$), or the like.

Figure 8:
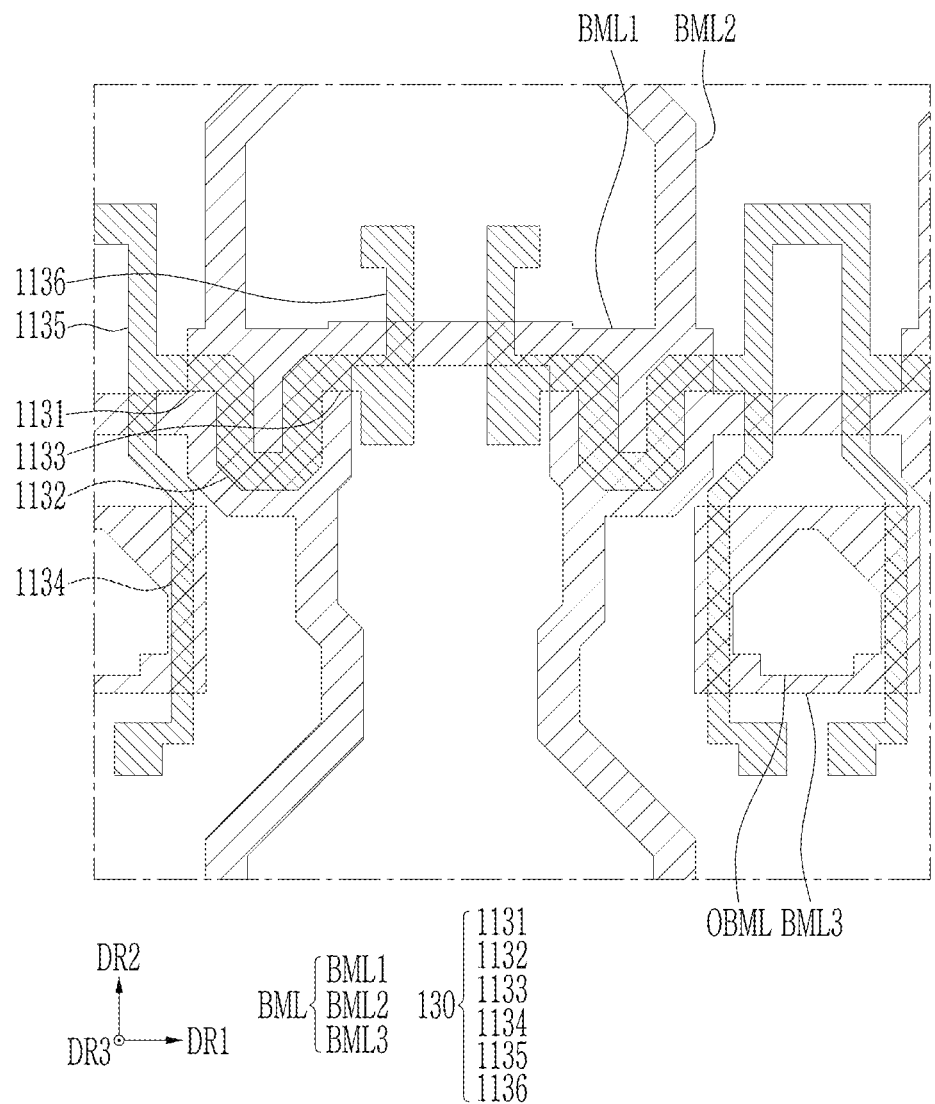

On the buffer layer 111, as shown in FIG. 8, a first semiconductor layer 130 formed of a silicon semiconductor (e.g., a polycrystalline semiconductor) is positioned. The first semiconductor layer 130 includes a channel 1132, a first area 1131, and a second area 1133 of the driving transistor T1. The first semiconductor layer 130 includes channels of the second transistor T2, the fifth transistor T5, the sixth transistor T6, and the seventh transistor T7 as well as the driving transistor T1, and has areas having a conductive layer characteristic by plasma processing or doping on sides of each channel to serve as the first and second electrodes. A transistor including the first semiconductor layer 130 may be referred to as a polycrystalline semiconductor transistor.

The channel 1132 of the driving transistor T1 may have a curved shape of a "U" in a plan view. However, the shape of channel 1132 of the driving transistor T1 is not limited thereto, and may be variously changed. For example, the channel 1132 of the driving transistor T1 may be bent into a different shape or may have a bar shape. A first area 1131 and a second area 1133 of the driving transistor T1 may be positioned on sides of the channel 1132 of the driving transistor T1. The first area 1131 and the second area 1133 positioned in the first semiconductor layer serve as the first electrode and the second electrode of the driving transistor T1.

A channel, a first area, and a second area of the second transistor T2 are positioned in a portion 1134 extending downward from the first area 1131 of the driving transistor T1 in the first semiconductor layer 130. A channel, a first area, and a second area of the fifth transistor T5 are positioned in a portion 1135 extending upward from the first area 1131 of the driving transistor T1. A channel, a first region, and a second region of the sixth transistor T6 are positioned in a portion 1136 extending upward from the second region 1133 of the driving transistor T1.

Referring to FIG. 20, a first gate insulating layer 141 may be positioned on the first semiconductor layer 130 including the channel 1132, the first area 1131, and the second area 1133 of the driving transistor T1. The first gate insulating layer 141 may be an inorganic insulating layer including a silicon oxide ($SiO_x$), a silicon nitride ($SiN_x$), a silicon oxynitride ($SiO_xN_y$), or the like.

Figure 9:
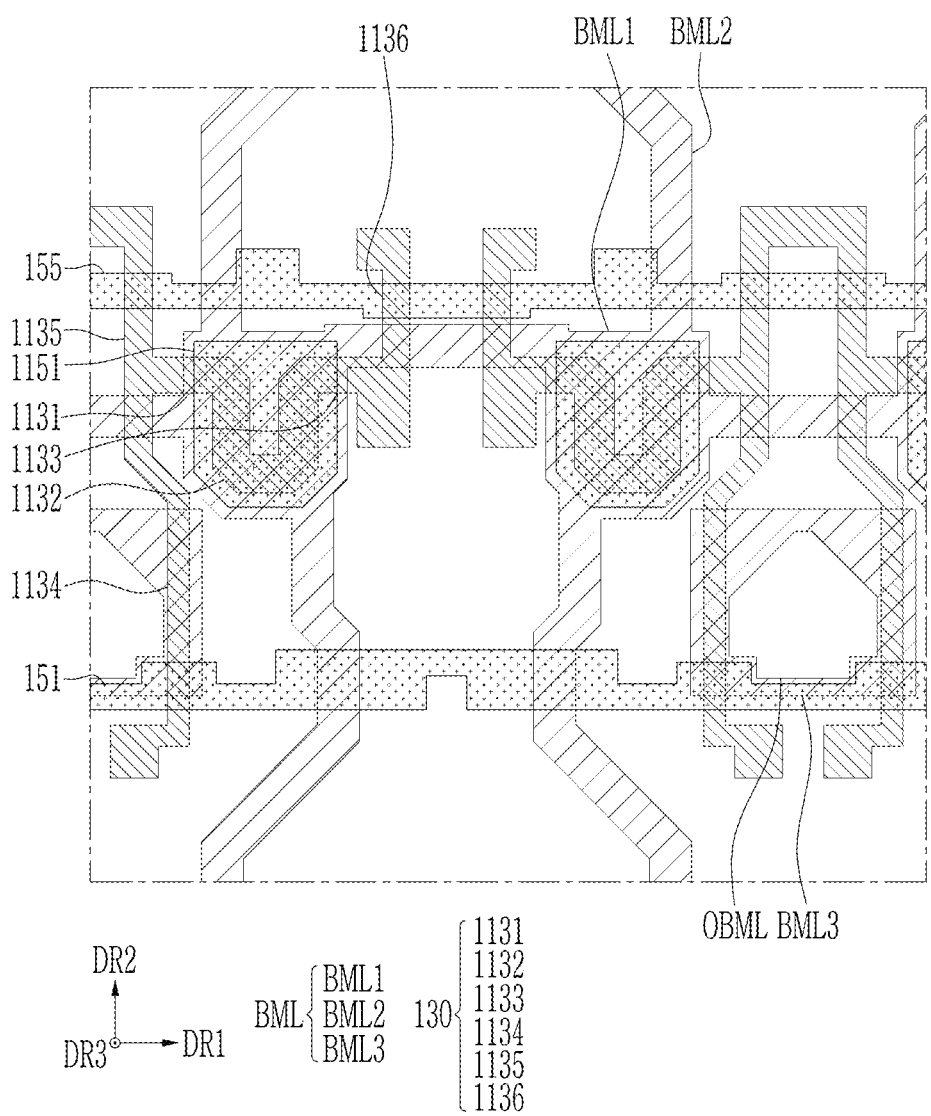

Referring to FIG. 9, a first gate conductive layer including a gate electrode 1151 of the driving transistor T1 may be positioned on the first gate insulating layer 141. The first gate conductive layer includes a gate electrode of each of the second transistor T2, the fifth transistor T5, the sixth transistor T6, and the seventh transistor T7 as well as the driving transistor T1. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include a first scan line 151 and a light emission control line 155. The first scan line 151 and the light emission control line 155 may extend in an approximately horizontal direction (hereinafter also referred to as a first direction). The first scan line 151 may be connected to the gate electrode of the second transistor T2. The first scan line 151 may be integral with the gate electrode of the second transistor T2.

The light emission control line 155 may be connected to the gate electrode of the fifth transistor T5 and the gate electrode of the sixth transistor T6, and the light emission control line 155 and the gate electrodes of the fifth transistor T5 and the sixth transistor T6 may be integral with each other.

The first gate conductive layer may include a metal such as copper (Cu), molybdenum (Mo), aluminum (Al), or titanium (Ti), or a metal alloy thereof, and may be configured as a single layer or multiple layers.

After the first gate conductive layer including the gate electrode 1151 of the driving transistor T1 is formed, a plasma treatment or a doping process is performed to make the exposed area of the first semiconductor layer conductive. For example, the first semiconductor layer covered by the first gate conductive layer is not conductive, and the portion of the first semiconductor layer not covered by the first gate conductive layer, and the conductive layer may have a same characteristic. As a result, the transistor including the conductive portion has a p-type transistor characteristic, and the driving transistor T1, the second transistor T2, the fifth transistor T5, the sixth transistor T6, and the seventh transistor T7 may be p-type or n-type transistors.

Referring to FIG. 20, a second gate insulating layer 142 may be positioned on the first gate conductive layer including the gate electrode 1151 of the driving transistor T1 and the first gate insulating layer 141. The second gate insulating layer 142 may be an inorganic insulating layer including a silicon oxide ($SiO_x$), a silicon nitride ($SiN_x$), a silicon oxynitride ($SiO_xN_y$), or the like.

Figure 10:
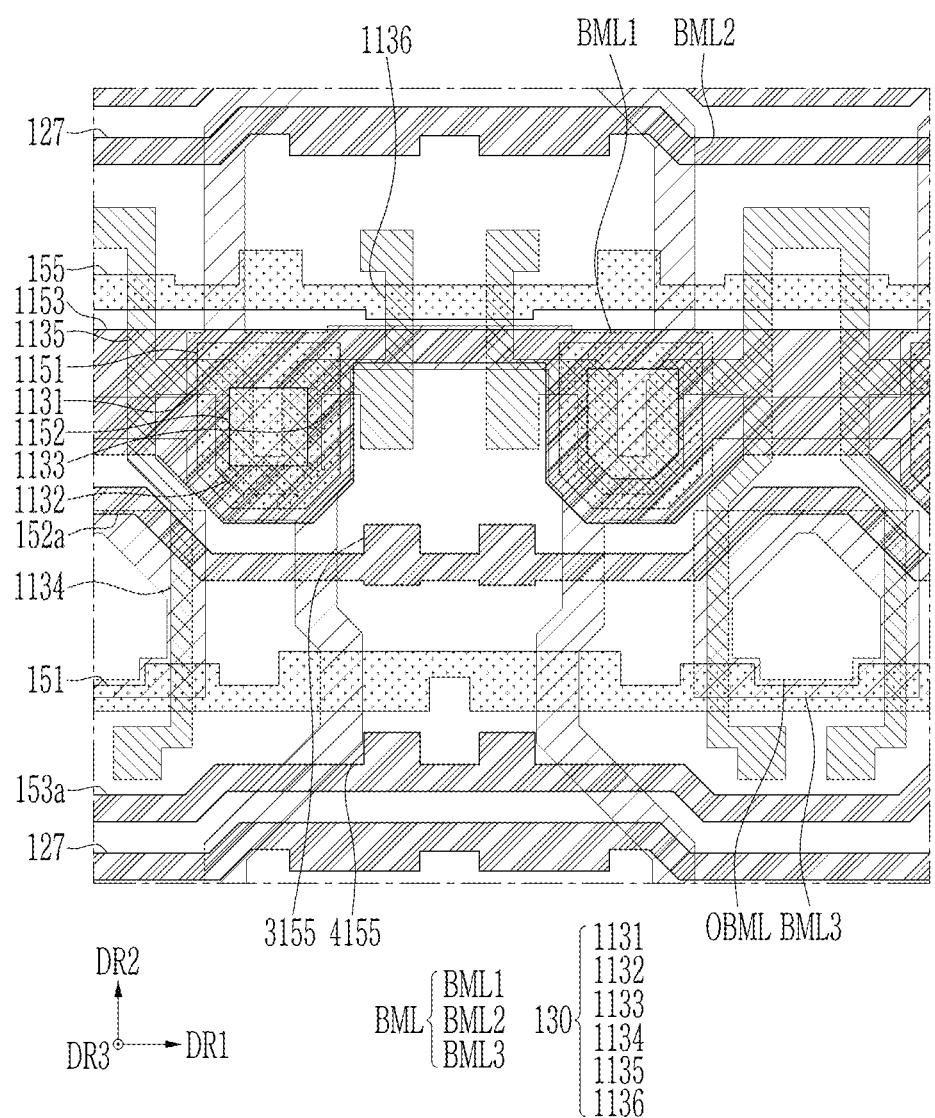

Referring to FIG. 10, a second gate conductive layer including a first storage electrode 1153 of a storage capacitor Cst, a lower shielding layer 3155 of a third transistor T3, and a lower shielding layer 4155 of a fourth transistor T4 may be positioned on the second gate insulating layer 142. The lower shielding layers 3155 and 4155 are positioned below the channels of the third transistor T3 and the fourth transistor T4, respectively, and may serve to shield them from optical or electromagnetic interference provided to the channel from the lower side.

The first storage electrode 1153 overlaps the gate electrode 1151 of the driving transistor T1 to form a storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is extended in the horizontal direction (the first direction DR1) and is connected to the adjacent first storage electrode 1153.

The lower shielding layer 3155 of the third transistor T3 may overlap a channel 3137 and a gate electrode 3151 of the third transistor T3. The lower shielding layer 4155 of the fourth transistor T4 may overlap a channel 4137 and a gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may extend approximately in the horizontal direction (the first direction). The lower second scan line 152a may be connected to the lower shielding layer 3155 of the third transistor T3. The lower second scan line 152a may be integral with the lower shielding layer 3155 of the third transistor T3. The lower initialization control line 153a may be connected to the lower shielding layer 4155 of the fourth transistor T4. The lower initialization control line 153a may be integral with the lower shielding layer 4155 of the fourth transistor T4.

A second gate conductive layer GAT2 may include a metal such as copper (Cu), molybdenum (Mo), aluminum (Al), or titanium (Ti), or a metal alloy thereof and may be configured as a single layer or multiple layers.

Referring to FIG. 20, a first interlayer insulating layer 161 may be positioned on the second gate conductive layer including the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_x$), a silicon nitride ($SiN_x$), a silicon oxynitride ($SiO_xN_y$), and the like, and an inorganic insulating material may be thickly formed according to an embodiment.

Figure 11:
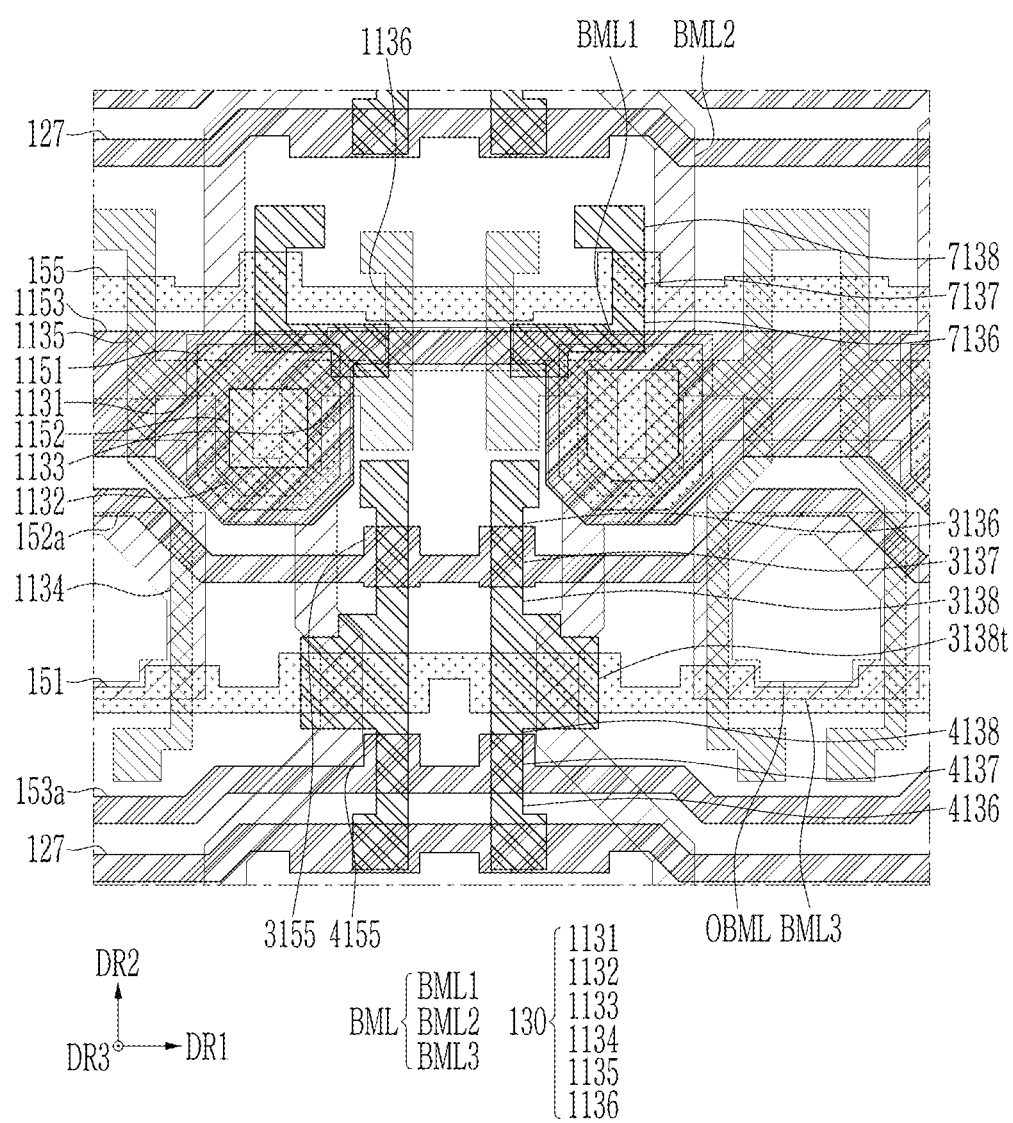

Referring to FIG. 11, on the first interlayer insulating layer 161, an oxide semiconductor layer including a channel 3137, a first area 3136 and a second area 3138 of the third transistor T3, a channel 4137, a first area 4136 and a second area 4138 of the fourth transistor T4, and a channel 7137, a first area 7136, and a second area 7138 of the seventh transistor T7 may be positioned. The oxide semiconductor layer may include an upper boost electrode 3138t of the capacitor Cboost.

The channel 3137, the first area 3136, and the second area 3138 of the third transistor T3, and the channel 4137, the first area 4136, and the second area 4138 of the fourth transistor T4, may be connected to each other to form an integral body. Since the channel 7137, the first area 7136, and the second area 7138 of the seventh transistor T7 are separated from the channel 3137 of the third transistor T3 and the channel 4137 of the fourth transistor T4, the oxide semiconductor layer may be divided into two parts that are separated from each other.

The first area 3136 and the second area 3138 of the third transistor T3 are positioned on sides of the channel 3137 of the third transistor T3, and the first area 4136 and the second area 4138 of the fourth transistor T4 are positioned on sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155. The first area 7136 and the second area 7138 of the seventh transistor T7 are positioned on sides of the channel 7137 of the seventh transistor T7. A transistor including an oxide semiconductor layer may be referred to as an oxide semiconductor transistor.

The upper boost electrode 3138t of the capacitor Cboost is positioned between the second area 3138 of the third transistor T3 and the second area 4138 of the fourth transistor T4. The upper boost electrode 3138t of the boost capacitor Cboost overlaps a portion of the first scan line 151 (hereinafter, also referred to as a lower boost electrode of the boost capacitor Cboost) to configure the boost capacitor Cboost.

Referring to FIG. 20, a third gate insulating layer 143 may be positioned on the oxide semiconductor layer including the channel 3137, the first area 3136 and the second area 3138 of the third transistor T3, the channel 4137, the first area 4136 and the second area 4138 of the fourth transistor T4, the channel 7137, the first area 7136 and the second area 7138 of the seventh transistor T7, and the upper boost electrode 3138t of the boost capacitor Cboost.

The third gate insulating layer 143 may be positioned on the entire surfaces of the oxide semiconductor layer and the first interlayer insulating layer 161. Accordingly, the third gate insulating layer 143 may cover the upper surfaces and the sides of the channel 3137, the first area 3136 and the second area 3138 of the third transistor T3, the channel 4137, the first area 4136 and the second area 4138 of the fourth transistor T4, and the upper boost electrode 3138t of the boost capacitor Cboost. However, the embodiment is not limited thereto, and the third gate insulating layer 143 may not be positioned on the entire surface of the oxide semiconductor layer and the first interlayer insulating layer 161. For example, the third gate insulating layer 143 may overlap the channel 3137 of the third transistor T3 and may not overlap the first area 3136 and the second area 3138. The third gate insulating layer 143 may overlap the channel 4137 of the fourth transistor T4 and may not overlap the first area 4136 and the second area 4138.

The third gate insulating layer 143 may include an inorganic insulating layer including a silicon oxide ($SiO_x$), a silicon nitride ($SiN_x$), a silicon oxynitride ($SiO_xN_y$), or the like.

Figure 12:
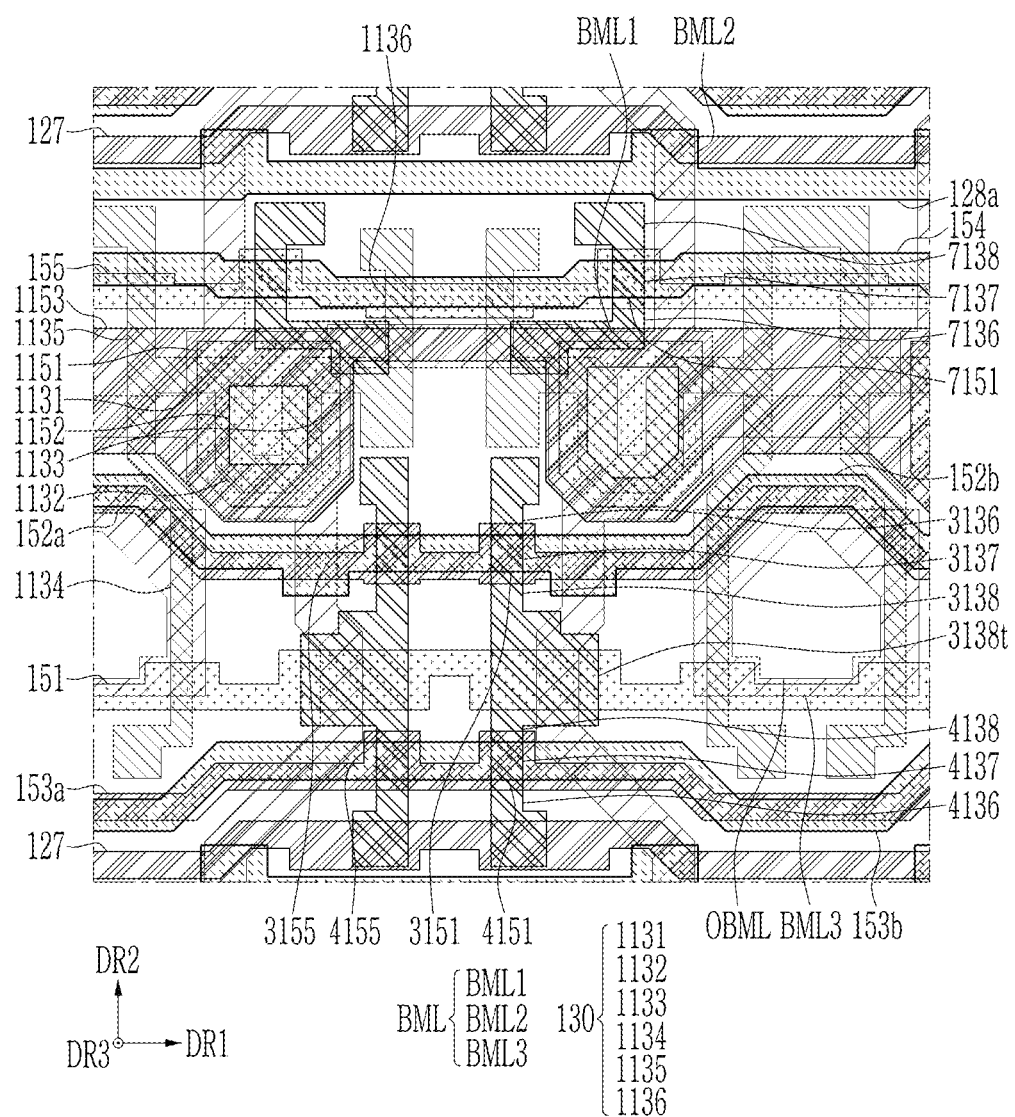

Referring to FIG. 12, on the third gate insulating layer 143, a third gate conductive layer including a gate electrode 3151 of the third transistor T3, a gate electrode 4151 of the fourth transistor T4, and a gate electrode 7151 of the seventh transistor T7 may be positioned.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The gate electrode 7151 of the seventh transistor T7 may overlap the channel 7137 of the seventh transistor T7.

The third gate conductive layer may further include an upper second scan line 152b, an upper initialization control line 153b, and a bypass control line 154.

The upper second scan line 152b, the upper initialization control line 153b, and the bypass control line 154 may extend approximately in the horizontal direction (the first direction). The upper second scan line 152b forms a second scan line 152 together with the lower second scan line 152a. The upper second scan line 152b may be connected to the gate electrode 3151 of the third transistor T3. The upper second scan line 152b may be integral with the gate electrode 3151 of the third transistor T3. The upper initialization control line 153b together with the lower initialization control line 153a constitutes the initialization control line 153. The upper initialization control line 153b may be connected to the gate electrode 4151 of the fourth transistor T4. The upper initialization control line 153b may be integral with the gate electrode 4151 of the fourth transistor T4.

The bypass control line 154 may be connected to the gate electrode 7151 of the seventh transistor T7, and the bypass control line 154 may be integral with the gate electrode 7151 of the seventh transistor T7.

The third gate conductive layer may further include a lower second initialization voltage line 128a. The lower second initialization voltage line 128a may extend in the approximately horizontal direction (the first direction), and the second initialization voltage AVinit is applied.

A third gate conductive layer GAT3 may include a metal such as copper (Cu), molybdenum (Mo), aluminum (Al), or titanium (Ti), or a metal alloy thereof and may be composed of a single layer or multiple layers.

After the third gate conductive layer including the gate electrode 3151 of the third transistor T3, the gate electrode 4151 of the fourth transistor T4, and the gate electrode 7151 of the seventh transistor T7 is formed, the portion of the oxide semiconductor layer covered by the third gate conductive layer is formed into the channel through a plasma treatment or a doping process, and the portion of the oxide semiconductor layer not covered by the third gate conductive layer becomes conductive. The channel 3137 of the third transistor T3 may be positioned under the gate electrode 3151 to overlap the gate electrode 3151. The first area 3136 and the second area 3138 of the third transistor T3 may not overlap the gate electrode 3151. The channel 4137 of the fourth transistor T4 may be positioned under the gate electrode 4151 to overlap the gate electrode 4151. The first area 4136 and the second area 4138 of the fourth transistor T4 may not overlap the gate electrode 4151. The channel 7137 of the seventh transistor T7 may be positioned below the gate electrode 7151 to overlap the gate electrode 7151. The first region 7136 and the second region 7138 of the seventh transistor T7 may not overlap the gate electrode 7151. The upper boost electrode 3138t does not overlap the third gate conductive layer, so it may have the same/similar characteristic as the conductor's conductivity. A transistor including an oxide semiconductor layer may have characteristics of an n-type transistor.

Referring to FIG. 20, a second interlayer insulating layer 162 may be positioned on the third gate conductive layer including the gate electrode 3151 of the third transistor T3, the gate electrode 4151 of the fourth transistor T4, and the gate electrode 7151 of the seventh transistor T7. The second interlayer insulating layer 162 may have a single-layer or multi-layered structure. The second interlayer insulating layer 162 may include an inorganic insulating material such as a silicon nitride ($SiN_x$), a silicon oxide ($SiO_x$), or a silicon oxynitride ($SiO_xN_y$), and may include an organic material according to an embodiment.

Figure 13:
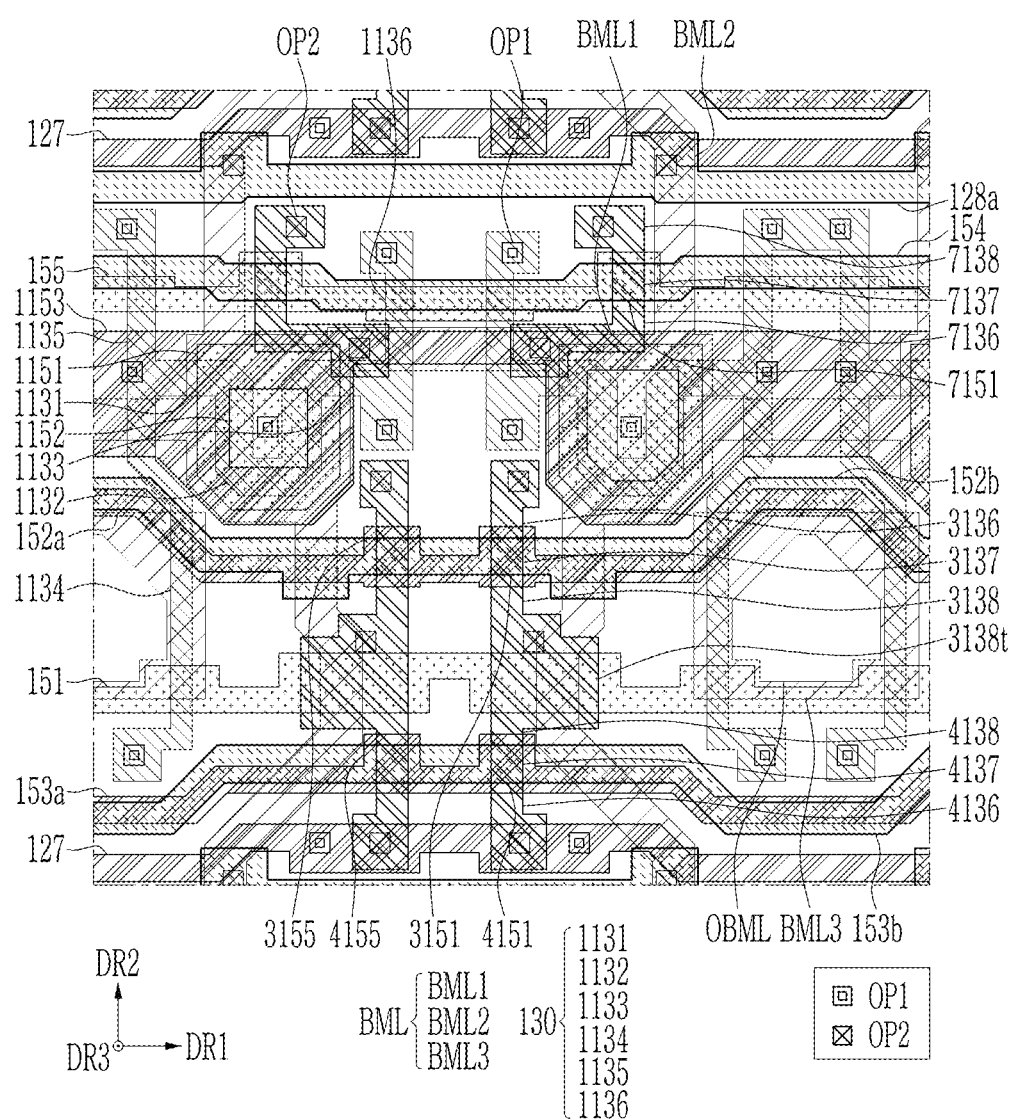

Referring to FIG. 13, two types of openings OP1 and OP2 may be formed in the second interlayer insulating layer 162. The two types of openings OP1 and OP2 may be formed using different masks.

The opening OP1 is an opening formed in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The opening OP2 is an opening formed in the second interlayer insulating layer 162 and/or the third gate insulating layer 143, and may expose the oxide semiconductor layer or the third gate conductive layer.

One of the openings OP1 overlaps at least a portion of the gate electrode 1151 of the driving transistor T1, and may also be formed in the third gate insulating layer 143, the first interlayer insulating layer 161, and the second gate insulating layer 142. One of the openings OP1 may overlap the opening 1152 of the first storage electrode 1153, and may be positioned inside the opening 1152 of the first storage electrode 1153.

One of the openings OP2 may overlap at least a portion of the boost capacitor Cboost, and may be further formed in the third gate insulating layer 143.

Another one of the openings OP1 overlaps at least a portion of the second area 1133 of the driving transistor T1, and may be formed in the third gate insulating layer 143, the first interlayer insulating layer 161, the second gate insulating layer 142, and the first gate insulating layer 141.

Another one of the openings OP2 overlaps at least a portion of the first area 3136 of the third transistor T3 and may be formed in the third gate insulating layer 143.

Figure 14:
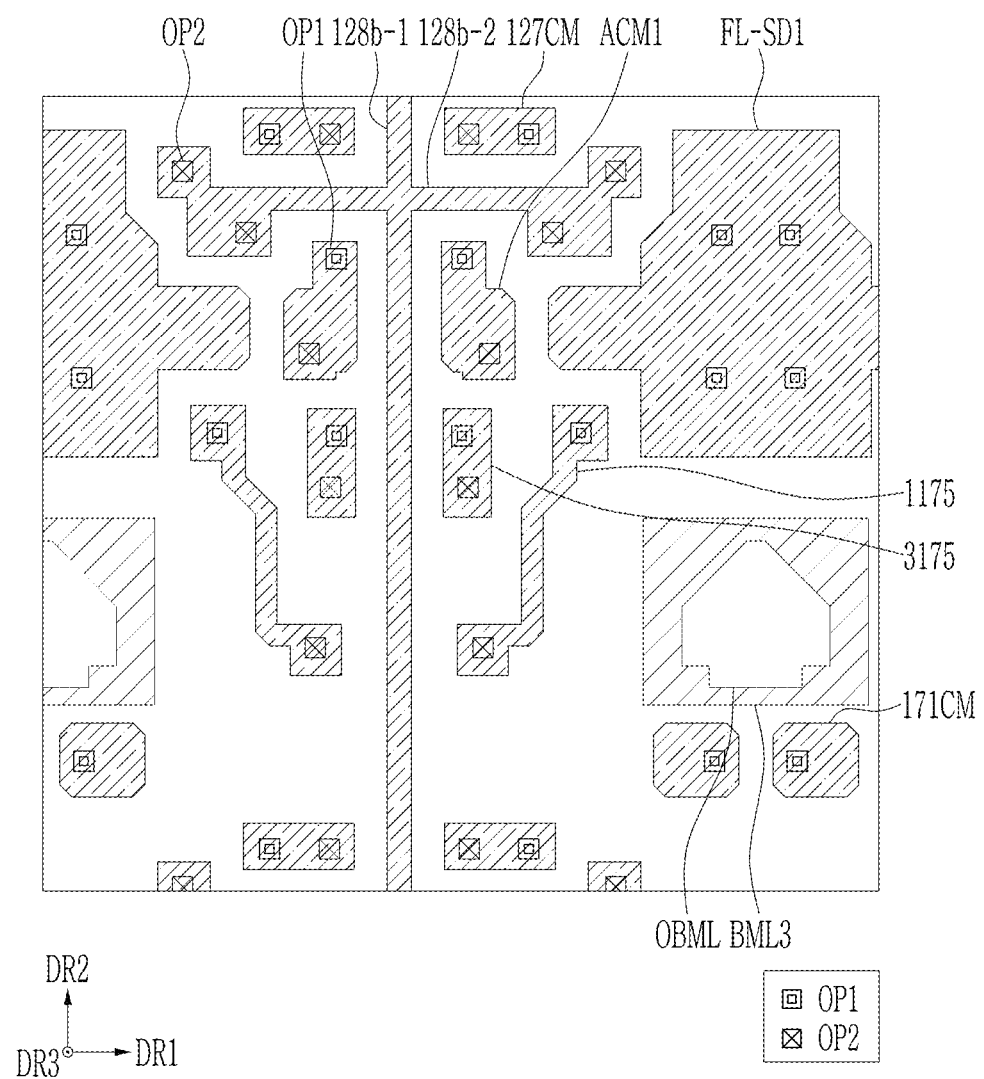
Figure 15:
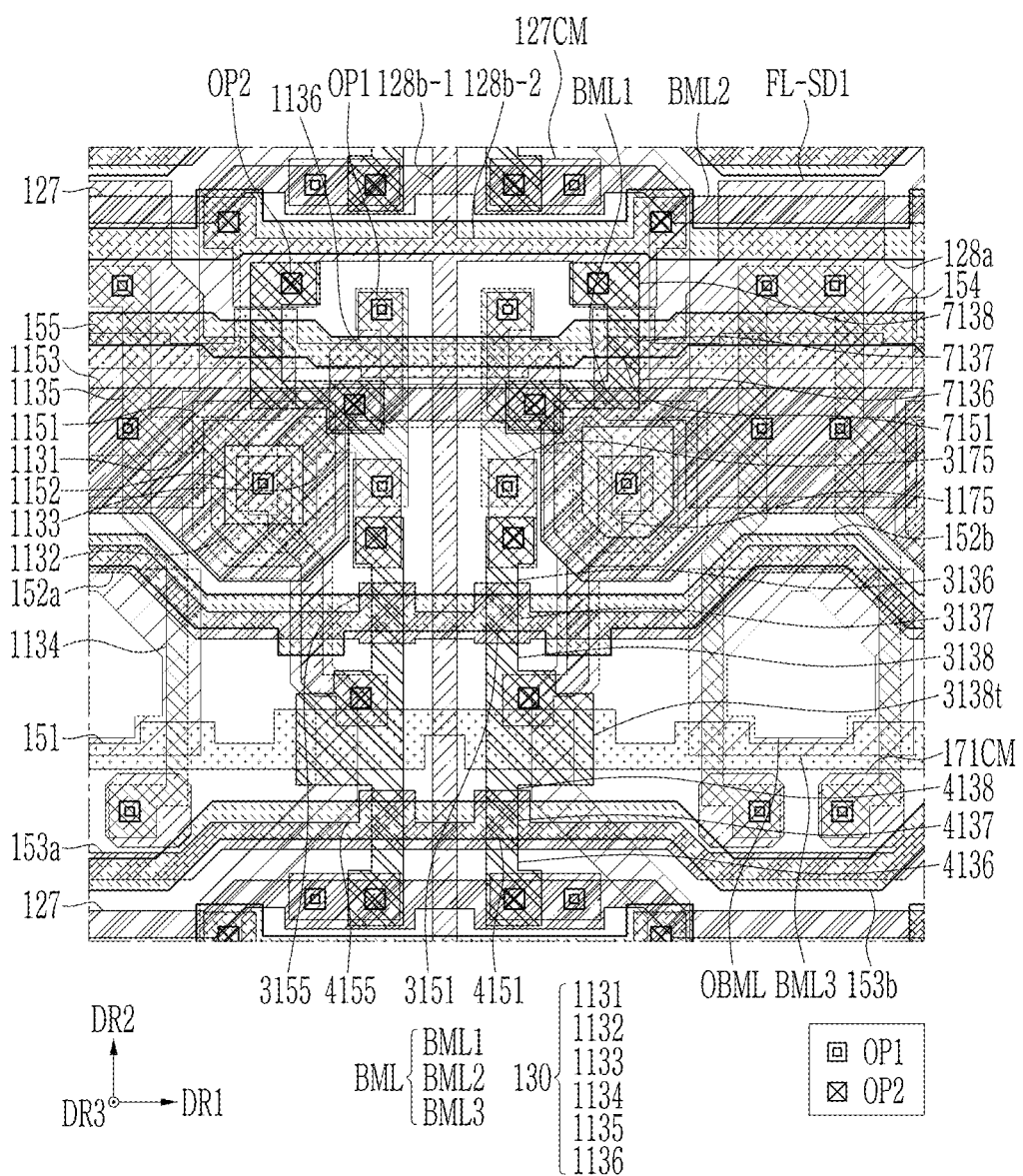

Referring to FIGS. 14 and 15, a first data conductive layer including a first connection electrode 1175 and a second connection electrode 3175 may be positioned on the second interlayer insulating layer 162. FIG. 14 is a schematic top plan view illustrating only the first data conductive layer, the opening OP1, and the opening OP2 since it may be difficult to readily recognize the first data conductive layer in FIG. 15, and FIG. 15 is a schematic top plan view illustrating all layers below the first data conductive layer.

The first connection electrode 1175 may overlap the gate electrode 1151 of the driving transistor T1. An end of the first connection electrode 1175 may be connected to the gate electrode 1151 of the driving transistor T1 through the opening OP1 and the opening 1152 of the first storage electrode 1153. Another end of the first connection electrode 1175 may overlap the boost capacitor Cboost. The another end of the first connection electrode 1175 may be connected to the upper boost electrode 3138t of the boost capacitor Cboost through the opening OP2. Accordingly, the gate electrode 1151 of the driving transistor T1 and the upper boost electrode 3138t of the boost capacitor Cboost may be connected by the first connection electrode 1175. The gate electrode 1151 of the driving transistor T1 may also be connected to the second area 3138 of the third transistor T3 and the second area 4138 of the fourth transistor T4 by the first connection electrode 1175.

An end of the second connection electrode 3175 may overlap the second area 1133 of the driving transistor T1. The end of the second connection electrode 3175 may be connected to the second area 1133 of the driving transistor T1 through the opening OP1. Another end of the second connection electrode 3175 may overlap the first area 3136 of the third transistor T3. The another end of the second connection electrode 3175 may be connected to the first area 3136 of the third transistor T3 through the opening OP2. Accordingly, the second area 1133 of the driving transistor T1 and the first area 3136 of the third transistor T3 may be connected by the second connection electrode 3175, and the first semiconductor layer 130 and the oxide semiconductor layer are electrically connected.

The first data conductive layer may further include a second initialization voltage line 128b. The second initialization voltage line 128 has a wiring part 128b-1 extending in the vertical direction (the second direction) and a first extending part 128b-2 protruded from the wiring part 128b-1 at sides of the horizontal direction (the first direction), and the end of the first extending part 128b-2 may be extended. The extended end of the first extending part 128b-2 may be electrically connected to the second initialization voltage line 128a positioned in the third gate conductive layer and the second area 7138 of the seventh transistor T7 positioned in the oxide semiconductor layer through two different openings OP2. As a result, the second initialization voltage AVinit is transmitted in the horizontal direction (the first direction DR1) through the second initialization voltage line 128a positioned on the third gate conductive layer, and the first data conductive layer transmits it in the vertical direction (the second direction DR2) through the second initialization voltage line 12. A second initialization voltage AVinit is provided to the second area 7138 of the seventh transistor T7.

The first data conductive layer may further include connection parts 127CM and 171CM, an anode connecting member ACM1, and an expansion part FL-SD1.

The connection part 127CM is connected to the first initialization voltage line 127 of the second gate conductive layer through the opening OP1, and is connected to a portion 4136 of the second semiconductor layer (the oxide semiconductor layer) through the opening OP2 to transmit the first initialization voltage Vinit flowing through the first initialization voltage line 127 to the fourth transistor T4 of the oxide semiconductor layer.

The connection part 171CM is electrically connected to a portion 1134 of the first semiconductor layer 130, e.g., the second transistor T2, through the opening OP1.

The anode connecting member ACM1 is electrically connected to a portion 1136 of the first semiconductor layer 130, e.g., the sixth transistor T6, through the opening OP1.

The expansion part FL-SD1 is widely formed in order to planarize the overlying anode. The expansion part FL-SD1 is connected to a portion 1135 of the first semiconductor layer 130 through the opening OP1, e.g., the fifth transistor T5, and is also electrically connected to the first storage electrode 1153 through the opening OP1.

A first data conductive layer SD1 may include a metal such as aluminum (Al), copper (Cu), molybdenum (Mo), or titanium (Ti), or a metal alloy thereof, and may be configured as a single layer or multiple layers.

Referring to FIG. 20, a first organic layer 181 may be positioned on the first data conductive layer including the first connection electrode 1175 and the second connection electrode 3175. The first organic layer 181 may be an organic insulator including an organic material, and the organic material may include at least one material selected from a group consisting of polyimide, polyamide, acryl resin, benzocyclobutene, and phenol resin.

Figure 16:
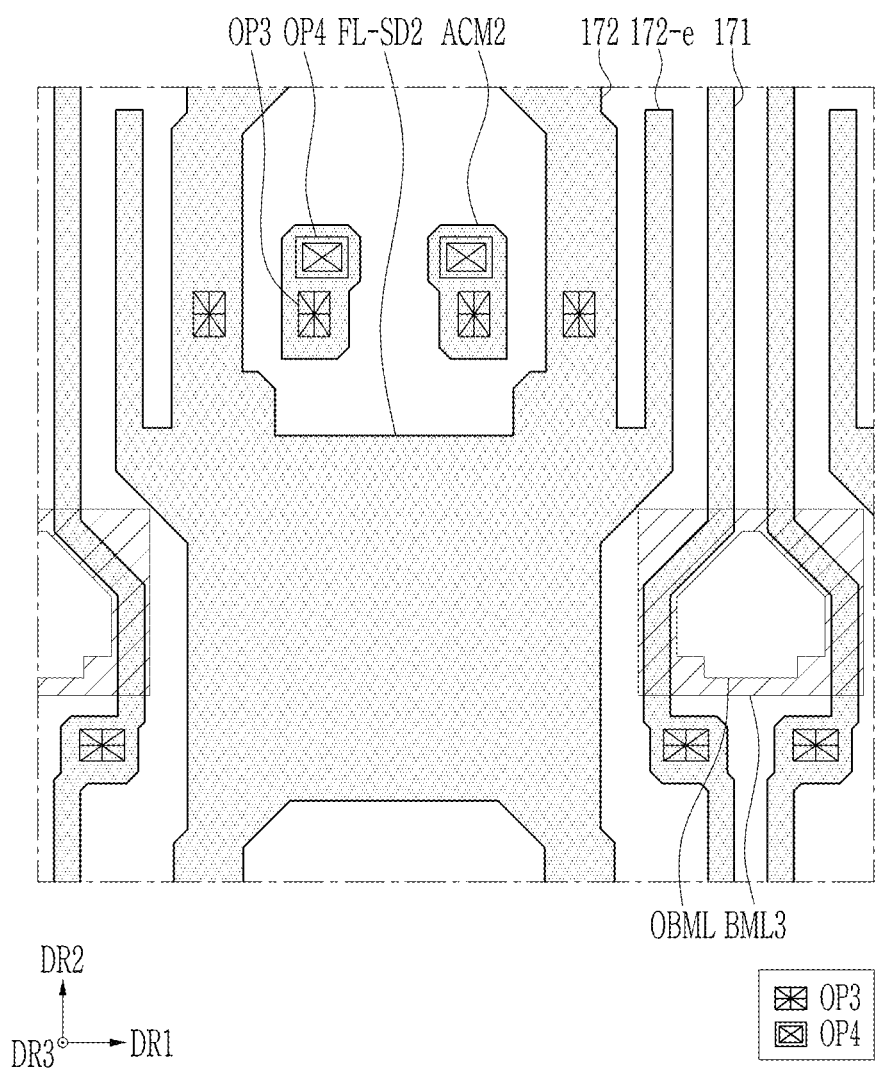
Figure 17:
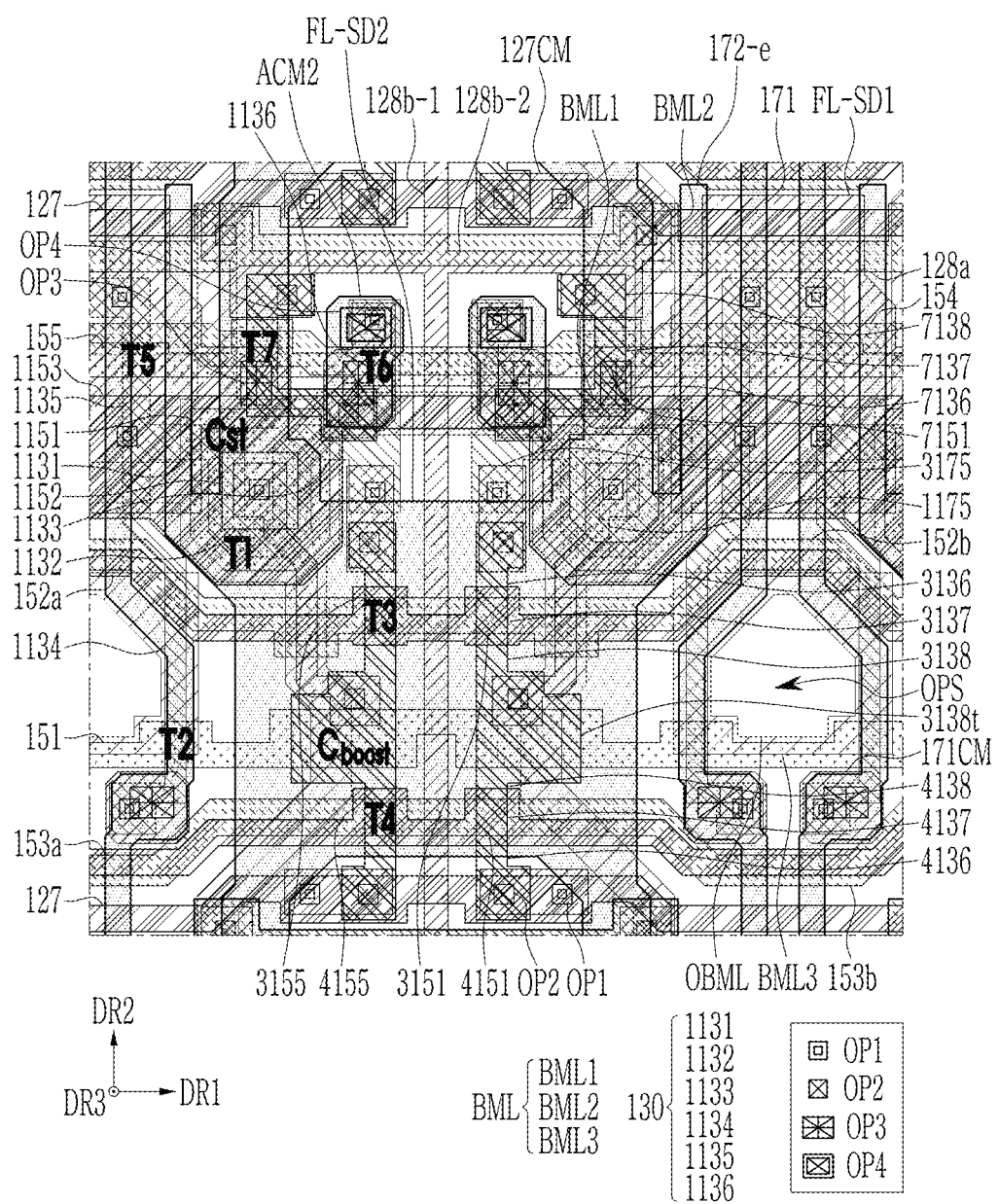

Referring to FIGS. 16, 17, and 20, the first organic layer 181 includes a lower organic layer opening OP3. On the first organic layer 181, a second data conductive layer including a data line 171, a driving voltage line 172, and an anode connecting member ACM2 may be positioned. A second organic layer 182 and a third organic layer 183 are positioned on the second data conductive layer, and an anode connection opening OP4 is formed in the second organic layer 182 and the third organic layer 183. The anode connecting member ACM2 is electrically connected to the anode through the anode connection opening OP4. FIG. 16 is a schematic top plan view only illustrating the second data conductive layer and the lower organic layer opening OP3 and the anode connection opening OP4 since it is difficult to readily recognize the second data conductive layer in FIG. 17, and FIG. 17 is a schematic top plan view illustrating the second data conductive layer and all surrounding layers.

Referring to FIGS. 16 and 17, the lower organic layer opening OP3 overlaps the connection part 171CM, the anode connecting member ACM1, and the expansion part FL-SD1 positioned in the first data conductive layer to expose them, respectively.

The second data conductive layer may include a data line 171, a driving voltage line 172, and an anode connecting member ACM2.

The data line 171 and the driving voltage line 172 may extend in an approximately vertical direction (a second direction). The data line 171 is connected to the connection part 171CM of the first data conductive layer through the lower organic layer opening OP3 and is connected to the second transistor T2 through this. The data line 171 has a structure that extends in the vertical direction and bends, and the data line 171 at a bent portion may constitute the boundary of the photosensor area OPS.

The driving voltage line 172 is electrically connected to the fifth transistor T5 and the first storage electrode 1153 through the expansion part FL-SD1 of the first data conductive layer through the lower organic layer opening OP3.

The anode connecting member ACM2 is electrically connected to the anode connecting member ACM1 of the first data conductive layer through the opening OP3 and is electrically connected to the sixth transistor T6.

Referring to FIG. 16, the driving voltage line 172 further includes an expansion part FL-SD2 and a protruded wiring part 172-e, and has a structure that is not formed at the portion where the anode connecting member ACM2 is formed.

The expansion part FL-SD2 is formed wide in order to planarize the overlying anode.

On the other hand, two protruded wiring parts 172-e of the driving voltage line 172 are also formed on sides of two data lines 171 in order to flatly form the overlying anode, thereby having a structure of a total of four wires 171 and 172-e positioned below the anode. Referring to FIG. 17, two data lines 171 formed adjacent to each other have portions that are bent in opposite directions and form a large gap, and the portions correspond to the photosensor area OPS and also correspond to the opening OBML of underlying island-shaped metal layers BML3. The anode has a planarizing characteristic by the structure (the expansion part FL-SD1 and the wiring part 128b-1 of the first data conductive layer) under the anode as described above, and the expansion part FL-SD2 of the second data conductive layer, the data line 171, the wiring part 172-e, and the organic layers 181, 182, and 183.

In the embodiment, the expansion part FL-SD1 and the expansion part FL-SD2 are electrically connected to the driving voltage line 172 to transmit the driving voltage ELVDD.

A second data conductive layer SD2 may include a metal such as aluminum (Al), copper (Cu), molybdenum (Mo), or titanium (Ti), or a metal alloy thereof and may be configured as a single layer or multiple layers.

Referring to FIG. 20, the second organic layer 182 and the third organic layer 183 are positioned on the second data conductive layer. The second organic layer 182 and the third organic layer 183 may be organic insulators, and may include at least one material selected from the group consisting of polyimide, polyamide, acryl resin, benzocyclobutene, and phenol resin. According to an embodiment, the third organic layer 183 may be omitted.

The anode connection opening OP4 is formed in the second organic layer 182 and the third organic layer 183, through which the anode and the anode connecting member ACM2 are electrically connected.

Figure 18:
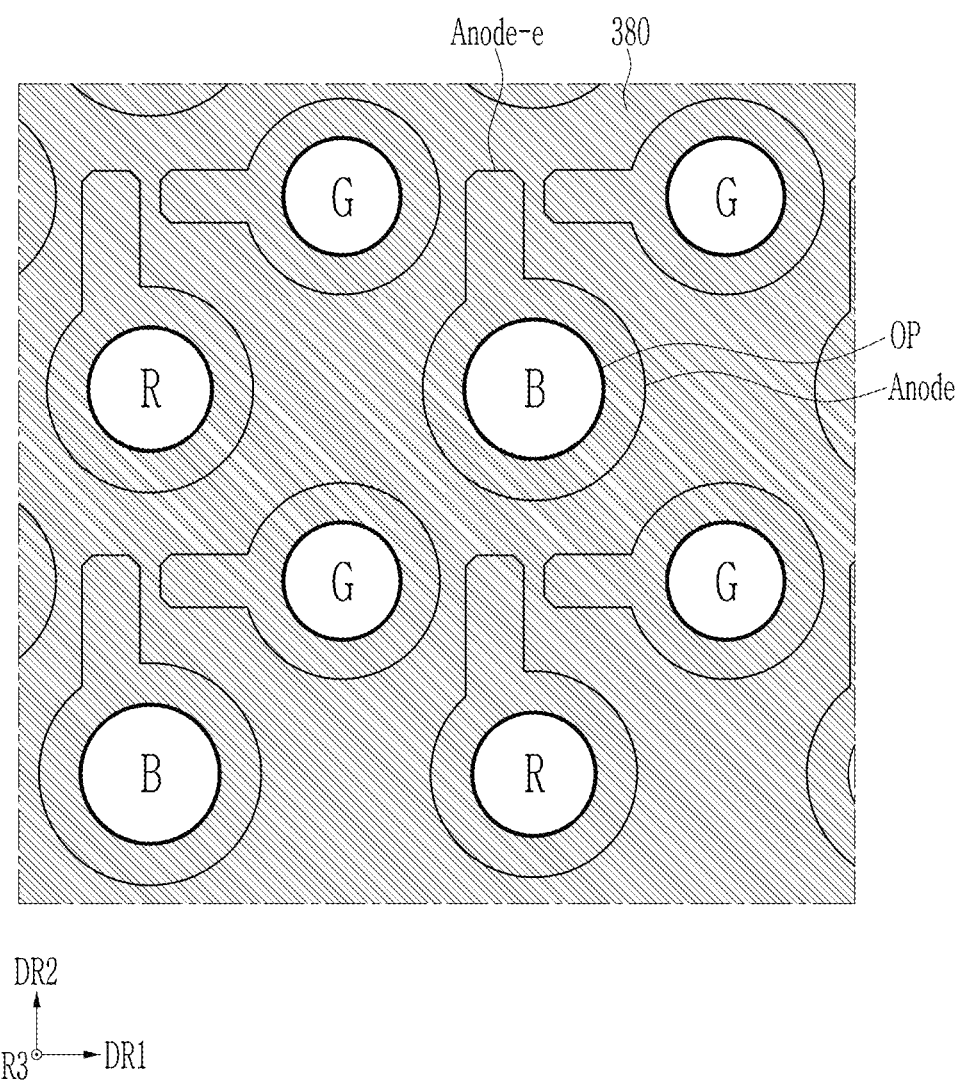
Figure 19:
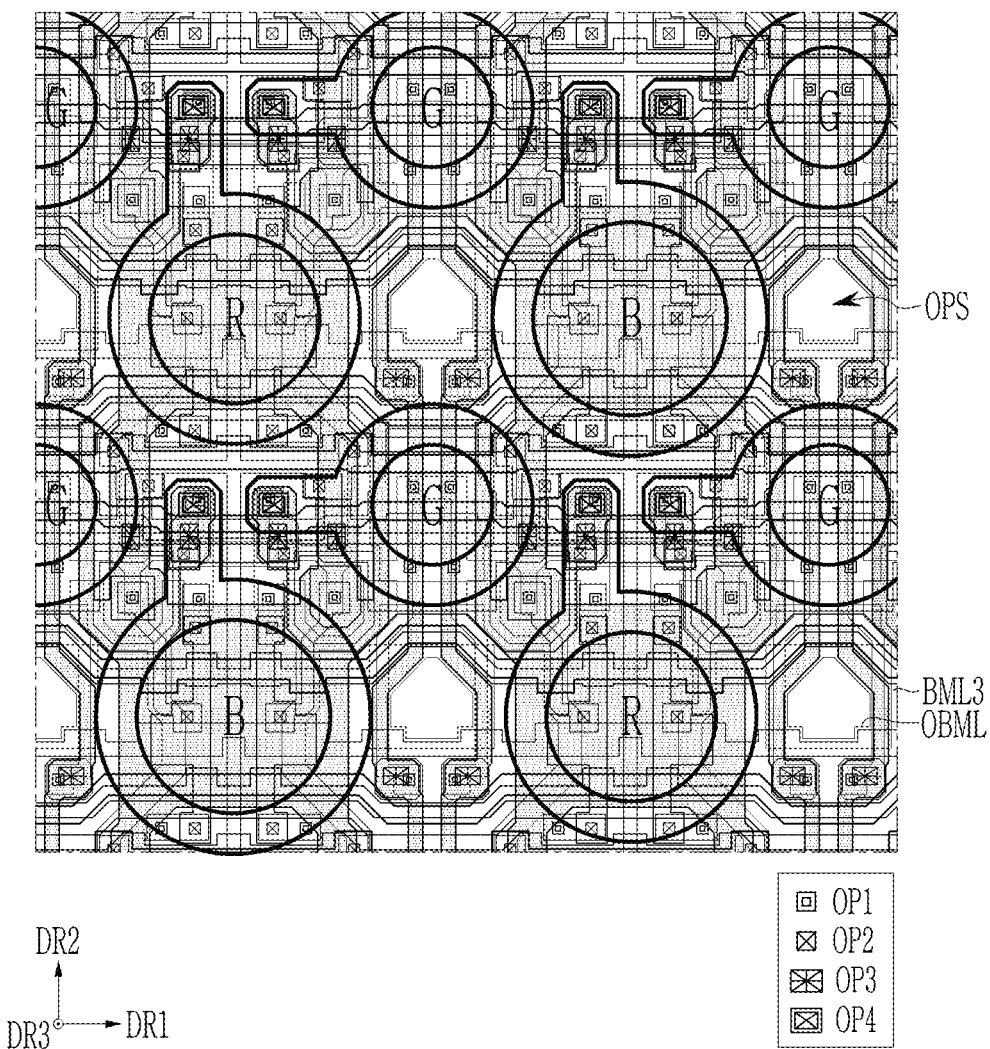

Referring to FIGS. 18, 19, and 20, the anode Anode is formed on the third organic layer 183. The anode Anode may further include an extension part Anode-e to receive a current from the pixel circuit unit through the anode connection opening OP4. Referring to FIG. 19, two anode connection openings OP4 are positioned adjacent to each other and may have a structure in which an extension part Anode-e extends in the first direction DR1 to be connected to the anode included in the green light emitting diode LED and another extension part Anode-e extends in the second direction to be connected to the anode included in the blue or red light emitting diode LED.

Referring to FIGS. 19 and 20, the pixel definition layer 380 is positioned on the anode Anode, and an opening OP of the pixel definition layer 380 is formed to overlap the anode Anode. The extension part Anode-e of the anode Anode has a structure that is not exposed by the opening OP of the pixel definition layer 380 and overlaps the pixel definition layer 380 in a plan view As a result, the anode connection opening OP4 also has a structure overlapping the pixel definition layer 380 in a plan view.

Referring to FIG. 20, since the anode connection opening OP4 does not overlap the opening OP of the pixel definition layer 380 and an opening OPBM of the light blocking layer 220 in a plan view, it may be seen that the anode connection opening OP4 has a structure overlapping the pixel definition layer 380 and the light blocking layer 220 in a plan view.

The portion of the lower organic layer opening OP3 (the first lower organic layer opening) overlaps at least a portion of the opening OPBM of the light blocking layer 220 in a plan view, and the remaining lower organic layer opening OP3, e.g., the second lower organic layer opening, overlaps the light blocking layer 220 in a plan view. All lower organic layer openings OP3 overlap the pixel definition layer 380 in a plan view.

In the embodiment, by the expansion part FL-SD1 of the first data conductive layer and the expansion part FL-SD2 of the second data conductive layer positioned below the anode, the portion of the anode Anode exposed to the opening OP of at least the pixel definition layer 380 may be formed flat.

Due to the position relationship of the anode Anode and the anode connection opening OP4 thereunder, external light is not reflected asymmetrically and a color spread (a color separation) does not occur. This is described in FIG. 22 etc. in more detail.

Based on the planar structure, the entire cross-sectional structure of the light emitting display device is described with reference to FIG. 20.

FIG. 20 is a schematic cross-sectional view of a light emitting display device according to an embodiment.

In FIG. 20, in addition to the stacked structure of the display area DA, the stacked structure of the first component area EA1 is also shown.

Among the detailed stacking structures of the pixels of the display area DA shown in FIG. 20, the structure up to the anode Anode is described while referring FIGS. 7 to 19. In the embodiment of FIG. 20, the pixel circuit part may include the second organic layer 182 and the third organic layer 183 and means the underlying configuration, and the light emitting diode LED may mean the configuration positioned above the third organic layer 183 and below the encapsulation layer 400.

Referring to FIG. 20, the stacked structure on the anode in the pixel of display area DA is as follows.

On the anode Anode, the pixel definition layer 380 having the opening OP exposing the anode Anode and covering at least a portion of the anode Anode may be positioned. The pixel definition layer 380 is formed of an organic material with a black color so that light applied from the outside is not reflected back to the outside. According to an embodiment, the pixel definition layer 380 may include an organic material of a negative-type black color, and may include a black color pigment.

A spacer 385 is positioned on the pixel definition layer 380. Unlike the pixel definition layer 380, the spacer 385 may be formed of a transparent organic insulating material. According to an embodiment, the spacer 385 may be formed of a positive-type transparent organic material. The spacer 385 may include a first portion 385-1 and a second portion 385-2 having different thicknesses.

On the anode Anode, the spacer 385, and the pixel definition layer 380, a functional layer FL and a cathode Cathode are sequentially formed, and in the display area DA and the first component area EA1, the functional layer FL and the cathode Cathode may be positioned in the entire region. The emission layer EML is positioned between the functional layers FL, and the emission layer EML may be positioned only within the opening OP of the pixel definition layer 380. Hereinafter, the functional layer FL and the emission layer EML may be collectively referred to as an intermediate layer. The functional layer FL may include at least one of auxiliary layers such as an electron injection layer, an electron transport layer, a hole transport layer, and a hole injection layer, the hole injection layer and the hole transport layer may be positioned under the emission layer EML, and the electron transport layer and the electron injection layer may be positioned on the emission layer EML.

A capping layer AL1 and a low reflection layer AL2 are formed on the cathode Cathode.

The capping layer AL1 may serve to improve the light emitting efficiency of the light-emitting element by a principle of constructive interference. The capping layer AL1 may include a material having a refractive index of about 1.6 or more for light having a wavelength of about 589 nm, for example. The capping layer AL1 may be an organic capping layer including organic materials, an inorganic capping layer including inorganic materials, or a composite capping layer including organic materials and inorganic materials. For example, the capping layer AL1 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compounds, heterocyclic compounds, and amine group-containing compounds may be optionally substituted with substituents including O, N, S, Se, Si, F, Cl, Br, I, or any combination thereof.

A low reflection layer AL2 may be disposed on the capping layer AL1. The low reflection layer AL2 may overlap the front surface of the substrate 110. The low reflection layer AL2 may include an inorganic material having low reflectance, and in an embodiment, may include a metal or a metal oxide. In case that the low reflection layer AL2 includes a metal, it may include a metal, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In case that the low reflection layer AL2 includes a metal oxide, it may include a metal oxide, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS or a combination thereof. In an embodiment, an absorption coefficient (k) of the inorganic material included in the low reflection layer AL2 may be 4.0 or less and 0.5 or more ($0.5 \leq k \leq 4.0$). The inorganic material included in the low reflection layer AL2 may have a refractive index (n) of 1 or more ($n \geq 1.0$). The low reflection layer AL2 induces destructive interference between the light incident into the display device and the light reflected from the metal disposed under the low reflection layer AL2, thereby reducing external light reflectivity. Accordingly, the display quality and visibility of the display device may be improved by reducing the reflectance of the external light of the display device through the low reflection layer AL2.

According to an embodiment, the capping layer AL1 may be omitted so that the low reflection layer AL2 may contact the cathode Cathode.

An encapsulation layer 400 is positioned on the low reflection layer AL2. The encapsulation layer 400 may include at least one inorganic layer and at least one organic layer, and according to an embodiment, may have a triple-layer structure including a first inorganic encapsulation layer, an organic encapsulation layer, and a second inorganic encapsulation layer. The encapsulation layer 400 may be for protecting the emission layer EML from moisture or oxygen that may be inflowed from the outside. According to an embodiment, the encapsulation layer 400 may include a structure in which an inorganic layer and an organic layer are sequentially further stacked each other.

In the embodiment of FIG. 20, sensing insulating layers 501, 510, and 511 and sensing electrodes 540 and 541 are positioned on the encapsulation layer 400 for touch sensing. In an embodiment of FIG. 5, the touch may be sensed in a capacitive type using two sensing electrodes 540 and 541.

Specifically, the first sensing insulating layer 501 is formed on the encapsulation layer 400, and sensing electrodes 540 and 541 are formed thereon. Sensing electrodes 540 and 541 may be insulated from each other via the second sensing insulating layer 510 interposed therebetween, and the portions may be electrically connected through the opening positioned in the sensing insulating layer 510. The sensing electrodes 540 and 541 include a metal such as aluminum (Al), copper (Cu), silver (Ag), gold (Au), molybdenum (Mo), titanium (Ti), or tantalum (Ta), or a metal alloy thereof and may be composed of a single layer or multiple layers. A third sensing insulating layer 511 is formed on the sensing electrode 540.

The light blocking layer 220 is positioned on the upper sensing electrode 540 and the third sensing insulating layer 511. The light blocking layer 220 is formed including only organic materials without including inorganic materials such as carbon.

The light blocking layer 220 may be positioned so as to overlap the sensing electrodes 540 and 541 in a plan view, and positioned so as to not overlap the anode Anode in a plan view. This is to prevent the anode Anode capable of displaying an image from being covered by the light blocking layer 220 and the sensing electrodes 540 and 541.

A reflection adjustment layer 235 may be disposed on the third sensing insulating layer 511 and the light blocking layer 220. The reflection adjustment layer 235 may selectively absorb light of a wavelength of some band of light reflected from inside the display device or incident from outside the display device. The reflection adjustment layer 235 may fill the opening OPBM of the light blocking layer 220.

For example, the reflection adjustment layer 235 absorbs a first wavelength band of about 490 nm to about 505 nm and a second wavelength band of about 585 nm to about 600 nm, and the light transmittance in the first wavelength band and the second wavelength band may be provided to be about 40% or less. The reflection adjustment layer 235 may absorb light with a wavelength outside a light emitting wavelength range of red, green, or blue light emitted from the light emitting diode LED. As such, the reflection adjustment layer 235 absorbs light of the wavelength that does not belong to the wavelength range of red, green, or blue light emitted from the light-emitting element (or light emitting diode LED), so it is possible to prevent or minimize a decrease in the luminance of the display device and prevent or minimize the deterioration of the light emitting efficiency of the display device and improve the visibility.

In an embodiment, the reflection adjustment layer 235 may be provided as an organic material layer including a dye, a pigment, or a combination thereof. The reflection adjustment layer 235 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and a combination thereof.

In an embodiment, the reflectance measured in SCI (Specular Component Included) mode on the surface of the reflection adjustment layer 235 may be 10% or less. For example, the reflection adjustment layer 235 absorbs external light reflection of the display device, so that visibility may be improved.

In an embodiment, the reflection adjustment layer 235 may have transmittance of about 64% to about 72%. The transmittance of the reflection adjustment layer 235 may be adjusted according to the content of the pigment and/or dye included in the reflection adjustment layer 235.

A planarization layer 550 covering the reflection adjustment layer 235 may be positioned on the reflection adjustment layer 235, and an additional window may be attached thereto.

On the other hand, in FIG. 20, the cross-sectional structure of the first component area EA1 is also shown.

The first component area EA1 is a region corresponding to the infrared sensor ES1 positioned on the rear surface of the display panel DP, and a first component area EA1 may include photosensor areas OPS.

Referring to the embodiment of FIG. 20, a photosensor area OPS does not include a semiconductor layer or a conductive layer, but does not include only a transparent layer, and a layer capable of blocking visible rays as the light blocking layer 220 may be included. For example, referring to FIG. 20, a photosensor area OPS overlaps the light blocking layer 220 in a plan view, and also overlaps the opening OBML positioned on the island-shaped metal layer BML3, so that the photosensor area OPS is not covered by the island-shaped metal layer BML3.

Specifically, the stacked structure of the photosensor area OPS according to an embodiment is as follows, based on FIG. 20.

The opening OBML of the island-shaped metal layer BML3 is positioned on the substrate 110, the buffer layer 111 of an inorganic insulating layer is positioned in the opening OBML of the island-shaped metal layer BML3, and the first gate insulating layer 141 and the second gate insulating layer 142, which are inorganic insulating layers, are positioned sequentially on the buffer layer 111. On the second gate insulating layer 142, the first interlayer insulating layer 161, the third gate insulating layer 143, and the second interlayer insulating layer 162, which are inorganic insulating layers, are stacked sequentially each other. On the second interlayer insulating layer 162, the first organic layer 181, the second organic layer 182, and the third organic layer 183, which are organic insulating layers, are sequentially stacked each other. An additional opening OPEA1 of the pixel definition layer 380 is positioned on the third organic layer 183, and an additional spacer 385EA1 is positioned within the additional opening OPEA1 of the pixel definition layer 380 and on the third organic layer 183. The additional opening OPEA1 of the pixel definition layer 380 and the additional spacer 385EA1 are formed corresponding to the photosensor area OPS, and the additional spacer 385EA1 may also be positioned on the upper surface of the pixel definition layer 380. The functional layer FL may be positioned on top of the pixel definition layer 380 and the additional spacer 385EA1, and the cathode Cathode, the capping layer AL1, and the low reflection layer AL2 positioned thereon have an opening OPEA1' formed corresponding to the photosensor area OPS, and the cathode Cathode, the capping layer AL1, and the low reflection layer AL2 may not be formed in the photosensor area OPS. Therefore, the encapsulation layer 400 is positioned on the additional spacer 385EA1 and the functional layer FL and within the opening OPEA1' of the cathode Cathode, the capping layer AL1, and the low reflection layer AL2, and the functional layer FL and the encapsulation layer 400 may contact each other. The sensing insulating layers 501, 510, and 511 and the light blocking layer 220 are sequentially positioned on the encapsulation layer 400. The encapsulation layer 400 may have a triple layer structure including a first inorganic encapsulation layer, an organic encapsulation layer, and a second inorganic encapsulation layer. The sensing insulating layers 501, 510, and 511 may all be inorganic insulating layers. The light blocking layer 220 does not have an opening corresponding to the photosensor area OPS, and includes an overlapping portion 220EA1 overlapping the photosensor area OPS in a plan view. The light blocking layer 220 and the overlapping portion 220EA1 serve to block visible rays, but have a characteristic of transmitting a wavelength band corresponding to infrared light by including only an organic material without including an inorganic material such as carbon. On the overlapping portion 220EA1 of the light blocking layer 220 as the photosensor area OPS, an overlapping portion 235EA1 overlapping the photosensor area OPS of the reflection adjustment layer 235 is positioned. According to an embodiment, the overlapping portion 235EA1 may be omitted so that the reflection adjustment layer 235 may not be positioned in the photosensor area OPS.

The photosensor area OPS overlaps the overlapping portion 220EA1 of the light blocking layer 220, and the pixel definition layer 380 has the additional opening OPEA1 corresponding to the photosensor area OPS, so that the pixel definition layer 380 is not formed in the photosensor area OPS, and the photosensor area OPS further includes an additional spacer 385EA1 positioned within the additional opening OPEA1 of the pixel definition layer 380. On the other hand, the additional spacer 385EA1 may contact the third organic layer 183 and the encapsulation layer 400.

In the above-described first component area EA1 and photosensor area OPS, the metal layer BML, a first semiconductor layer ACT1, a first gate conductive layer GAT1, the second gate conductive layer GAT2, an oxide semiconductor layer ACT2, the third gate conductive layer GAT3, a first data conductive layer SD1, a second data conductive layer SD2, and the anode Anode are not positioned. The emission layer EML and the sensing electrodes 540 and 541 are also not formed. In the photosensor area OPS among the first component area EA1, the openings OPEA1 and OPEA1' are formed in the pixel definition layer 380, the cathode Cathode, the capping layer AL1, and the low reflection layer AL2, respectively, so that the pixel definition layer 380, the cathode Cathode, the capping layer AL1, and the low reflection layer AL2 are not formed.

In the above, the embodiment in which a total of three organic layers 181, 182, and 183 are formed and the anode connection opening OP4 is formed in the second organic layer 182 and the third organic layer 183 was described. However, at least two organic layers may be formed, and the anode connection opening OP4 may be positioned in an upper organic layer positioned away from the substrate 110, and the lower organic layer opening OP3 may be positioned in the lower organic layer.

Referring to FIG. 20, around the opening OPEA1' formed corresponding to the photosensor area OPS, it may be confirmed that the cathode Cathode has the structure covering the capping layer AL1 and an upper portion of the low reflection layer AL2. For example, the cathode Cathode has a structure in which it is bent above the low reflection layer AL2, and the cathode Cathode has a structure that covers a side and the upper surface of the low reflection layer AL2. The capping layer AL1 may be positioned between the cathode Cathode and the low reflection layer AL2, and thus a portion of the capping layer AL1 may also have a structure covered by the cathode Cathode covers. In such a structure, the cathode Cathode has a structure also positioned on at least a portion of the capping layer AL1 and/or the low reflection layer AL2, so that the cathode Cathode may have a structure positioned both above and below the capping layer AL1 and/or the low reflection layer AL2. Such a structure of the cathode Cathode is a structure in which the cathode Cathode wraps the bottom surface, the side surface, and the top surface by being bent up to the upper portion of the low reflection layer AL2 as the cathode Cathode remains relatively long, in case that the opening OPEA1' is formed in the cathode Cathode, the capping layer AL1, and the low reflection layer AL2 through rear surface exposure using a laser.

Figure 21:
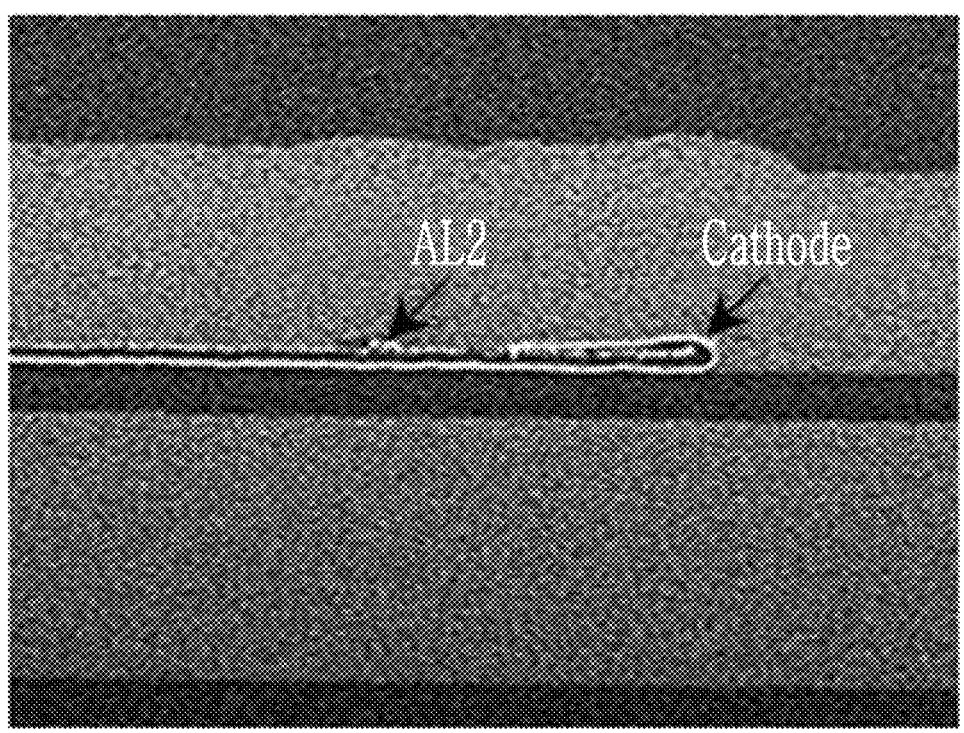
FIG. 21 is a schematic enlarged view of a part of a light emitting display device according to another embodiment.

A photograph of this structure is shown in FIG. 21.

FIG. 21 is a schematic enlarged view of a part of a light emitting display device according to another embodiment.

The photograph of FIG. 21 was taken after etching a part of the cathode Cathode by being exposed with a laser through the rear surface exposure, and it may be seen that as the cathode Cathode remains relatively long, it has the structure surrounding the bottom surface, the side surface, and the upper surface while being bent up to the upper portion of the low reflection layer AL2.

Referring to FIG. 21, it may be clearly confirmed that the cathode Cathode has a structure that bends to the upper portion of the low reflection layer AL2 during etching by the rear surface exposure with a laser, and since the capping layer AL1 may be positioned between the cathode Cathode and the low reflection layer AL2, as shown in FIG. 20, a portion of the capping layer AL1 may also have a structure surrounded by the cathode Cathode.

In the above, the structure of the light emitting display device and the pixel according to an embodiment has been described in detail. Hereinafter, the structure of the photosensor area OPS of FIG. 20 is described in more detail with reference to FIGS. 22 and 23.

Figure 22:
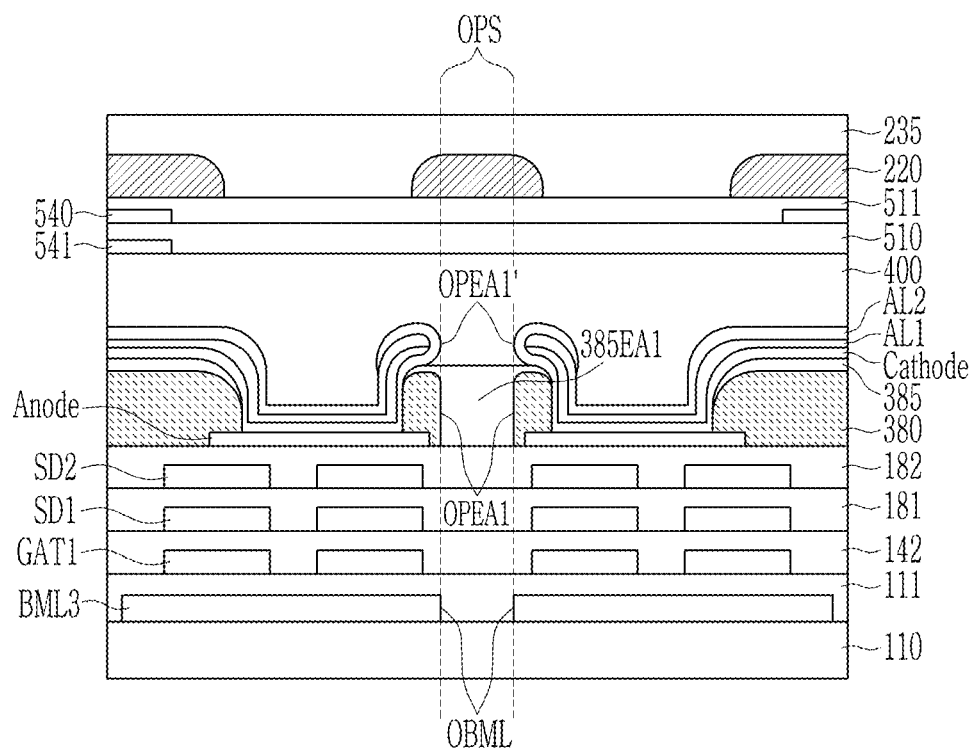
FIG. 22 is a schematic cross-sectional view briefly showing a photosensor area among a light emitting display device according to an embodiment of FIG. 20.
Figure 23:
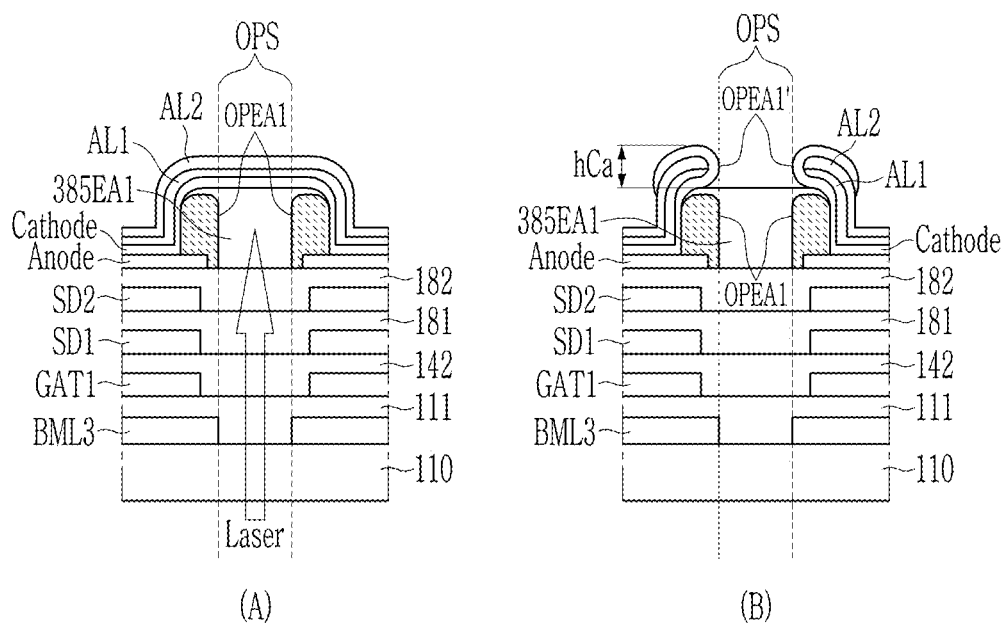
FIG. 23 is a schematic view showing a method for manufacturing a part of a photosensor area according to an embodiment of FIG. 22.

FIG. 22 is a schematic cross-sectional view briefly illustrating a photosensor area OPS among a light emitting display device according to an embodiment of FIG. 20, and FIG. 23 is a schematic view illustrating a method for manufacturing a portion of a photosensor area OPS according to an embodiment of FIG. 22.

FIG. 22, briefly illustrates the cross-sectional structure of the photosensor area OPS of FIG. 20. For example, FIG. 22 briefly illustrates the structure of the lower portion of the anode Anode, and clearly illustrates that only the opening OBML of the island-shaped metal layer BML3 among the metal layers BMLs corresponds to the photosensor area OPS. FIG. 22 does not illustrate the first sensing insulating layer 501, which is one of the functional layers FL and the sensing insulating layers 501, 510, and 511 positioned under the cathode Cathode.

Referring to FIG. 22, the opening corresponding to the photosensor area OPS includes the opening OBML of the island-shaped metal layer BML3, the additional opening OPEA1 of the pixel definition layer 380, the opening OPEA1' of the cathode Cathode, the capping layer AL1, and the low reflection layer AL2, so that the metal layer BML, the pixel definition layer 380, the cathode Cathode, the capping layer AL1, and the low reflection layer AL2 are not positioned in the photosensor area OPS.

With reference to FIG. 22, in the photosensor area OPS, the substrate 110, the buffer layer 111, the second gate insulating layer 142, the first organic layer 181, the second organic layer 182, the additional spacer 385EA1, the encapsulation layer 400, the sensing insulating layers 510 and 511, the overlapping portion 220EA1 of the light blocking layer 220, and the overlapping portion 235EA1 of the reflection adjustment layer 235 are sequentially positioned.

Although not shown in FIG. 22, the photosensor area OPS, as shown in FIG. 20, may include the first gate insulating layer 141, the first interlayer insulating layer 161, the third gate insulating layer 143, the second interlayer insulating layer 162, the third organic layer 183, the functional layer FL, and the first sensing insulating layer 501.

In the photosensor area OPS of FIG. 22, the pixel definition layer 380 formed of the organic material of the black color is not positioned and the additional spacer 385EA1 is positioned, and the additional spacer 385EA1 and the spacer 385 are formed of a same transparent organic insulating material. Therefore, the photosensor area OPS of FIG. 22 has a transparent characteristic except for the light blocking layer 220. The light blocking layer 220 does not include the inorganic materials such as carbon and includes only the organic materials, so there is no problem in transmitting infrared rays. As a result, there is no problem in the operation of the infrared sensor ES1 located on the rear surface of the photosensor area OPS.

In FIG. 22, as shown in FIG. 20 and FIG. 21, the cathode Cathode has a structure covering ends of the capping layer AL1 and the low reflection layer AL2. The encapsulation layer 400 is formed while covering the structure in which the cathode Cathode surrounds the ends of the capping layer AL1 and the low reflection layer AL2. The cathode Cathode is not formed in the photosensor area OPS.

Hereinafter, a method of forming an opening corresponding to the photosensor area OPS according to an embodiment is described with reference to FIG. 23.

FIG. 23 illustrates the method of forming the opening OPEA1' in the cathode Cathode, the capping layer AL1, and the low reflection layer AL2 by the exposure with the laser through rear surface exposure, FIG. 23 briefly illustrates the method in which the laser-exposed portion is removed by a lift-off method, and the cathode Cathode is formed in a structure that covers ends of the capping layer AL1 and the low reflection layer AL2 during the rear surface exposure using a laser.

First, referring to FIG. 23 (A), after the opening OBML of the island-shaped metal layer BML3 corresponding to the photosensor area OPS is formed, layers are stacked each other, after the additional opening OPEA1 of the pixel definition layer 380 is formed, the additional spacer 385EA1 is formed within the additional opening OPEA1, and the cathode Cathode, the capping layer AL1, and the low reflection layer AL2 are sequentially stacked each other.

After that, the laser is emitted through the opening OBML of the island-shaped metal layer BML3 at the rear surface.

The cathode Cathode irradiated with the laser reacts to cause a lift-off phenomenon in which the irradiated cathode Cathode and the surrounding layers (the capping layer AL1 and the low reflection layer AL2) are peeled off (see FIG. 23 (B)). As the cathode Cathode remains relatively long, the cathode Cathode is bent up to the upper portion of the low reflection layer AL2. As a result, as shown in FIG. 23 (B), the cathode Cathode is positioned up to the upper portion of the capping layer AL1 and the low reflection layer AL2 to have a structure surrounding the bottom surface, the side surface, and the upper surface of the capping layer AL1 and the low reflection layer AL2. The cathode Cathode shown in FIG. 23 (B) is enlarged in the thickness and the width to be shown more clearly, and the cathode Cathode positioned on the capping layer AL1 and the low reflection layer AL2 may cover only a narrower region compared to that of FIG. 23 (B). FIG. 23 (B) illustrates that a greater thickness hCa from the bottom surface of the cathode Cathode to the upper surface of the cathode Cathode covering the capping layer AL1 and the upper surface of the low reflection layer AL2, the thickness hCa may be about 0.3 μm, and may have a value of greater than about 0.1 μm and less than about 0.5 μm according to an embodiment. The thickness hCa of the cathode Cathode is a value corresponding to the diameter of the portion where the cathode Cathode surrounds the side surfaces of the capping layer AL1 and the low reflection layer AL2, the diameter of the portion in which the cathode Cathode is folded upward may have a value of more than about 0.1 μm and less than about 0.5 μm, and may be about 0.3 μm according to an embodiment.

Even if the cathode Cathode has a structure surrounding ends of the capping layer AL1 and the low reflection layer AL2 as described above, as in FIG. 23 (B), the opening OPEA1' is formed in the cathode Cathode, the capping layer AL1, and the low reflection layer AL2. The opening OBML of the island-shaped metal layer BML3 may overlap the opening OPEA1' in the cathode Cathode, the capping layer AL1 and the low reflection layer AL2. The lift-off method using a laser that is described above does not require a separate mask and does not require a separate process such as development, so it has the merit of readily forming the opening OPEA1'.

In case that the additional opening OPEA1 of the pixel definition layer 380 is formed, it may be formed through the rear surface exposure. The pixel definition layer 380 may not be formed by the lift-off method, and may be formed through a general exposure and development method, and the pixel definition layer 380 may include a photosensitive material. For example, the pixel definition layer 380 including the photosensitive material is exposed on the rear surface by using the island-shaped metal layer BML3 as a mask, and the exposed pixel definition layer 380 may be developed and removed. The light used in case that the pixel definition layer 380 is exposed may not be a laser.

Hereinafter, the relationship between the infrared sensor and the display panel is briefly reviewed with reference to FIG. 24.

Figure 24:
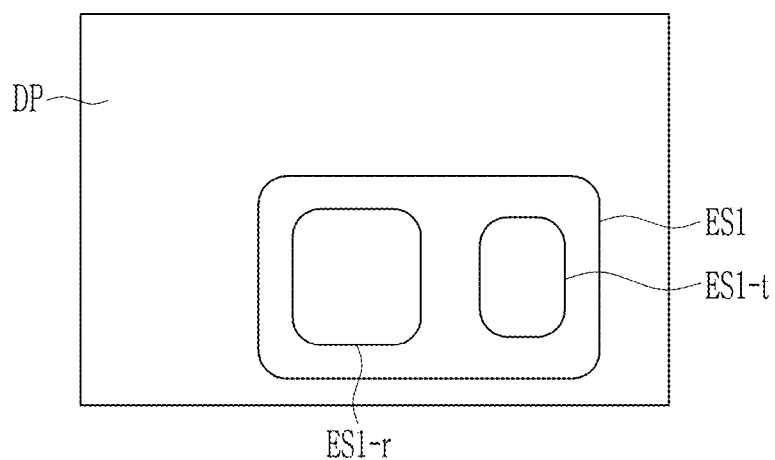
FIG. 24 is a schematic plan view of an infrared sensor according to an embodiment.

FIG. 24 is a schematic top plan view of an infrared sensor according to an embodiment.

FIG. 24 illustrates the infrared sensor ES1 attached to the rear surface of the display panel DP among the light emitting display device.

Referring to FIG. 24, the infrared sensor ES1 includes a transmitter ES1-$t$ that emits infrared rays, and a receiver ES1-$r$ that monitors the front surface of the photosensor area OPS and receives the reflected infrared rays. In order to improve the sensing ability of the infrared sensor ES1, the area of the receiver ES1-$r$ may be larger than that of the transmitter ES1-$t$.

The first component area EA1 of the light emitting display device may correspond to the infrared sensor ES1 in a plan view, and the receiver ES1-$r$ and the transmitter ES1-$t$ of the infrared sensor ES1 may overlap, in a plan view, at least one photosensor area OPS, respectively.

In order to further improve the sensing ability of the infrared sensor ES1, the transmittance of the photosensor area OPS needs to be improved for infrared light of, for example, an about 940 nm wavelength.

Referring to the embodiment of FIGS. 20 and 22, the photosensor area OPS includes only the transparent inorganic insulating layer and the organic insulator except for the light blocking layer 220, and does not include a semiconductor layer or a conductive layer. The pixel definition layer 380 is formed of an organic material that does not include black carbon, thereby blocking visible rays, and however in the photosensor area OPS of FIGS. 20 and 22, the additional opening OPEA1 is formed and is not covered by the pixel definition layer 380, and the additional spacer 385EA1 positioned in the additional opening OPEA1 and the spacer 385 are formed of a same transparent organic insulating material, and thus the additional spacer 385EA1 may have the transparent characteristic. Therefore, the photosensor area OPS is optically transparent except for the light blocking layer 220, so there is no problem in transmitting infrared rays.

On the other hand, the light blocking layer 220 has a black color and blocks visible rays, but there is no problem in transmitting infrared rays by including only the organic material without including the inorganic material such as carbon. As a result, there is no problem in the operation of the infrared sensor ES1 positioned on the rear surface of the photosensor area OPS.

The structure of the photosensor area OPS that may use the infrared sensor ES1 may vary, and the structure of the photosensor area OPS according to a different embodiment from FIGS. 20 and 22 is described.

In the embodiment of FIGS. 25 to 28, the photosensor area OPS overlaps the light blocking layer 220 and the pixel definition layer 380, and the cathode Cathode includes the opening OPEA1' corresponding to the photosensor area OPS, thereby including a characteristic that it is not formed in the photosensor area OPS.

First, the structure of the photosensor area OPS of the light emitting display device according to another embodiment is described with reference to FIGS. 25 and 26.

Figure 25:
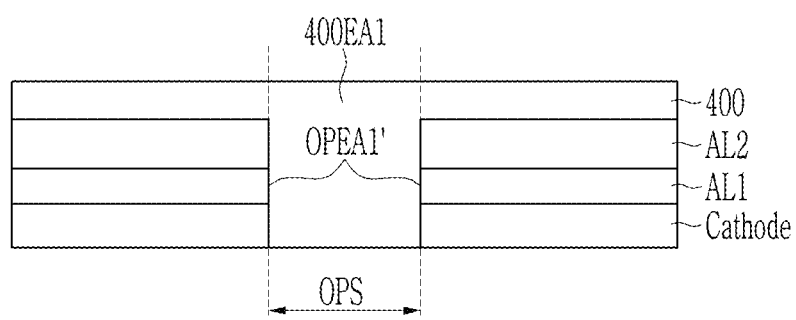
FIG. 25 and FIG. 26 are schematic cross-sectional views showing a photosensor area among a light emitting display device according to another embodiment.
Figure 26:
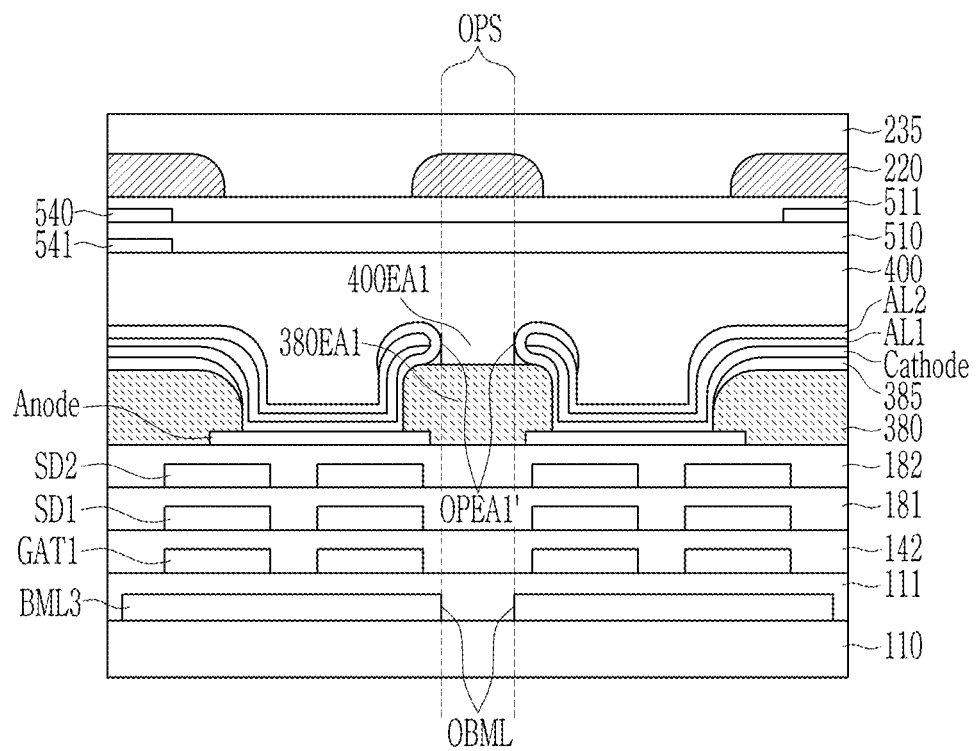

FIGS. 25 and 26 are schematic cross-sectional views of a photosensor area of a light emitting display device according to another embodiment.

FIGS. 25 and 26 are a same embodiment, where FIG. 25 is a schematic enlarged cross-sectional view of only the cathode Cathode, the capping layer AL1, the low reflection layer AL2, and the encapsulation layer 400 positioned on the low reflection layer AL2 among the photosensor area OPS, which are characteristics, and FIG. 26 is a further detailed schematic cross-sectional view of FIG. 25 as the structure corresponding to FIG. 25.

First, referring to FIG. 25, the opening OPEA1' corresponding to the photosensor area OPS is formed in the cathode Cathode, the capping layer AL1, and the low reflection layer AL2, and an overlapping portion 400EA1 of the encapsulation layer 400 is filled in the opening OPEA1' of the cathode Cathode, the capping layer AL1, and the low reflection layer AL2. The overlapping portion 400EA1 of the encapsulation layer 400 is a portion overlapping the photosensor area OPS. In case that the encapsulation layer 400 has a triple-layer structure including a first inorganic encapsulation layer, an organic encapsulation layer, and a second inorganic encapsulation layer, only the first inorganic encapsulation layer positioned at the bottom of the encapsulation layer 400 may be positioned in the opening OPEA1' of the cathode Cathode, the capping layer AL1, and the low reflection layer AL2.

Referring to FIG. 26, unlike FIG. 22, the pixel definition layer 380 does not include the additional opening OPEA1 corresponding to the photosensor area OPS, and as a result, the pixel definition layer 380 overlaps the photosensor area OPS. In the photosensor area OPS of FIG. 26, the additional spacer 385EA1 is not formed. The overlapping portion 400EA1 of the encapsulation layer 400 may contact the pixel definition layer 380 through the opening OPEA1'.

Referring to FIG. 26, the cathode Cathode is etched by the rear surface exposure using a laser, so that the cathode Cathode has a structure that covers ends of the capping layer AL1 and the low reflection layer AL2, and the encapsulation layer 400 is positioned thereon.

The photosensor area OPS of FIGS. 25 and 26 also overlaps the pixel definition layer 380 in addition to the light blocking layer 220, so that the visible rays are not transmitted. However, the pixel definition layer 380 is formed of an organic material, and the light blocking layer 220 does not include an inorganic material such as carbon and includes only an organic material, so there is no problem in transmitting infrared rays. As a result, there is no problem in the operation of the infrared sensor ES1 positioned on the rear surface of the photosensor area OPS. On the other hand, according to an embodiment, the pixel definition layer 380 may also be formed using only an organic material to further improve the transmittance of infrared rays.

On the other hand, although not shown in FIGS. 25 and 26, the functional layer FL positioned under the cathode Cathode may be positioned, the functional layer FL also has the opening OPEA1', and the encapsulation layer 400 may be positioned in the opening OPEA1'.

Hereinafter, the structure of the photosensor area OPS of the light emitting display device according to another embodiment is described with reference to FIGS. 27 and 28.

Figure 27:
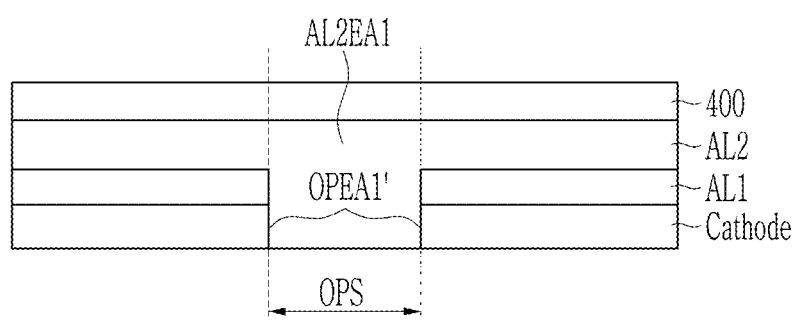
FIG. 27 and FIG. 28 are schematic cross-sectional views showing a photosensor area among a light emitting display device according to another embodiment.
Figure 28:
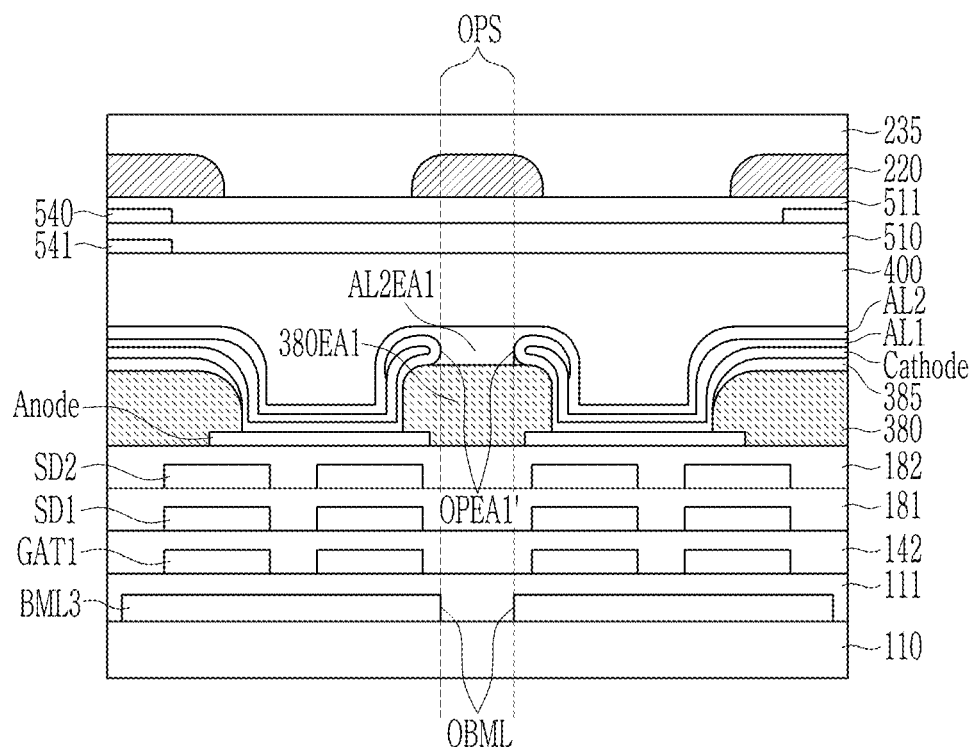

FIGS. 27 and 28 are schematic cross-sectional views illustrating a photosensor area OPS among a light emitting display device according to another embodiment.

FIGS. 27 and 28 are a same embodiment, where FIG. 27 is a schematic enlarged cross-sectional view of only the cathode Cathode, the capping layer AL1, the low reflection layer AL2, and the encapsulation layer 400 positioned on the low reflection layer AL2 of the photosensor area OPS, which are characteristics, and FIG. 28 is a schematic cross-sectional view including the pixel definition layer 380 corresponding to FIG. 26 and illustrating FIG. 27 in further detail.

First, referring to FIG. 27, the cathode Cathode and the capping layer AL1 include the opening OPEA1' corresponding to the photosensor area OPS, the opening OPEA1' of the cathode Cathode and the capping layer AL1 is filled with an overlapping portion AL2EA1 of the low reflection layer AL2, and the encapsulation layer 400 may have the structure that does not fill the opening OPEA1'.

Referring to FIG. 28, unlike FIG. 22, the pixel definition layer 380 does not include the additional opening OPEA1 corresponding to the photosensor area OPS, and as a result, the pixel definition layer 380 overlaps the photosensor area OPS. In the photosensor area OPS of FIG. 28, the additional spacer 385EA1 is not formed. The low reflection layer AL2 may contact an overlapping pixel definition layer 380 through the opening OPEA1'.

In FIG. 28, the cathode Cathode has the structure surrounding only the capping layer AL1, the low reflection layer AL2 is positioned thereon, and the encapsulation layer 400 is positioned thereon. The low reflection layer AL2 covering the cathode Cathode of the surrounding structure may have a structure having a step difference, unlike that shown in FIG. 27.

The photosensor area OPS of FIGS. 27 and 28 overlaps the pixel definition layer 380 in addition to the light blocking layer 220, so that the visible rays are not transmitted. However, the pixel definition layer 380 is formed of an organic material, and the light blocking layer 220 does not include an inorganic material such as carbon and includes only an organic material, so there is no problem in transmitting infrared rays. As a result, there is no problem in the operation of the infrared sensor ES1 positioned on the rear surface of the photosensor area OPS. On the other hand, according to the embodiment, the pixel definition layer 380 may also be formed using only an organic material to further improve the transmittance of infrared rays.

The low reflection layer AL2 overlapping the photosensor area OPS may block visible rays by including bismuth (Bi), but there is no problem in transmitting infrared rays. In this regard, the transmittance of the photosensor area OPS required by the infrared sensor is not as high as about 0.5% or more to 4% or less with respect to the wavelength of 940 nm, so the infrared sensor may operate through the photosensor area OPS even if the low reflection layer AL2 is positioned. Regarding this, referring to FIG. 31, it may be seen that the photosensor area OPS may have sufficient infrared transmittance as follows. For example, in Table 1 and FIG. 31 described later, in case that the photosensor area OPS overlaps all of the cathode Cathode, the capping layer AL1, and the low reflection layer AL2, since it may be seen that the transmittance of infrared rays has the transmittance exceeding about 10%, FIGS. 27 and 28 which are the embodiments in which the low reflection layer AL2 only overlaps the photosensor area OPS have the relatively high transmittance due to the smaller interlayer interface than that in Table 1 and FIG. 31, so it may be confirmed that the photosensor area OPS of FIGS. 27 and 28 may have the sufficient infrared transmittance.

On the other hand, although not shown in FIGS. 27 and 28, the functional layer FL may be positioned under the cathode Cathode, the functional layer FL also has the opening OPEA1', and the encapsulation layer 400 may be positioned in the opening OPEA1'.

On the other hand, hereinafter, the structure of the photosensor area OPS of the light emitting display device according to another embodiment is described with reference to FIGS. 29 and 30.

Figure 29:
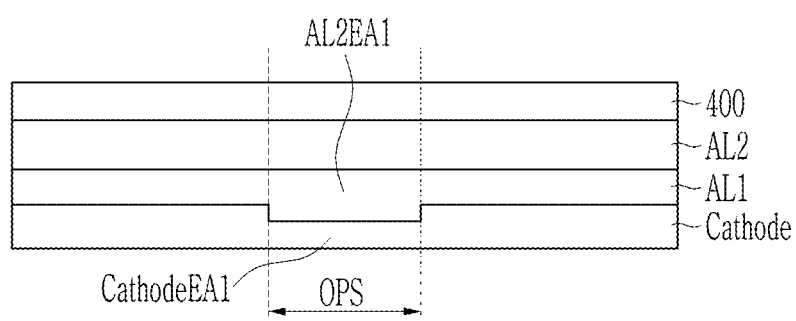
FIG. 29 and FIG. 30 are schematic cross-sectional views showing a photosensor area among a light emitting display device according to another embodiment.
Figure 30:
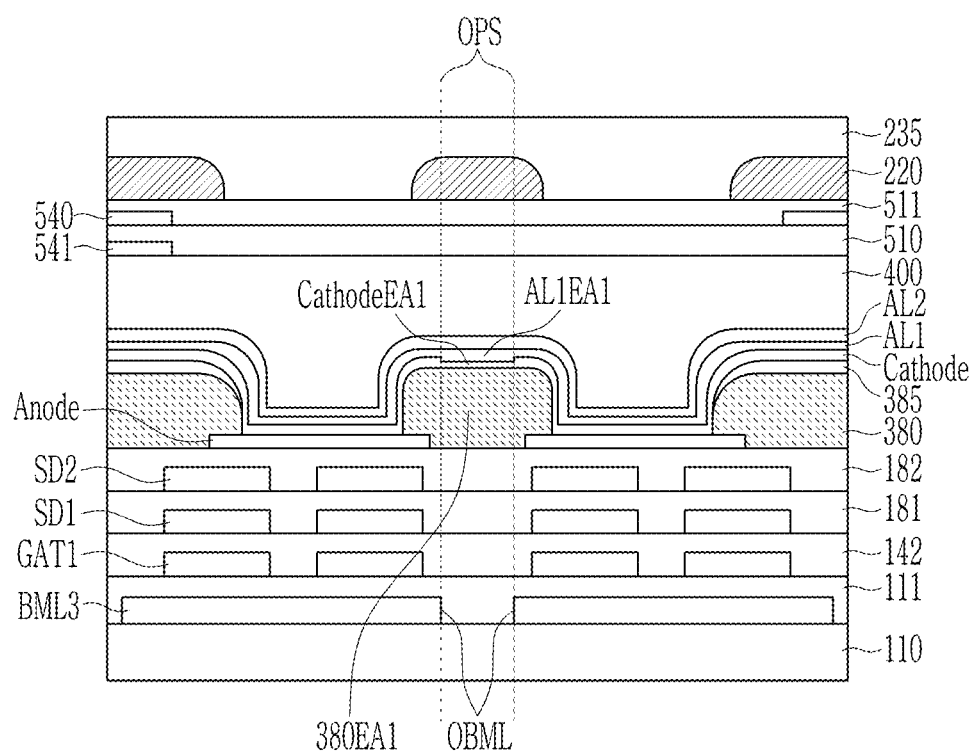

In the embodiment of FIGS. 29 and 30, since the cathode Cathode is not removed with a laser, it does not have a structure surrounding the cathode Cathode, and it is an embodiment that improves the optical efficiency by removing only a part of the thickness of the cathode Cathode.

In the embodiment of FIGS. 29 and 30, the photosensor area OPS overlaps the light blocking layer 220, the low reflection layer AL2, the capping layer AL1, and the cathode Cathode, and the portion overlapping the photosensor area OPS of the cathode Cathode may be formed thinner than the cathode Cathode of the display area DA. The portion overlapping the photosensor area OPS of the capping layer AL1 may be formed thicker than the capping layer AL1 of the display area DA, and the thin thickness in the cathode Cathode and the thick thickness in the capping layer AL1 may have a same value.

FIGS. 29 and 30 are schematic cross-sectional views illustrating a photosensor area OPS among a light emitting display device according to another embodiment.

FIGS. 29 and 30 are a same embodiment, where FIG. 29 is a schematic enlarged cross-sectional view illustrating only the encapsulation layer 400 positioned on the cathode Cathode, the capping layer AL1, the low reflection layer AL2, and the low reflection layer AL2, which are the characteristics of the photosensor area OPS, and FIG. 30 is a schematic cross-sectional view showing the pixel definition layer 380 corresponding to FIG. 26 and illustrating FIG. 29 in more detail.

Figure 33:
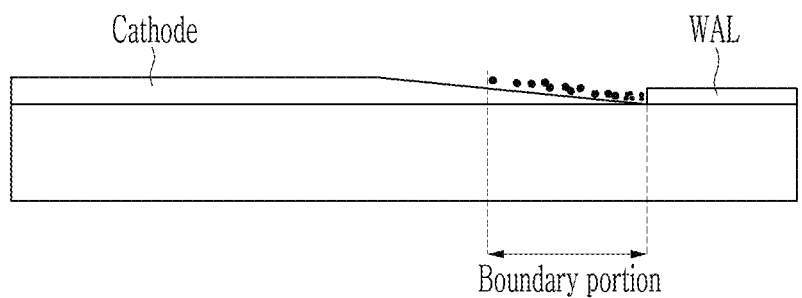
FIG. 33 is a schematic cross-sectional view schematically showing a relationship between a cathode and a low adhesive layer.

First, referring to FIG. 29, the cathode Cathode, the capping layer AL1, and the low reflection layer AL2 do not all have an opening and thus have a structure overlapping the photosensor area OPS. The portion corresponding to the photosensor area OPS has an overlapping portion CathodeEA1 in which the cathode Cathode is thinly formed, and the capping layer AL1 has an overlapping portion AL1EA1 that is formed thicker as the overlapping portion CathodeEA1 of the cathode Cathode is formed thinly. The low reflection layer AL2 may be formed with a constant thickness. The method for thinly forming the overlapping portion CathodeEA1 of the cathode Cathode may be various, and as shown in FIG. 33, it is possible to reduce the thickness of the overlapping portion CathodeEA1 of the cathode Cathode by using a low adhesive layer WAL. For example, referring to FIG. 33, since the cathode Cathode adjacent to the low adhesive layer WAL is deposited relatively thinly, the low adhesive layer WAL is formed around the overlapping portion CathodeEA1 of the cathode Cathode so that the overlapping portion CathodeEA1 of the cathode Cathode may be relatively thinly formed.

Referring to FIG. 30, unlike FIG. 22, the pixel definition layer 380 does not include the additional opening OPEA1 corresponding to the photosensor area OPS, and as a result, the pixel definition layer 380 overlaps the photosensor area OPS. In the photosensor area OPS of FIG. 30, the additional spacer 385EA1 is not formed.

On the other hand, although not shown in FIGS. 29 and 30, the functional layer FL positioned under the cathode Cathode may be formed, and the functional layer FL may overlap the photosensor area OPS without having an opening.

The photosensor area OPS of FIGS. 29 and 30 overlaps the pixel definition layer 380 in addition to the light blocking layer 220, so that the visible rays are not transmitted. However, the pixel definition layer 380 is formed of an organic material, and the light blocking layer 220 does not include an inorganic material such as carbon and includes only an organic material, so there is no problem in transmitting infrared rays. As a result, there is no problem in the operation of the infrared sensor ES1 positioned on the rear surface of the photosensor area OPS. On the other hand, according to the embodiment, the pixel definition layer 380 may also be formed using only an organic material to further improve the transmittance of infrared rays.

The low reflection layer AL2 overlapping the photosensor area OPS may block visible rays by including bismuth (Bi), but there is no problem in transmitting infrared rays. The cathode Cathode and the capping layer AL1 also overlap the photosensor area OPS, and however the cathode Cathode is formed of a conductive material including silver (Ag) and magnesium (Mg) so that a portion of light may be reflected. The transmittance of the photosensor area OPS required by the infrared sensor is not as high as about 0.5% or more to about 4% or less with respect to the wavelength of about 940 nm, so the infrared sensor may operate through the photosensor area OPS even if the cathode Cathode is positioned. This is described in more detail through FIG. 31.

On the other hand, the capping layer AL1 is formed of an organic capping layer, an inorganic capping layer including an inorganic material, or a composite capping layer including an organic material and an inorganic material, so there is no problem in transmitting infrared rays because it is optically transparent.

Figure 31:
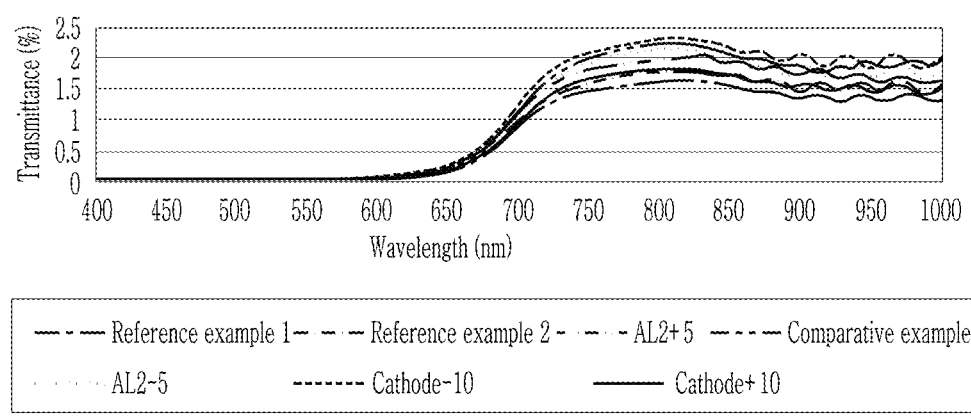
FIG. 31 is a schematic graph showing transmittance according to a thickness of a cathode.

However, in FIGS. 29 and 30, the thickness of the capping layer AL1 in the photosensor area OPS is increased and the thickness of the cathode Cathode is reduced to improve the infrared transmittance, and this is described in more detail through FIG. 31.

FIG. 31 is a schematic graph illustrating transmittance depending on a thickness of a cathode.

FIG. 31 is the schematic graph illustrating the transmittance depending on the wavelength for various examples and corresponds to Table 1 below.

TABLE 1

|  | Reference Example 1 | Reference Example 2 | AL2 + 5 | Comparative example | AL2 − 5 | Cathode − 10 | Cathode + 10 |
| --- | --- | --- | --- | --- | --- | --- | --- |
| Cathode thickness | 115 | 115 | 115 | 115 | 115 | 105 | 125 |
| AL1 thickness | 250 | 250 | 250 | 250 | 250 | 250 | 250 |
| AL2 thickness | 90 | 90 | 100 | 90 | 85 | 90 | 90 |
| OPS transmittance | 12.47 | 14.58 | 15.53 | 16.26 | 17.84 | 17.45 | 15.33 |

In Table 1 above, a unit of the thickness is Å, a unit of the transmittance is %, and the transmittance represents transmittance in the photosensor area OPS for a about 940 nm wavelength light (ultraviolet rays). In Table 1, Cathode represents the cathode Cathode, AL1 represents the capping layer AL1, and AL2 represents the low reflection layer AL2. In Table 1 and FIG. 31, Reference Examples 1 and 2 were described as reference examples by forming the capping layer AL1 with different examples and different materials, and the other five examples were all formed of a same material and the transmittance was measured while differentiating only the thickness of each layer.

In Table 1 and FIG. 31, based on a comparative example, example of increasing the thickness of the low reflection layer AL2 by 5 Å (AL2+5), an example of decreasing the thickness of the low reflection layer AL2 by 5 Å (AL2−5), an example of increasing the thickness of the cathode Cathode by 10 Å (Cathode+10), and an example of decreasing the thickness of the cathode Cathode by 10 Å (Cathode−10) were formed and simulated.

Referring to Table 1 and FIG. 31, as a result, since the example with the highest transmittance in the photosensor area OPS is the example in which the thickness of the low reflection layer AL2 is reduced by 5 Å (AL2−5) and the example in which the thickness of the cathode Cathode is reduced by 10 Å (Cathode−10), as shown in FIGS. 29 and 30, it may be confirmed that the transmittance of infrared rays may be further improved by reducing the thickness of the cathode Cathode.

Compared with the comparative example, the example in which the thickness of the low reflection layer AL2 was reduced by 5 Å (AL2−5) and the example in which the thickness of the cathode Cathode was reduced by 10 Å (Cathode−10) each have transmittance of at least about 1% or higher, and it may be confirmed that higher infrared transmittance is obtained by merging these two embodiments. Considering that the transmittance of the photosensor area OPS required by the infrared sensor is about 0.5% or more to 4% or less with respect to the wavelength of about 940 nm, it has very high infrared transmittance compared to the comparative example, so the infrared sensor may have an improved sensing ability.

Referring to Table 1 and FIG. 31, it can be confirmed that as the thickness of the cathode Cathode is decreased, the infrared transmittance may be improved. Hereinafter, an embodiment of removing the cathode Cathode by using the low adhesive layer WAL is described with reference to FIGS. 32 to 36.

Figure 32:
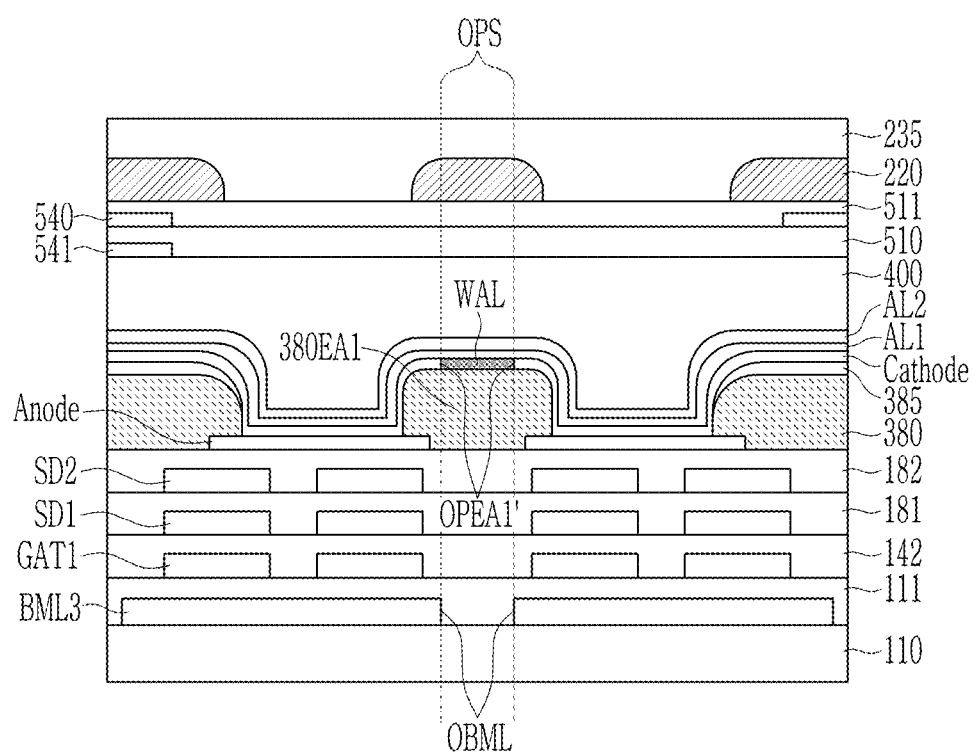
FIG. 32 is a schematic cross-sectional view briefly showing a photosensor area among a light emitting display device according to another embodiment.

First, the structure of FIG. 32 is described.

FIG. 32 is a cross-sectional view schematically illustrating a photosensor area OPS of a light emitting display device according to another embodiment.

FIG. 32 includes the pixel definition layer 380 corresponding to FIG. 26, the photosensor area OPS overlaps the capping layer AL1 and the low reflection layer AL2 in a plan view, and the low adhesive layer WAL is formed instead of the cathode Cathode under the capping layer AL1 in the photosensor area OPS.

The low adhesive layer WAL serves to prevent the cathode Cathode from being deposited, and may be positioned on the pixel definition layer 380 in the photosensor area OPS.

Referring to FIG. 32, the capping layer AL1 and the low reflection layer AL2 do not have an opening, so they have a structure overlapping the photosensor area OPS. On the other hand, the cathode Cathode has the opening OPEA1' overlapping the photosensor area OPS, the low adhesive layer WAL is positioned in the opening OPEA1', and thus the low adhesive layer WAL overlaps the photosensor area OPS.

Referring to FIG. 32, as shown in FIG. 26, the pixel definition layer 380 overlaps the photosensor area OPS.

On the other hand, although not shown in FIG. 32, the functional layer FL is disposed under the cathode Cathode, and the functional layer FL also does not have the opening and may overlap the photosensor area OPS. In case that the functional layer FL is present, the low adhesive layer WAL may contact the functional layer FL.

The photosensor area OPS of FIG. 32 also overlaps the pixel definition layer 380 in addition to the light blocking layer 220, so the visible rays are not transmitted. However, the pixel definition layer 380 is formed of an organic material, and the light blocking layer 220 does not include an inorganic material such as carbon and includes only an organic material, so there is no problem in transmitting infrared rays. As a result, there is no problem in the operation of the infrared sensor ES1 positioned on the rear surface of the photosensor area OPS. On the other hand, according to the embodiment, the pixel definition layer 380 may also be formed using only an organic material to further improve the transmittance of infrared rays.

The low reflection layer AL2 overlapping the photosensor area OPS may block visible rays by including bismuth (Bi), but there is no problem in transmitting infrared rays. The cathode Cathode and the capping layer AL1 also overlap the photosensor area OPS, and however the cathode Cathode is formed of a conductive material including silver (Ag) and magnesium (Mg) so that a portion of light may be reflected, the transmittance of the photosensor area OPS required by the infrared sensor is not as high as about 0.5% or more to 4% or less with respect to the wavelength of about 940 nm, so the infrared sensor may operate through the photosensor area OPS even if the cathode Cathode is positioned. This point is clear referring to the simulation result of FIG. 31.

On the other hand, the capping layer AL1 is formed of an organic capping layer, an inorganic capping layer including an inorganic material, or a composite capping layer including an organic material and an inorganic material, so there is no problem in transmitting infrared rays because it is optically transparent.

The low adhesive layer WAL is a material with weak adhesive strength, and according to an embodiment, the cathode Cathode is not disposed on the upper surface of the low adhesive layer WAL. For example, the low adhesive layer WAL may be formed by using a material such as 8-quinolinato lithium (Liq), N,N-diphenyl-N,N-bis(9-phenyl-9H-carbazole-3-yl)biphenyl-4,4'-diamine (HT01), N(diphenyl-4-yl)9,9-dimethyl-N-(4(9-phenyl-9H-carbazole-3-yl)phenyl)-9H-fluorene-2-amine (HT211), 2-(4-(9,10-di(naphthalene-2-yl)anthracene-2-yl)phenyl)-1-phenyl-1H-benzo-[D]imidazole (LG201), etc. The low adhesive layer WAL may be formed of the above organic materials, so it may have an optically transparent characteristic, as a result there is no problem in transmitting the infrared rays.

Hereinafter, the structure in which the cathode Cathode is removed through the low adhesive layer WAL is examined in more detail with reference to FIG. 33.

FIG. 33 is a cross-sectional view schematically illustrating a relationship between a cathode Cathode and a low adhesive layer WAL.

On the region where the low adhesive layer WAL is formed, the cathode Cathode is not deposited due to the low adhesive layer WAL. The cathode Cathode is formed only in the region where the low adhesive layer WAL is not positioned, but the cathode Cathode is thinly formed in the portion adjacent to the region where the low adhesive layer WAL is formed (hereinafter, referred to as a boundary portion). This may be because in case that the cathode Cathode is deposited, the material of the low adhesive layer WAL is partially diffused to the adjacent boundary portion, and the cathode Cathode is not formed to a normal thickness at the boundary portion. The cathode Cathode formed at the boundary portion may have a tapered structure in which the thickness is gradually decreased toward the low adhesive layer WAL. At the boundary portion, the material of the low adhesive layer WAL diffused on the deposited thin cathode Cathode may be positioned. In an embodiment, the width of the boundary portion may be about 1.5 μm.

Referring to FIG. 33, it may be seen that the cathode Cathode adjacent to the low adhesive layer WAL is formed to be relatively thin, and by using this, as shown in FIGS. 29 and 30, the overlapping portion CathodeEA1 of the cathode Cathode may be thinly formed. For example, since the cathode Cathode adjacent to the low adhesive layer WAL is deposited relatively thinly, by forming the low adhesive layer WAL around the overlapping portion CathodeEA1 of the cathode Cathode, the overlapping portion CathodeEA1 of the cathode Cathode may be formed relatively thinly.

Hereinafter, the structure of FIG. 32 is described in more detail with reference to FIG. 34.

Figure 34:
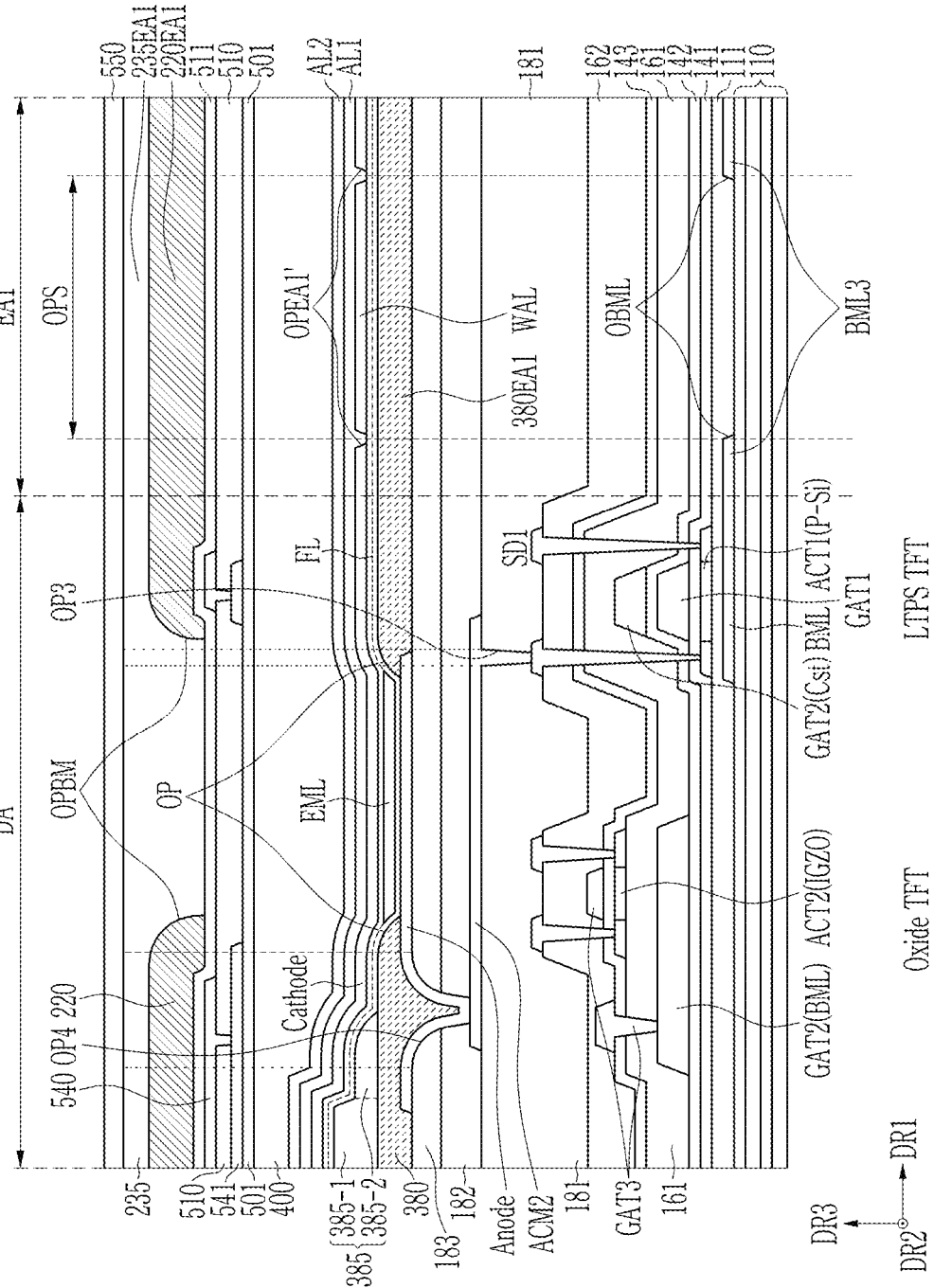
FIG. 34 is a schematic detailed cross-sectional view of a light emitting display device according to an embodiment FIG. 32.

FIG. 34 is a detailed schematic cross-sectional view of a light emitting display device according to an embodiment of FIG. 32.

FIG. 34 is the detailed schematic cross-sectional view corresponding to FIG. 20, and the stacked structure of the photosensor area OPS is described as follows in the structure having the low adhesive layer WAL as in the embodiment of FIG. 32.

The opening OBML of the island-shaped metal layer BML3 is positioned on the substrate 110, the buffer layer 111 of the inorganic insulating layer is positioned in the opening OBML of the island-shaped metal layer BML3, and the first gate insulating layer 141 and the second gate insulating layer 142, which are the inorganic insulating layers, are sequentially positioned. On the second gate insulating layer 142, the first interlayer insulating layer 161, the third gate insulating layer 143, and the second interlayer insulating layer 162, which are inorganic insulating layers, are sequentially stacked each other. On the second interlayer insulating layer 162, the first organic layer 181, the second organic layer 182, and the third organic layer 183, which are the organic insulators, are sequentially stacked each other. On the third organic layer 183, the overlapping portion 380EA1 of the pixel definition layer 380 corresponding to the photosensor area OPS is positioned.

The functional layer FL is positioned on the pixel definition layer 380, and the low adhesive layer WAL corresponding to the photosensor area OPS is positioned on the functional layer FL. The cathode Cathode positioned on the functional layer FL has the opening OPEA1', the opening OPEA1' corresponds to the photosensor area OPS, and the low adhesive layer WAL is positioned within the opening OPEA1' of the cathode Cathode.

The capping layer AL1 and the low reflection layer AL2 are sequentially positioned on the low adhesive layer WAL, and the encapsulation layer 400, the sensing insulating layers 501, 510, and 511 and the light blocking layer 220 are sequentially positioned on the low reflection layer AL2. The encapsulation layer 400 may have a triple layer structure including a first inorganic encapsulation layer, an organic encapsulation layer, and a second inorganic encapsulation layer. The sensing insulating layers 501, 510, and 511 may all be inorganic insulating layers. The light blocking layer 220 does not have an opening corresponding to the photosensor area OPS, and includes an overlapping portion 220EA1 overlapping the photosensor area OPS in a plan view. The light blocking layer 220 and the overlapping portion 220EA1 serve to block visible rays, but have a characteristic of transmitting a wavelength band corresponding to infrared rays by including only the organic material without including the inorganic material such as carbon. The overlapping portion 235EA1 overlapping the photosensor area OPS of the reflection adjustment layer 235 is positioned on the overlapping portion 220EA1 of the light blocking layer 220 as the photosensor area OPS. According to the embodiment, the overlapping portion 235EA1 may be omitted so that the reflection adjustment layer 235 may not be positioned in the photosensor area OPS.

FIG. 34 illustrates the embodiment in which a total of three organic layers 181, 182, and 183 are formed, and the anode connection opening OP4 is formed in the second organic layer 182 and the third organic layer 183. However, at least two organic layers may be formed, and the anode connection opening OP4 may be positioned in the upper organic layer positioned away from the substrate, and the lower organic layer opening may be positioned in the lower organic layer.

On the other hand, according to an embodiment, unlike the embodiment of FIG. 34, the metal layer BML, may not include the island-shaped metal layer BML3. In this embodiment, even in the plan view of FIGS. 7 to 19, the island-shaped metal layer BML3 and the opening OBML formed in the island-shaped metal layer BML3 may not be formed.

On the other hand, as shown in FIG. 34, in the embodiment including the island-shaped metal layer BML3, it is also possible to form the low adhesive layer WAL by the rear surface exposure through the opening OBML of the island-shaped metal layer BML3.

Hereinafter, the relationship between the thickness and the transmittance of the low adhesive layer WAL is described with reference to FIG. 35.

Figure 35:
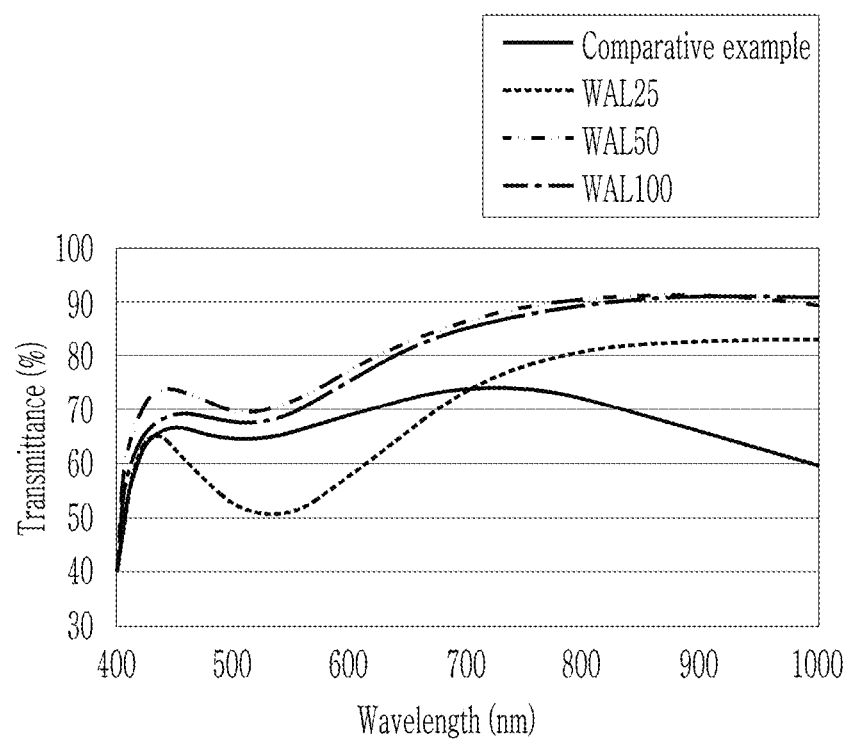
FIG. 35 is a schematic graph showing transmittance according to a thickness of a low adhesive layer.

FIG. 35 is a schematic graph illustrating transmittance depending on a thickness of a low adhesive layer.

FIG. 35 illustrates a result of a simulation of transmittance for a wavelength for a comparative example and three embodiments (WAL25, WAL50, and WAL100).

WAL25 is an embodiment in which the thickness of the low adhesive layer WAL is formed to be about 25 Å, WAL50 is an embodiment in which the thickness of the low adhesive layer WAL is formed to be about 50 Å, and WAL100 is an embodiment in which the thickness of the low adhesive layer WAL is formed to be about 100 Å. On the other hand, a comparative example is an example in which the cathode Cathode is stacked in the photosensor area OPS with a constant thickness because the low adhesive layer WAL is not included.

Referring to FIG. 35, it may be clearly confirmed that light of an about 940 nm wavelength corresponding to infrared rays in the three embodiments WAL25, WAL50, and WAL100 has a higher transmittance than the comparative example. Among the three embodiments WAL25, WAL50, and WAL100, the embodiment WAL50 and the embodiment WAL100 have higher transmittance than the embodiment WAL25, so they are more suitable. Referring to FIG. 35, the higher the thickness of the low adhesive layer WAL, the higher the infrared transmittance, and however it may be confirmed that because there is little change in transmittance in case that the low adhesive layer WAL has the thickness of about 50 Å, or the thickness of about 100 Å, if it has the thickness of about 50 Å or more, the sufficiently high infrared transmittance may be obtained. However, referring to FIG. 35, even if the thickness of the low adhesive layer WAL is about 25 Å, it has high transmittance compared to the comparative example, so the thickness of the low adhesive layer WAL may be about 25 Å or more.

Hereinafter, variant embodiments of FIGS. 32 and 34 are described with reference to FIG. 36.

Figure 36:
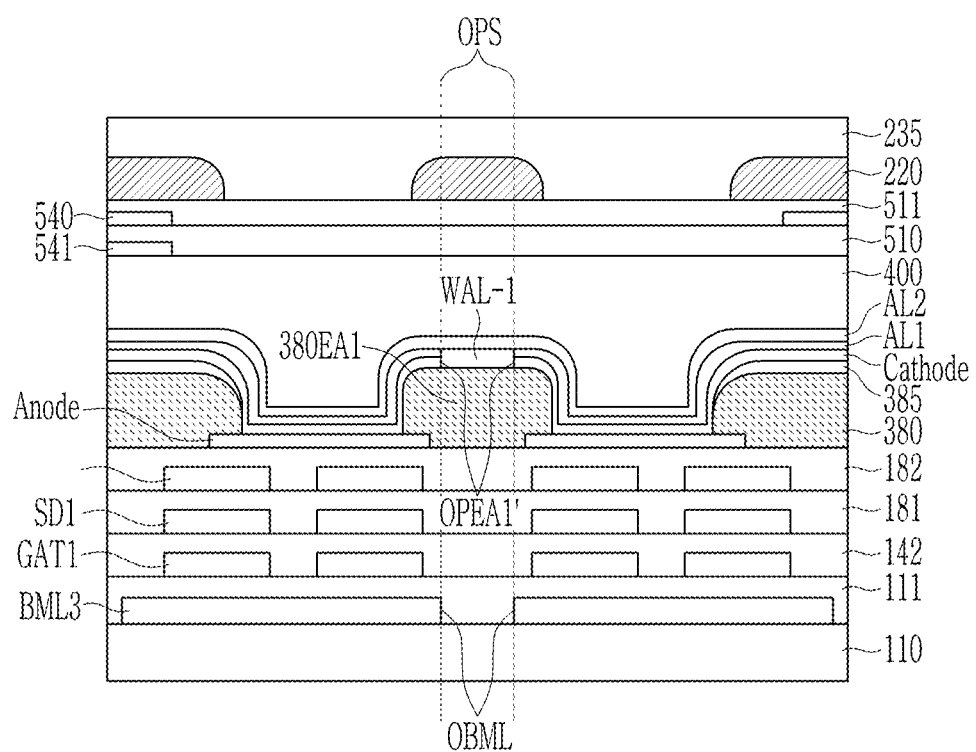
FIG. 36 is a schematic cross-sectional view briefly showing a photosensor area among a light emitting display device according to another embodiment.

FIG. 36 is a cross-sectional view schematically illustrating a photosensor area OPS among a light emitting display devices according to another embodiment.

Compared with FIG. 32, in the embodiment of FIG. 36, not only the cathode Cathode but also the capping layer AL1 has the opening OPEA1', and a low adhesive layer WAL-1 is positioned in the opening OPEA1'. Therefore, the low adhesive layer WAL-1 corresponding to the photosensor area OPS is positioned on the pixel definition layer 380 in the photosensor area OPS. The low adhesive layer WAL-1 is positioned on the cathode Cathode and the capping layer AL1 and positioned within the opening OPEA1' corresponding to the photosensor area OPS. On the low adhesive layer WAL-1, the low reflection layer AL2, the encapsulation layer 400, the sensing insulating layers 510 and 511, and the light blocking layer 220 are sequentially positioned.

In the above, it was focused on the embodiment in which the capping layer AL1 and the low reflection layer AL2 are positioned between the cathode Cathode and the encapsulation layer 400, and the reflection adjustment layer 235 is positioned on the light blocking layer 220.

Hereinafter, an embodiment including a color filter layer 230 instead of the reflection adjustment layer 235 without including the capping layer AL1 and the low reflection layer AL2 is described with reference to FIG. 37.

Figure 37:
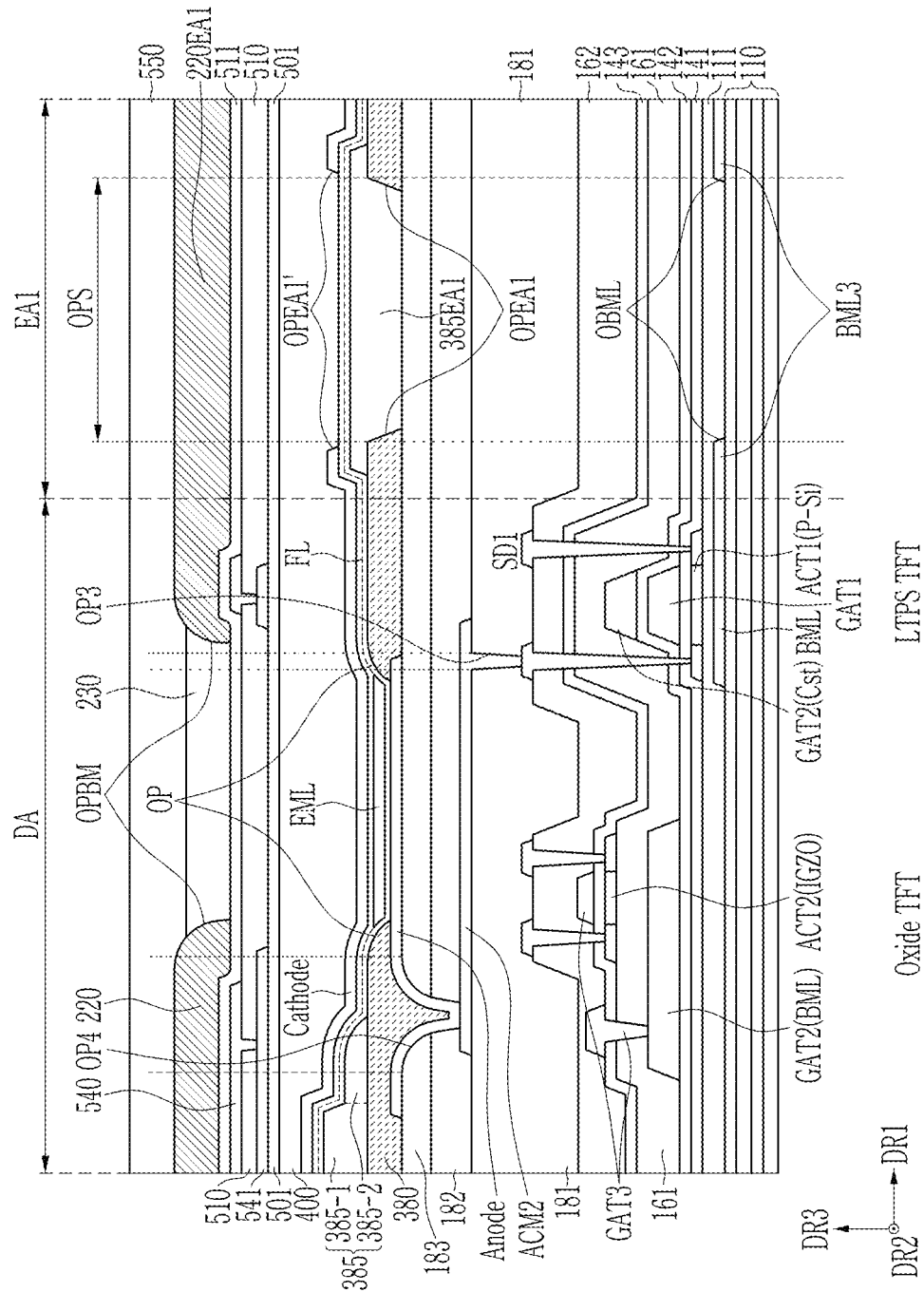
FIG. 37 is a more detailed schematic cross-sectional view of a light emitting display device according to another embodiment.

FIG. 37 is a more detailed schematic cross-sectional view of a light emitting display device according to another embodiment.

FIG. 37 is the schematic cross-sectional view corresponding to FIG. 20 and differences from FIG. 20 are described.

In the embodiment of FIG. 37, the difference in the display area DA is first described.

In the display area DA, the encapsulation layer 400 is positioned directly on the cathode Cathode. A color filter layer 230 is positioned on the third sensing insulating layer 511 and the light blocking layer 220. The color filter layer 230 includes a red color filter that transmits red light, a green color filter that transmits green light, and a blue color filter that transmits blue light. Each color filter layer 230 may be positioned so as to overlap the anode Anode of the light emitting diode LED in a plan view. The light emitted from the emission layer EML may be emitted while passing through the color filter and being changed into the corresponding color.

The light blocking layer 220 may be positioned between the color filter layers 230, respectively. According to an embodiment, the color filter layer 230 may be replaced with a color conversion layer, or may further include a color conversion layer. The color conversion layer may include quantum dots.

A planarization layer 550 covering the color filter layer 230 may be positioned on the color filter layer 230, and a window may be additionally attached thereto.

The structure of the photosensor area OPS may be as follows.

The opening OBML of the island-shaped metal layer BML3 is positioned on the substrate 110, the buffer layer 111, which is an inorganic insulating layer, is positioned in the opening OBML of the island-shaped metal layer BML3, and the first gate insulating layer 141 and the second gate insulating layer 142, which are inorganic insulating layers, are sequentially positioned thereon. On the second gate insulating layer 142, the first interlayer insulating layer 161, the third gate insulating layer 143, and the second interlayer insulating layer 162, which are the inorganic insulating layers, are sequentially stacked each other. On the second interlayer insulating layer 162, the first organic layer 181, the second organic layer 182, and the third organic layer 183, which are organic insulators, are sequentially stacked each other. The additional opening OPEA1 of the pixel definition layer 380 is positioned on the third organic layer 183, and the additional spacer 385EA1 is positioned on the third organic layer 183 and within the additional opening OPEA1 of the pixel definition layer 380. The additional opening OPEA1 of the pixel definition layer 380 and the additional spacer 385EA1 are formed corresponding to the photosensor area OPS, and the additional spacer 385EA1 may also be positioned on the upper surface of the pixel definition layer 380. The functional layer FL and the cathode Cathode positioned on the pixel definition layer 380 and the additional spacer 385EA1 have the opening OPEA1' formed corresponding to the photosensor area OPS, so that the functional layer FL and the cathode Cathode may not be formed in the photosensor area OPS. Therefore, the encapsulation layer 400 is positioned on the additional spacer 385EA1, and the additional spacer 385EA1 and the encapsulation layer 400 may contact each other. On the encapsulation layer 400, the sensing insulating layers 501, 510, and 511 and the light blocking layer 220 are sequentially positioned. The encapsulation layer 400 may have a triple layer structure including a first inorganic encapsulation layer, an organic encapsulation layer, and a second inorganic encapsulation layer. The sensing insulating layers 501, 510, and 511 may all be inorganic insulating layers. The light blocking layer 220 does not have an opening corresponding to the photosensor area OPS, and includes an overlapping portion 220EA1 overlapping the photosensor area OPS in a plan view. The light blocking layer 220 and the overlapping portion 220EA1 serve to block visible rays, but have a characteristic of transmitting a wavelength band corresponding to infrared rays by including only an organic material without including an inorganic material such as carbon. A planarization layer 550 is positioned on the overlapping portion 220EA1 of the light blocking layer 220 as a photosensor area OPS. According to an embodiment, the color filter 230 may be positioned on at least a portion of the overlapping portion 220EA1 of the light blocking layer 220.

In the above, as the variant embodiment of FIG. 20, the embodiment that does not include the capping layer AL1 and the low reflection layer AL2, and has the color filter layer 230 instead of the reflection adjustment layer 235, was described.

However, even for FIGS. 22, 25 to 30, 32, 34, and 36, a modified embodiment having the color filter layer 230 instead of the reflection adjustment layer 235 without including the capping layer AL1 and the low reflection layer AL2 may be formed.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An electronic device comprising:
a housing having a rear surface and a side surface;
a cover window disposed on the housing;
a display panel disposed under the cover window and including a display area and a photosensor area surrounded by the display area; and
an infrared sensor positioned on the rear surface of the photosensor area of the display panel, wherein
the display area includes:
a pixel definition layer having an opening overlapping an anode in a plan view;
a spacer positioned on the pixel definition layer;
a cathode covering the pixel definition layer and the spacer;
a capping layer positioned on the cathode;
a low reflection layer positioned on the capping layer;
an encapsulation layer positioned on the low reflection layer; and
a light blocking layer positioned on the encapsulation layer and having an opening overlapping the opening of the pixel definition layer in a plan view,
the photosensor area overlaps an overlapping portion of the light blocking layer and an overlapping portion of the pixel definition layer in a plan view, and
the cathode has an opening corresponding to the photosensor area and is not formed in the photosensor area.

2. The electronic device of claim 1, wherein the capping layer and the low reflection layer each have an opening corresponding to the photosensor area.

3. The electronic device of claim 2, wherein the encapsulation layer is positioned within the opening corresponding to the photosensor area of the cathode, the capping layer, and the low reflection layer.

4. The electronic device of claim 2, wherein the cathode has a structure that covers an upper surface and a side surface of the capping layer or the low reflection layer.

5. The electronic device of claim 1, wherein
the capping layer has an opening corresponding to the photosensor area, and
the low reflection layer is positioned within the opening corresponding to the photosensor area of the cathode and the capping layer.

6. The electronic device of claim 5, wherein the cathode has a structure that covers an upper surface and a side surface of the capping layer.

7. The electronic device of claim 1, further comprising:
a low adhesive layer positioned within the opening of the cathode.

8. The electronic device of claim 7, wherein the capping layer and the low reflection layer are positioned on the low adhesive layer.

9. The electronic device of claim 7, wherein
the low reflection layer is positioned on the low adhesive layer, and
the capping layer has an opening corresponding to the photosensor area.

10. The electronic device of claim 1, further comprising:
an island-shaped metal layer positioned under the anode and having an opening, and
the opening of the island-shaped metal layer overlaps the opening of the cathode in a plan view.

11. A light emitting display device comprising:
a display panel including a display area and a photosensor area surrounded by the display area; and
an infrared sensor positioned on a rear surface of the photosensor area, wherein
the display area includes:
a pixel definition layer having an opening overlapping an anode in a plan view;
a cathode covering the pixel definition layer;
an encapsulation layer positioned on the cathode; and
a light blocking layer positioned on the encapsulation layer and having an opening overlapping the opening of the pixel definition layer in a plan view,
the photosensor area overlaps an overlapping portion of the light blocking layer in a plan view,
the pixel definition layer has an additional opening corresponding to the photosensor area such that the pixel definition layer is not formed in the photosensor area, and
the photosensor area further includes an additional spacer positioned within the additional opening of the pixel definition layer.

12. The light emitting display device of claim 11, wherein the display area further includes an organic layer positioned under the anode,
the additional spacer contacts the organic layer, and
the additional spacer is positioned under the encapsulation layer.

13. The light emitting display device of claim 11, wherein the display area further includes:
a capping layer positioned between the cathode and the encapsulation layer and contacting the cathode; and
a low reflection layer positioned between the capping layer and the encapsulation layer.

14. The light emitting display device of claim 13, wherein the cathode, the capping layer, and the low reflection layer have an opening corresponding to the photosensor area such that the cathode, the capping layer, and the low reflection layer are not formed in the photosensor area.

15. The light emitting display device of claim 14, wherein the encapsulation layer is positioned within the opening of the cathode, the capping layer, and the low reflection layer.

16. The light emitting display device of claim 14, wherein the cathode has a structure that covers an upper surface and a side surface of the capping layer or the low reflection layer.

17. The light emitting display device of claim 16, further comprising:
an island-shaped metal layer positioned under the anode and having an opening, and
the opening of the island-shaped metal layer overlaps the opening of the cathode, the capping layer, and the low reflection layer in a plan view.

18. A light emitting display device comprising:
a display panel including a display area and a photosensor area surrounded by the display area; and
an infrared sensor positioned on a rear surface of the photosensor area, wherein
the display area includes:
a pixel definition layer having an opening overlapping an anode in a plan view;
a cathode covering the pixel definition layer;
a capping layer positioned on the cathode;
a low reflection layer positioned on the capping layer;
an encapsulation layer positioned on the low reflection layer; and
a light blocking layer positioned on the encapsulation layer and having an opening overlapping the opening of the pixel definition layer in a plan view, and
the photosensor area overlaps an overlapping portion of the light blocking layer, an overlapping portion of the low reflection layer, an overlapping portion of the capping layer, and an overlapping portion of the cathode in a plan view, and
a thickness of the overlapping portion of the cathode is less than a thickness of the cathode of the display area.

19. The light emitting display device of claim 18, wherein a thickness of the overlapping portion of the capping layer is greater than a thickness of the capping layer of the display area.

20. The light emitting display device of claim 19, wherein a difference between the thickness of the overlapping portion of the cathode and the thickness of the cathode of the display area is substantially equal to a difference between the thickness of the overlapping portion of the capping layer and the thickness of the capping layer of the display area.

* * * * *